(12) United States Patent
Sasaki et al.

(10) Patent No.: US 7,163,776 B2
(45) Date of Patent: Jan. 16, 2007

(54) POSITIVE-WORKING RESIST COMPOSITION

(75) Inventors: Tomoya Sasaki, Shizuoka (JP);
Kazuyoshi Mizutani, Shizuoka (JP);
Shinichi Kanna, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/417,209

(22) Filed: Apr. 17, 2003

(65) Prior Publication Data

US 2003/0219679 A1    Nov. 27, 2003

(30) Foreign Application Priority Data

Apr. 19, 2002   (JP) .......................... P.2002-117801

(51) Int. Cl.
*G03F 7/004*    (2006.01)
(52) U.S. Cl. ................... 430/270.1; 430/905; 430/921
(58) Field of Classification Search ............. 430/270.1, 430/905, 921
See application file for complete search history.

(56) References Cited

U.S. PATENT DOCUMENTS 6,638,683 B1 * 10/2003 Tan et al. ................ 430/270.1

FOREIGN PATENT DOCUMENTS

| EP | 1243968 A2 | * | 9/2002 |
| EP | 1273969 A2 | * | 1/2003 |
| JP | 2002322217 A | * | 11/2002 |
| JP | 2003295442 A | * | 10/2003 |
| WO | WO 00/17712 A1 | | 3/2000 |

OTHER PUBLICATIONS

English language abstract of JP 2002-322217.*
R.R. Kunz et al., "Outlook for 157-nm resist design", Part of the SPIE Conference on Advances In Resist Technology and Processing XVI, vol. 3678, pp. 13-23 (1999).
Dirk Schmaljobann et al., "Design Strategies for 157 nm Signle-Layer Photoresists: Lithographic Evaluation of a Poly(α-trifluoromethyl vinyl alcohol) Copolymer" In Advances in Resist Technology and Processing XVII, Proceedings of SPIE vol. 3999, pp. 330-333 (2000).
Theodore H. Fedynyshyn et al., "Prospects for Using Existing Resists for Evaluating 157-nm Imaging Systems", In Advances in Resist Technology and Processing XVII, Proceedings of SPIE vol. 3999, p. 335 (2000).
Michael K. Crawford et al., "New Materials for 157 nm Photoresists: Characterization and Properties", In Advances in Resist Technology and Processing XVII, Proceedings of SPIE vol. 3999, pp. 357-364 (2000).
Kyle Patterson et al., "Polymers for 157 nm Photoresist Applications: A Progress Report", In Advances in Resist Technology and Processing XVII, Proceedings of SPIE vol. 3999, pp. 365-373 (2000).

* cited by examiner

*Primary Examiner*—Amanda Walke
(74) *Attorney, Agent, or Firm*—Sughrue Mion, PLLC

(57) ABSTRACT

A positive-working resist composition comprising (A1) a resin containing a repeating unit represented by the specific general formula, wherein the resin increases the solubility in an alkali developing solution by the action of an acid.

13 Claims, No Drawings

POSITIVE-WORKING RESIST COMPOSITION

FIELD OF THE INVENTION

The present invention relates to a resist composition suitable for use in microlithographic process for the production of ultrahigh LSI, large capacity microchip, etc. and other photofabrication processes. More particularly, the invention relates to a positive-working resist composition which exhibits an excellent sensitivity and contrast.

BACKGROUND OF THE INVENTION

The trend in the art of integrated circuit is for more products to be integrated higher. In the production of semiconductor substrates having ultrahigh LSI, it has been necessary to form an ultrafine pattern having a line width of not greater than quarter micron. As one of methods for enhancing the fineness of pattern there has been known a method involving the shifting of the wavelength of the exposing light source for use in the formation of resist pattern.

For the production of semiconductor elements having an integration degree of up to 64 megabits, i-ray (365 nm) from high voltage mercury vapor lamp has been heretofore used as a light source. As positive-working resist compositions adapted for this light source there have been developed many compositions comprising a novolac resin and a naphthoquinonediazide compound as a photosensitive material. With these compositions, satisfactory results have been attained for the formation of a line width of not smaller than about 0.3 μm. For the production of semiconductor elements having an integration degree of not smaller than 256 megabits, KrF excimer laser (248 nm) has been used as an exposing light source instead of i-ray.

Moreover, for the purpose of producing semiconductors having an integration degree of not smaller than 1 gigabits, the use of ArF excimer laser beam (193 nm), which is a short wavelength light source, has been studied. For the purpose of forming a pattern having a line width of not greater than 0.1 μm, the use of $F_2$ excimer laser beam (157 nm) has been studied.

To cope with this trend for shorter wavelength of light source, the constituents of resist materials and their chemical structures have been drastically changed.

As a resist composition for exposure to KrF excimer laser beam there has been developed a composition comprising as a main component an acid decomposable group-protected resin having a poly (hydroxystyrene) having a small absorption at 248 nm as a basic skeleton in combination with a compound (photo-acid generator) which generates an acid when irradiated with far ultraviolet rays, i.e., so-called chemically-sensitized resist.

Further, as a resist composition for exposure to ArF excimer laser beam (193 nm) there has been developed a chemically-sensitized resist comprising an acid-decomposable resin having an alicyclic structure having no absorption at 193 nm incorporated in the polymer main chain or side chain.

Referring to $F_2$ excimer laser beam (157 nm), it was found that even the aforementioned alicyclic resin exhibits a great absorption at 157 nm and thus leaves something to be desired in the provision of the desired pattern having a line width of not greater than 0.1 μm. On the other hand, it has been reported in Proc. SPIE. Vol. 3678, page 13, 1999, that a resin having fluorine atoms incorporated therein (perfluoro structure) has a sufficient transparency at 157 nm. Effective fluorine-containing resin structures are proposed in Proc. SPIE. Vol. 3999, page 330, 2000, page 357 (2000), and page (2000), WO-00/17712,etc. Studies have been made of resist compositions comprising fluorine-containing resin.

However, the resist composition comprising fluorine-containing resin for exposure to $F_2$ excimer laser beam is disadvantageous in sensitivity and contrast. It has thus been desired to solve these problems.

SUMMARY OF THE INVENTION

Accordingly, an object of the invention is to provide a positive-working resist composition suitable for use of an exposure light source of 160 nm or less, especially $F_2$ excimer laser beams (157 nm). Specifically, an object of the invention is to provide a positive-working resist composition showing sufficient transparency during the use of a light source of 157 nm, having excellent sensitivity and contrast.

The present inventors paid to these various properties and made extensive and intensive investigations. As a result, it has been found that the object of the invention can be successfully achieved by the use of a composition as specified below, leading to accomplishment of the invention.

Specifically, the invention is configured as follows.

(1) A positive-working resist composition comprising (A1) a resin containing a repeating unit represented by the following general formula (I), wherein the resin increases the solubility in an alkali developing solution by the action of an acid:

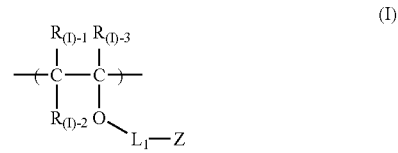

wherein $R_{(I)-1}$ to $R_{(I)-3}$ each independently represents a hydrogen atom, a fluorine atom, a chlorine atom, a bromine atom, a cyano group or an alkyl group which may be substituted; $L_1$ represents a divalent connecting group; and Z represents an acid-decomposable group.

(2) The positive-working resist composition according to the above (1), wherein the acid-decomposable group Z is selected from the group consisting of —OC($R_{11a}$)($R_{12a}$)($R_{13a}$), —OC($R_{14a}$)($R_{15a}$)(O$R_{16a}$), —O—CO—O($R_{11a}$)($R_{12a}$)($R_{13a}$), —CO—OC($R_{11a}$)($R_{12a}$)($R_{13a}$) and —CO—OC($R_{14a}$)($R_{15a}$)(O$R_{16a}$), wherein $R_{11a}$ to $R_{13a}$ each independently represents an alkyl group which may be substituted, a cycloalkyl group which may be substituted, an alkenyl group which may be substituted, an aralkyl group which may be substituted or an aryl group which may be substituted; $R_{14a}$ and $R_{15a}$ each independently represents a hydrogen atom or an alkyl group which may be substituted; $R_{16a}$ represents an alkyl group which may be substituted, a cycloalkyl group which may be substituted, an alkenyl group which may be substituted, an aralkyl group which may be substituted or an aryl group which may be substituted; and two of $R_{11a}$, $R_{12a}$ and $R_{13a}$ or two of $R_{14a}$, $R_{15a}$ and $R_{16a}$ may be bonded to each other to form a ring.

(3) The positive-working resist composition according to the above (1), further comprising at least one of repeating units represented by the following general formulae (IIa) and (IIb):

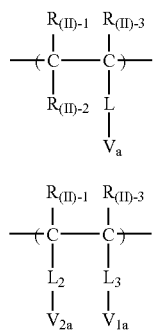

wherein $R_{(II)-1}$ to $R_{(II)-3}$ each independently represents a hydrogen atom, a fluorine atom, a chlorine atom, a bromine atom, a cyano group or an alkyl group which may be substituted; L, $L_2$ and $L_3$ each independently represents a single bond or divalent connecting group; and $V_a$, $V_{1a}$ and $V_{2a}$ each independently represents an acid-decomposable group or acid-nondecomposable organic group.

(4) The positive-working resist composition according to the above (3), wherein $V_a$ in the general formula (IIa) or at least one of $V_{1a}$ and $V_{2a}$ in the general formula (IIb) is an acid-decomposable group.

(5) The positive-working resist composition according to the above (4), wherein the acid-decomposable group is selected from the group consisting of —OC($R_{11a}$)($R_{12a}$)($R_{13a}$), —OC($R_{14a}$)($R_{15a}$)(OR$_{16a}$), —O—CO—O($R_{11a}$)($R_{12a}$)($R_{13a}$), —CO—OC($R_{11a}$)($R_{12a}$)($R_{13a}$) and —CO—OC($R_{14a}$)($R_{15a}$)(OR$_{16a}$) wherein $R_{11a}$ to $R_{13a}$ each independently represents an alkyl group which may be substituted, a cycloalkyl group which may be substituted, an alkenyl group which may be substituted, an aralkyl group which may be substituted or an aryl group which may be substituted; $R_{14a}$ and $R_{15a}$ each independently represents a hydrogen atom or an alkyl group which may be substituted; $R_{16a}$ represents an alkyl group which may be substituted, a cycloalkyl group which may be substituted, an alkenyl group which may be substituted, an aralkyl group which may be substituted or an aryl group which may be substituted; and two of $R_{11a}$, $R_{12a}$ and $R_{13a}$ or two of $R_{14a}$, $R_{15a}$ and $R_{16a}$ may be bonded to each other to form a ring.

(6) The positive-working resist composition according to the above (3), wherein the repeating units represented by the general formulae (IIa) and (IIb) are represented by the following general formulae (IIa1) and (IIb1), respectively:

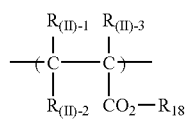

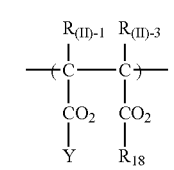

wherein $R_{(II)-1}$ to $R_{(II)-3}$ each independently represents a hydrogen atom, a fluorine atom, a chlorine atom, a bromine atom, a cyano group or an alkyl group which may be substituted; $R_{18}$ represents —OC($R_{11a}$)($R_{12a}$)($R_{13a}$) or —OC($R_{14a}$)($R_{15a}$)(OR$_{16a}$) wherein $R_{11a}$ to $R_{13a}$ each independently represents an alkyl group which may be substituted, a cycloalkyl group which may be substituted, an alkenyl group which may be substituted, an aralkyl group which may be substituted or an aryl group which may be substituted; $R_{14a}$ and $R_{15a}$ each independently represents a hydrogen atom or an alkyl group which may be substituted; $R_{16a}$ represents an alkyl group which may be substituted, a cycloalkyl group which may be substituted, an alkenyl group which may be substituted, an aralkyl group which may be substituted or an aryl group which may be substituted; and two of $R_{11a}$, $R_{12a}$ and $R_{13a}$ or two of $R_{14a}$, $R_{15a}$ and $R_{16a}$ may be bonded to each other to form a ring, and Y represents a hydrogen atom, an alkyl group which may be substituted or $R_{18}$.

(7) The positive-working resist composition according to the above (3) or (6), wherein at least one of $R_{(I)-1}$ to $R_{(I)-3}$ in the repeating unit represented by the general formula (IIa) or (IIa1) and at least one of $R_{(I)-1}$ and $R_{(I)-3}$ in the repeating unit represented by the general formula (IIb) or (IIb1) contain a fluorine atom.

(8) The positive-working resist composition according to the above (1), further comprising a repeating unit represented by the following general formula (III):

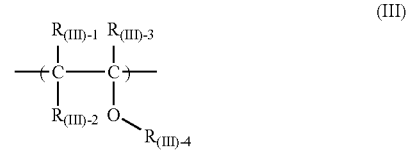

wherein $R_{(III)-1}$ to $R_{(III)-3}$ each independently represents a hydrogen atom, a fluorine atom, a chlorine atom, a bromine atom, a cyano group or an alkyl group which may be substituted, with the proviso that at least two of $R_{(III)-1}$ to $R_{(III)-3}$ are a fluorine atom; and $R_{(III)-4}$ represents an alkyl group which may be substituted.

(9) The positive-working resist composition according to the above (1), further comprising a repeating unit represented by the following general formula (IV):

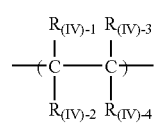

wherein $R_{(IV)-1}$ to $R_{(IV)-4}$ each independently represents a hydrogen atom, a fluorine atom, a chlorine atom, a bromine atom or an alkyl group which may be substituted, with the proviso that at least two of $R_{(IV)-1}$ to $R_{(IV)-4}$ are a fluorine atom.

(10) A positive-working resist composition comprising:
(A1) a resin containing a repeating unit represented by the following general formula (I), wherein the resin increases the solubility in an alkali developing solution by the action of an acid, (B) a compound capable of generating an acid by the action with one of an actinic ray and a radiation:

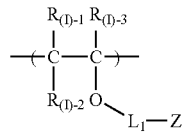
(I)

wherein $R_{(I)-1}$ to $R_{(I)-3}$ each independently represents a hydrogen atom, a fluorine atom, a chlorine atom, a bromine atom, a cyano group or an alkyl group which may be substituted; $L_1$ represents a divalent connecting group; and Z represents an acid-decomposable group.

(11) The positive-working resist composition according to the above (10), further comprising (A2) a resin increasing the solubility in an alkali developing solution by the action of an acid other than the resin (A1).

(12) The positive-working resist composition aaccording to the above (11), wherein the resin (A2) contains at least one repeating unit selected from the group consisting of those represented by the following general formulae (I') to (VI'):

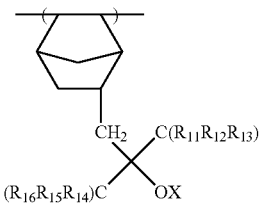
(I')

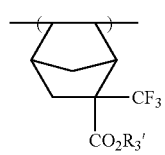
(II')

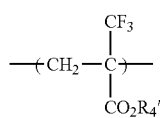
(III')

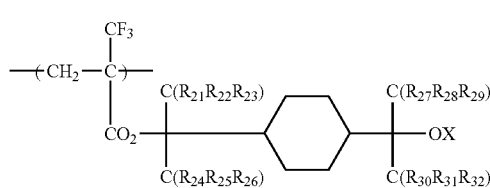
(IV')

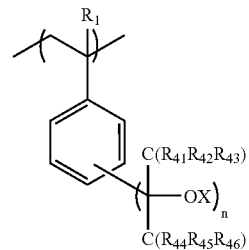
(V')

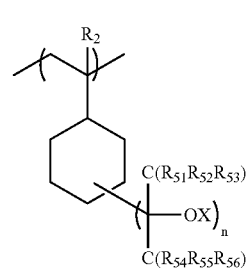
(VI')

wherein $R_1$ and $R_2$ each independently represents a hydrogen atom, a fluorine atom, a chlorine atom, a bromine atom, a cyano group or a trifluoromethyl group; X represents a group capable of decomposing by the action of an acid; $R_3'$ and $R_4'$ each represents a group capable of decomposing by the action of an acid; $R_{11}$ to $R_{16}$, $R_{21}$ to $R_{32}$, $R_{41}$ to $R_{46}$ and $R_{51}$ to $R_{55}$ each represents a hydrogen atom, a fluorine atom or an alkyl group which may be substituted, with the proviso that at least one of $R_{11}$ to $R_{16}$, at least one of $R_{21}$ to $R_{32}$, at least one of $R_{41}$ to $R_{46}$ or at least one $R_{51}$ to $R_{56}$ is a fluorine atom; and n represents an integer of from 1 to 5.

(13) The positive-working resist composition according to the above (11), wherein the resin (A2) contains at least one repeating unit selected from the group consisting of those represented by the following general formulae (I'') to (VI''):

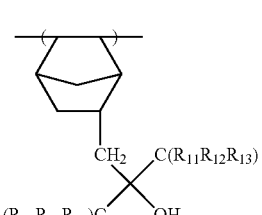
(I'')

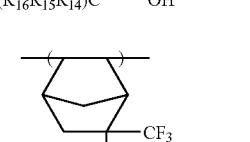
(II'')

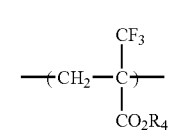
(III'')

-continued

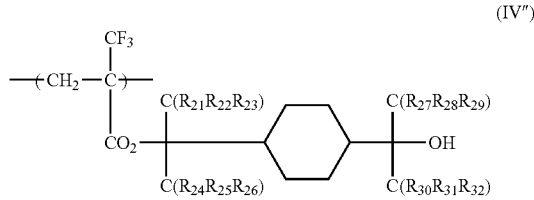
(IV″)

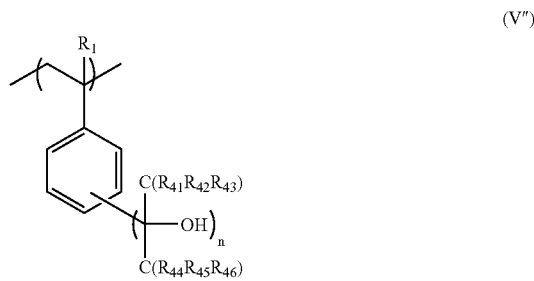
(V″)

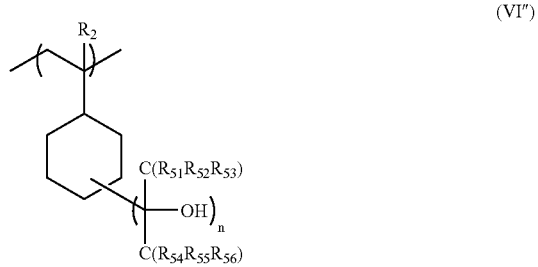
(VI″)

wherein $R_1$ and $R_2$ each independently represents a hydrogen atom, a fluorine atom, a chlorine atom, a bromine atom, a cyano group or a trifluoromethyl group; $R_3$ and $R_4$ each independently represents a hydrogen atom, an alkyl group which may be substituted, an aryl group which may be substituted or an aralkyl group which may be substituted in which the alkyl group and the aralkyl group each may have —O—, —S—, —CO$_2$—, —CO—, —SO$_2$— or —SO— in the middle portion thereof; $R_{11}$ to $R_{16}$, $R_{21}$ to $R_{32}$, $R_{41}$ to $R_{46}$ and $R_{51}$ to $R_{56}$ each represents a hydrogen atom, a fluorine atom or an alkyl group which may be substituted, with the proviso that at least one of $R_{11}$ to $R_{16}$, at least one of $R_{21}$ to $R_{32}$, at least one of $R_{41}$ to $R_{46}$ or at least one $R_{51}$ to $R_{56}$ is a fluorine atom; and n represents an integer of from 1 to 5.

(14) The positive-working resist composition according to the above (10), wherein the component (B) is (B1) a compound capable of generating an aliphatic or aromatic sulfonic acid by the action with one of an actinic ray and a radiation, in which the aliphatic or aromatic sulfonic acid contains at least one fluorine atom.

(15) The positive-working resist composition according to the above (14), further comprising (B2) a compound capable of generating a fluorine atom-free aliphatic or aromatic sulfonic acid, or an aliphatic or aromatic carboxylic acid upon irradiation with one of an actinic ray and a radiation.

DETAILED DESCRIPTION OF THE INVENTION

The invention will be further described hereinafter.

[1] Resin of the Invention

The resin (the acid-decomposable resin)(A1) contained in the composition of the invention is characterized by the incorporation of at least the repeating unit represented by the general formula (I).

In the general formula (I), $R_{(I)-1}$ to $R_{(I)-3}$ each independently represents a hydrogen atom, a fluorine atom, a chlorine atom, a bromine atom, a cyano group or an alkyl group which may be substituted. The alkyl group may have substituents and is a straight-chain, branched or cyclic alkyl group having preferably 1 to 20 carbon atoms, more preferably 1 to 15 carbon atoms. Specific examples of the alkyl group include methyl group, ethyl group, propyl group, i-propyl group, butyl group, i-butyl group, t-butyl group, amyl group, i-amyl group, t-amyl group, hexyl group, cyclohexyl group, octyl group, and 2-ethylhexyl group.

Examples of the substituents which may substitute on the alkyl group include halogen atom, hydroxyl group, alkoxy group, and cyano group. Examples of the halogen atom include fluorine atom, chlorine atom, and bromine atom. Examples of the alkoxy group include a straight-chain, branched or cyclic alkoxy group having preferably 1 to 10 carbon atoms (hereinafter referred to as $C_1$–$C_{10}$), more preferably 1 to 6 carbon atoms. Specific examples of the alkoxy group include methoxy group, ethoxy group, propoxy group, i-propoxy group, butoxy group, i-butoxy group, and t-butoxy group.

$L_1$ represents a divalent connecting group. In the invention, $L_1$ contains no single bond. The connecting group of $L_1$ may have substituents.

The divalent connecting group preferably represents a divalent alkylene, cycloalkylene, alkenylene or arylene group, —O—CO—$R_{22a}$—, —CO—O—$R_{22b}$— or —CO—N($R_{22c}$)—$R_{22d}$—. $R_{22a}$, $R_{22b}$ and $R_{22d}$ may be the same or different and each represent a single bond or a divalent alkylene, cycloalkylene, alkenylene or arylene group. $R_{22c}$ represents a hydrogen atom or an alkyl, cycloalkyl or aralkyl group, which may be substituted.

Preferred examples of the alkylene group include $C_1$–$C_8$, preferably $C_1$–$C_4$ straight-chain, branched or cyclic alkylene groups such as methylene group, ethylene group, propylene group, butylene group, hexylene group and octylene group.

Preferred examples of the cycloalkylene group include $C_3$–$C_{10}$, preferably $C_5$–$C_8$ cycloalkylene group such as cyclopentylene group and cyclohexylene group.

Preferred examples of the alkenylene group include $C_2$–$C_8$, preferably $C_2$–$C_6$ alkenylene group such as ethenylene group, propenylene group and butenylene group.

Preferred examples of the arylene group include $C_6$–$C_{20}$, preferably $C_6$–$C_{15}$ arylene group such as phenylene group, tolylene group and naphthylene group.

The alkyl group may have substituents and is preferably a $C_1$–$C_{15}$, more preferably $C_1$–$C_{10}$ straight-chain, branched or cyclic alkyl group. Specific examples of the alkyl group include methyl group, ethyl group, propyl group, i-propyl group, butyl group, i-butyl group, t-butyl group, amyl group, i-amyl group, t-amyl group, and hexyl group.

The cycloalkyl group may have substituents and is preferably a $C_3$–$C_{10}$, more preferably $C_3$–$C_7$ cycloalkyl group. Specific examples of the cycloalkyl group include cyclohexyl group, octyl group, and 2-ethylhexyl group.

Examples of the aralkyl group include $C_7$–$C_{12}$ aralkyl groups. Specific preferred examples of the aralkyl group include benzyl group, phenethyl group, and naphthylmethyl group.

The aryl group may have substituents and is normally a $C_6$–$C_{15}$ aryl group. Specific examples of the aryl group include phenyl group, tolyl group, dimethylphenyl group, 2,4,6-trimethylphenyl group, naphthyl group, anthryl group, and 9,10-dimethoxyanthryl group.

These alkylene, cycloalkylene, alkenylene, arylene, alkyl, cycloalkyl, aralkyl and aryl groups may have substituents. Examples of the substituents which may substitute these groups include ether group, ester group, amide group, urethane group, ureido group, halogen atom, and fluorinated alkyl group. Examples of the substituents, if any, include fluorine atom, and fluorinated alkyl group.

Z represents an acid-decomposable group which is not limited so far as it is a group which decomposes by an acid. Preferred examples of the acid-decomposable group include —$OC(R_{11a})(R_{12a})(R_{13a})$, —$OC(R_{14a})(R_{15a})(OR_{16a})$, —O—CO—O$(R_{11a})(R_{12a})(R_{13a})$, —CO—OC$(R_{11a})(R_{12a})(R_{13a})$, and —CO—OC$(R_{14a})(R_{15a})(OR_{16a})$.

$R_{11a}$ to $R_{13a}$ each independently represents an alkyl, cycloalkyl, alkenyl or aralkyl group, which may be substituted.

$R_{14a}$ and $R_{15a}$ each independently represents a hydrogen atom or an alkyl group which may be substituted.

$R_{16a}$ represents an alkyl, cycloalkyl, alkenyl, aralkyl or aryl group, which may be substituted.

Two of $R_{11a}$, $R_{12a}$ and $R_{13a}$ or two of $R_{14a}$, $R_{15a}$ and $R_{16a}$ may be bonded to each other to form a ring.

The alkyl group, cycloalkyl group, aralkyl group and aryl group represented by Z may have substituents the details of which have been described with reference to $L_1$.

The alkenyl group may be substituted and is normally a $C_2$–$C_6$, preferably $C_2$–$C_4$ straight-chain, branched or cyclic alkenyl group such as ethenyl group and 2-methylethenyl group.

Examples of the substituents which may substitute on the alkenyl group include halogen atom, hydroxyl group, alkoxy group, and cyano group. Examples of the halogen atom include fluorine atom, chlorine atom, and bromine atom. Examples of the alkoxy group include normally $C_1$–$C_{10}$, preferably $C_1$–$C_6$ straight-chain, branched or cyclic alkoxy groups. Specific examples of the alkoxy group include methoxy group, ethoxy group, propoxy group, i-propoxy group, butoxy group, i-butoxy group, and t-butoxy group.

In the invention, $L_1$ or Z preferably contains fluorine atoms.

The acid-decomposable resin to be used in the invention is preferably a resin containing at least one of the repeating units represented by the general formulae (IIa) and (IIb) in addition to the repeating unit represented by the general formula (I).

In the general formulae (IIa) and (IIb), $R_{(II)-1}$ to $R_{(II)-3}$ have the same meaning as $R_{(I)-1}$ to $R_{(I)-3}$ in the general formula (I).

L, $L_2$ and $L_3$ each independently represents a single bond or divalent connecting group. The divalent connecting group is the same as $L_1$ in the general formula (I).

$V_a$, $V_{1a}$ and $V_{2a}$ each represents an acid-decomposable group or an acid-nondecomposable organic group. The acid-decomposable group is the same as the preferred acid-decomposable group of Z in the general formula (I).

Preferred examples of the acid-nondecomposable organic group include —R, —OR, —COOR, —CO—NH—R, and —CO—NRR' (in which R and R' each represent a substituted or unsubstituted alkyl group). Examples of the alkyl group include straight-chain, branched or cyclic alkyl groups as exemplified above. These alkyl groups may be substituted.

In the invention, $V_a$ in the general formula (IIa) or at least one of $V_{1a}$ and $V_{2a}$ in the general formula (IIb) is preferably an acid-decomposable group.

The repeating units represented by the general formulae (IIa) and (IIb) are preferably repeating units represented by the following general formulae (IIa1) and (IIb1), respectively.

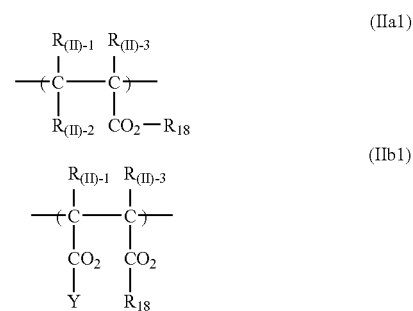

In the general formulae (IIa1) and (IIb1), $R_{(II)-1}$ to $R_{(II)-3}$ are as defined above.

$R_{18}$ is a group represented by —$OC(R_{11a})(R_{12a})(R_{13a})$ or —$OC(R_{14a})(R_{15a})(OR_{16a})$ (in which $R_{11a}$ to $R_{16a}$ are as defined above).

Y represents a hydrogen atom, an alkyl group which may be substituted, or $R_{18}$. Examples of the alkyl group include the straight-chain, branched or cyclic alkyl groups as exemplified above. This alkyl group may be substituted.

In the invention, at least one of $R_{(I)-1}$ to $R_{(I)-3}$ in the repeating unit represented by the general formula (IIa) or (IIa1) and at least one of $R_{(I)-1}$ and $R_{(I)-3}$ in the repeating unit represented by the general formula (IIb) or (IIb1) contain a fluorine atom.

The acid-decomposable resin to be used in the invention preferably contains a repeating unit represented by the following general formula (III).

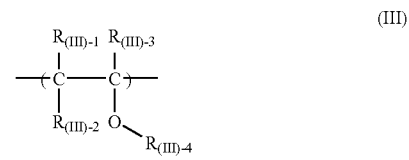

In the general formula (III), $R_{(III)-1}$ to $R_{(III)-3}$ have the same meaning as $R_{(I)-1}$ to $R_{(I)-3}$ in the general formula (I), with the proviso that at least two of $R_{(II)-1}$ to $R_{(II)-3}$ are a fluorine atom.

$R_{(II)-4}$ represents an alkyl group which may be substituted. Examples of the alkyl group include the straight-chain, branched or cyclic alkyl groups as exemplified above. This alkyl group, too, may have substituents.

The acid-decomposable resin to be used in the invention preferably contains a repeating unit represented by the following general formula (IV).

(IV)

In the general formula (IV), $R_{(IV)\text{-}1}$ to $R_{(IV)\text{-}4}$ have the same meaning as $R_{(I)\text{-}1}$ to $R_{(I)\text{-}4}$ in the general formula (I), with the proviso that at least two of $R_{(IV)\text{-}1}$ to $R_{(IV)\text{-}4}$ are a fluorine atom.

In the acid-decomposable resin (A1) to be used in the invention, the content of the repeating unit represented by the general formula (I) is normally from 2 to 90 mol %, preferably from 3 to 80 mol %, more preferably from 5 to 75 mol %.

The content of the repeating unit represented by the general formula (IIa) is normally from 1 to 90 mol %, preferably from 3 to 80 mol %, more preferably from 5 to 75 mol %.

The content of the repeating unit represented by the general formula (IIb) is normally from 1 to 90 mol %, preferably from 3 to 80 mol %, more preferably from 5 to 75 mol %.

The content of the repeating unit represented by the general formula (III) is normally from 1 to 80 mol %, preferably from 2 to 70 mol %, more preferably from 3 to 60 mol %.

The content of the repeating unit represented by the general formula (IV) is normally from 1 to 80 mol %, preferably from 2 to 70 mol %, more preferably from 3 to 60 mol %.

The resin (A1) of the invention may be copolymerized with other polymerizable monomers besides the aforementioned repeating structure units for the purpose of improving the photosensitivity.

Examples of the copolymerizable monomers employable herein include compounds having one addition-polymerizable unsaturated bond per molecule selected from the group consisting of acrylic acid esters, acrylamides, methacrylic acid esters, methacrylamides, allyl compounds, vinyl ethers, vinylesters, styrenes and crotonic acid esters other than the aforementioned compounds.

Specific examples of the repeating unit represented by the aforementioned general formula (I) employable herein include the following compounds, but the invention is not limited thereto.

(I-1)
(I-2)
(I-3)
(I-4)
(I-5)
(I-6)
(I-7)
(I-8)

Specific examples of the repeating units represented by the aforementioned general formulae (IIa) and (IIb) employable herein include the following compounds, but the invention is not limited thereto.

(B-1)
(B-2)

-continued
(B-3)
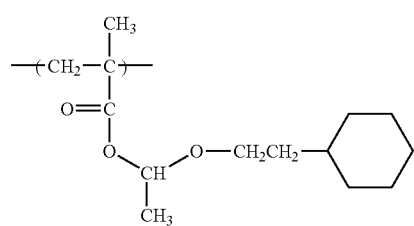
(B-4)
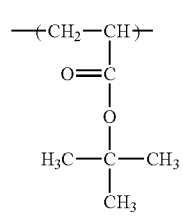
(B-5)
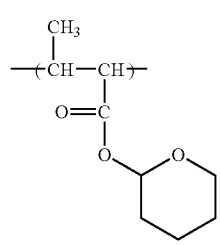
(B-6)
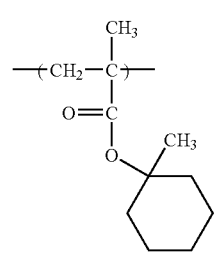
(B-7)
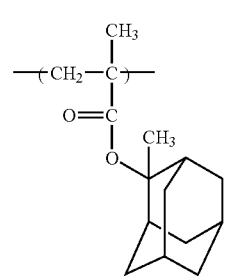
(B-8)
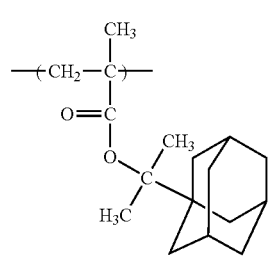
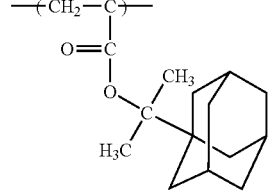
-continued
(B-9)
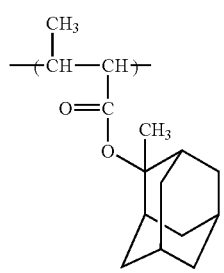
(B-10)
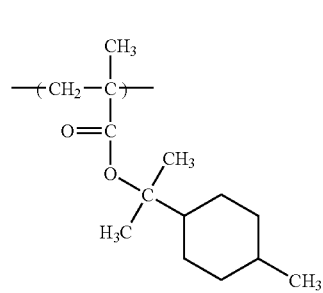
(B-11)
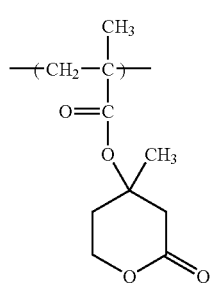
(B-13)
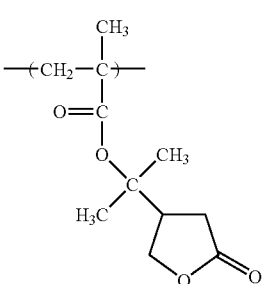
(B-14)
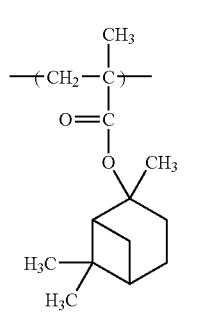

-continued
(B-15)
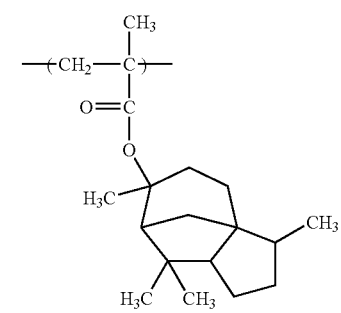
(B-1′)
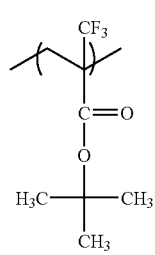
(B-8′)
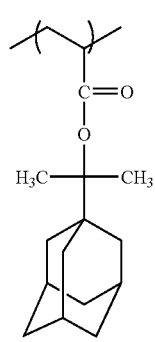
(B-8″)
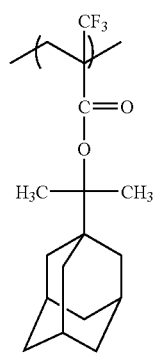
(B-12′)
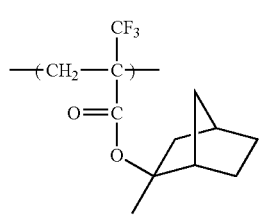
-continued
(B-12″)
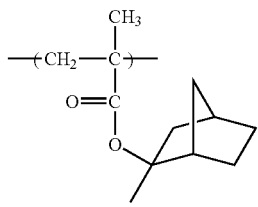
(B-7′)
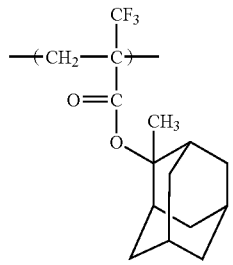
(F-54B)
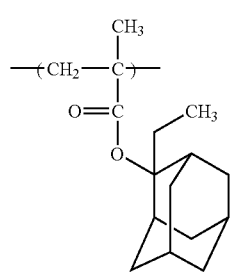
(II-1)
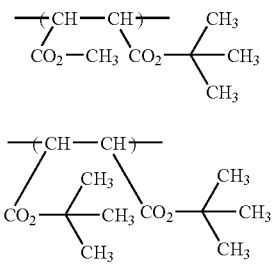
(II-2)
(II-3)
(II-4)
(II-5)
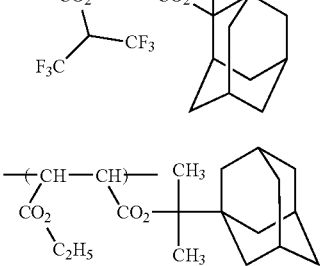

-continued (II-6)
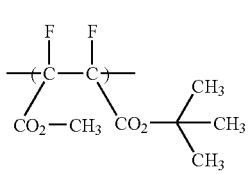

Specific examples of the repeating unit represented by the aforementioned general formula (II) employable herein include the following compounds, but the invention is not limited thereto.

(F-7)

(F-8)

(F-9)

(F-10)

(F-11)

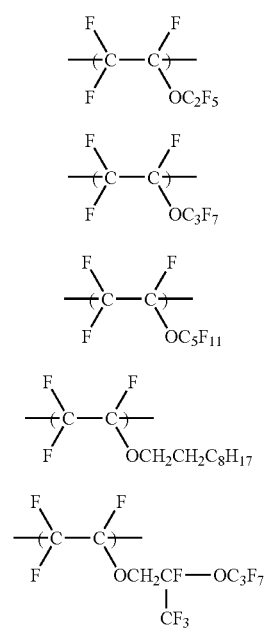

Specific examples of the repeating unit represented by the aforementioned general formula (IV) employable herein include the following compounds, but the invention is not limited thereto.

 (IV-1)

 (IV-2)

 (IV-3)

 (IV-4)

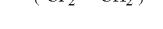 (IV-5)

 (IV-6)

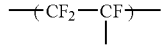 (IV-7)

Specific examples of the acid-decomposable resin (A1) of the invention will be given below, but the invention is not limited thereto.

(A1-1)

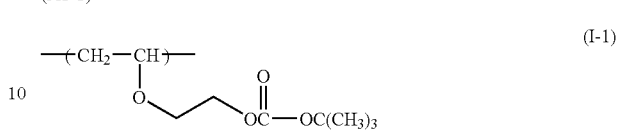

(A1-2)

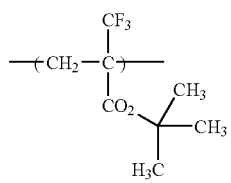

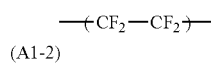

(A1-3)

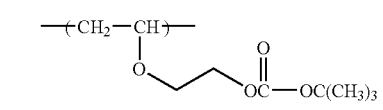

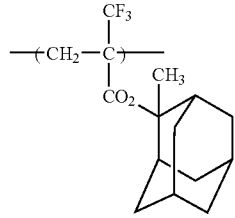

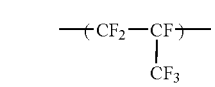

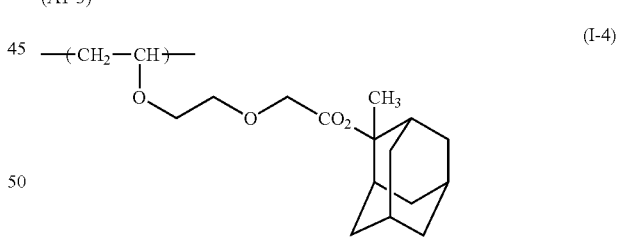

-continued

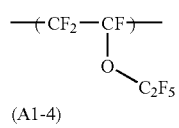
(F-7)

(A1-4)

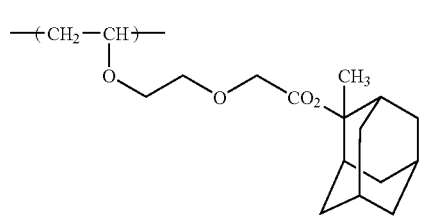
(I-4)

(B-12')

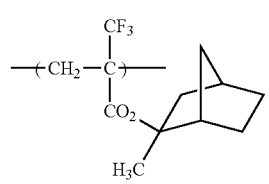
(A1-5)

(IV-2)

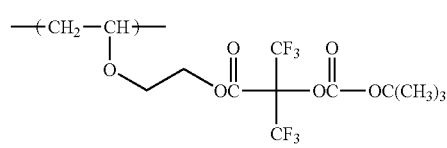
(I-5)

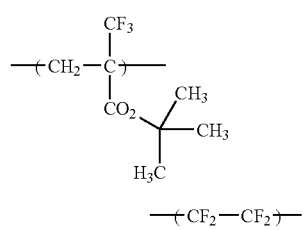
(A1-6)

(IV-1)

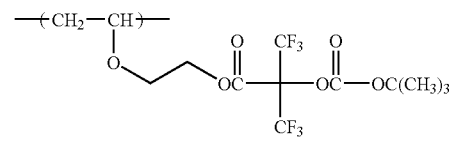
(I-5)

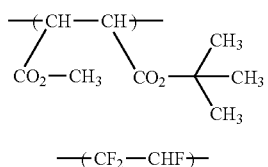
(II-1)

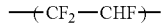
(IV-2)

The molecular weight of the resin (A1) of the invention having the aforementioned repeating units is preferably from 1,000 to 200,000, more preferably from 3,000 to 200,000 as calculated in terms of weight-average molecular weight. The distribution of molecular weight (degree of distribution) is from 1 to 10, preferably from 1 to 3, more preferably from 1 to 2. The smaller the distribution of molecular weight is, the better are coating property, sensitivity and contrast. In the invention, the proportion of the resin having a molecular weight of not greater than 1,000 is preferably not greater than 20%, more preferably not greater than 15%, even more preferably not greater than 10%. The proportion of residual non-reacted monomers in the resin (A1) is preferably not greater than 10%, more preferably not greater than 7%, even more preferably not greater than 5%.

The acid-decomposable resin (A1) of the invention can be synthesized according to any ordinary method (e.g., radical polymerization). As such an ordinary synthesis method there may be employed a method which comprises charging monomer seeds into a reaction vessel at a time or in the course of the reaction, optionally dissolving the monomer seeds in a solvent capable of dissolving various monomers such as ether (e.g., tetrahydrofurane, 1,4-dioxane, diisopropylether), ketone (e.g., methyl ethyl ketone, methyl isobutyl ketone), ester (e.g., ethyl acetate) and propylene glycol monomethyl ether acetate as described later to make a uniform solution, and then heating the reaction mixture in an inert gas atmosphere such as nitrogen and argon in the presence of a commercially available radical polymerization initiator (e.g., azo-based initiator, peroxide) to initiate polymerization. The initiator is optionally further added at a time or batchwise. After the termination of the reaction, the reaction product is then put into a solvent. The desired product is then recovered in the form of powder or solid matter. The reaction concentration is not smaller than 20% by weight, preferably not smaller than 30% by weight, more preferably not smaller than 20% by weight. The reaction temperature is from 10° C. to 150° C., preferably from 30° C. to 120° C., more preferably from 50° C. to 100° C. Alternatively, the acid-decomposable resin (A1) of the invention can be more fairly synthesized by an anionic polymerization method depending on the monomers used. For the details of polymerization method, reference can be made to "Jikken Kagaku Koza (Institute of Experimental Chemistry) 28: Koubunshi Gosei (Synthesis of Polymers)", edited by The Chemical Society of Japan, Maruzen, and "Shinjikken Kagaku Koza (New Institute of Experimental Chemistry) 19: Koubunshi Gosei (Synthesis of Polymers)", edited by The Chemical Society of Japan, Maruzen.

In the invention, the amount of metal components such as Na, K, Ca, Fe and Mg contained in the resin which is the component (A1) is preferably small. In some detail, the content of metal seeds contained in the resin is preferably not greater than 300 ppb, more preferably not greater than 200 ppb, even more preferably not greater than 100 ppb.

[2] Resist Composition

The acid-decomposable resin to be used in the invention is preferably incorporated in a resist composition before use. For example, a resist composition having the following formulation can be prepared.

A positive-working resist composition comprising:

(A1) an acid-decomposable resin as mentioned above; and (B) a compound capable of generating an acid by the action with one of an actinic ray and a radiation.

This resist composition preferably further comprises as a component (A2) a resin increasing the solubility in an alkali developing solution by the action of an acid other than the resin (A1).

(A2) the resin increasing the solubility in an alkali developing solution by the action of an acid is not limited but is preferably a resin containing at least one repeating unit selected from the group consisting of those represented by the following general formulae (I') to (VI') more preferably a resin containing at least one repeating unit selected from the group consisting of those represented by the following general formulae (I″) to (VI″).

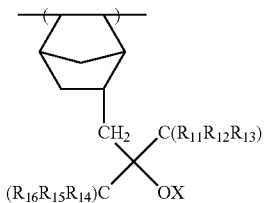
(I′)

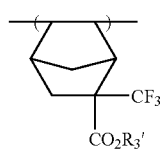
(II′)

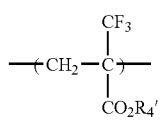
(III′)

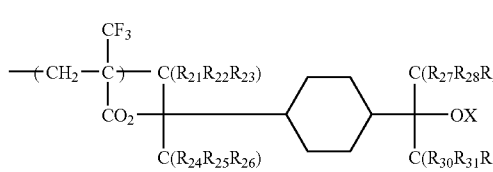
(IV′)

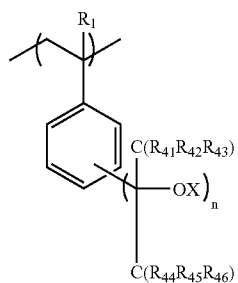
(V′)

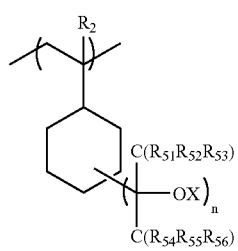
(VI′)

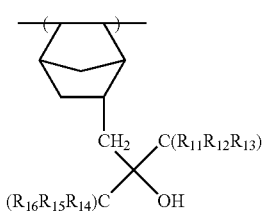
(I″)

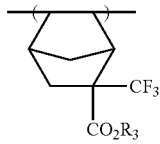
(II″)

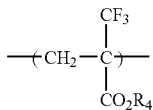
(III″)

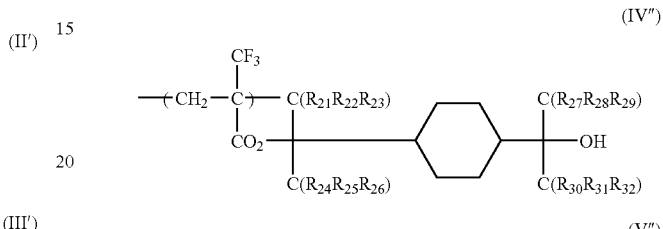
(IV″)

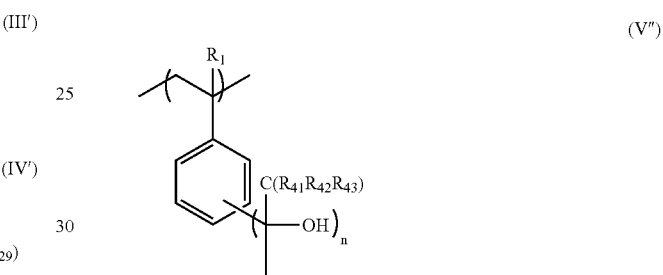
(V″)

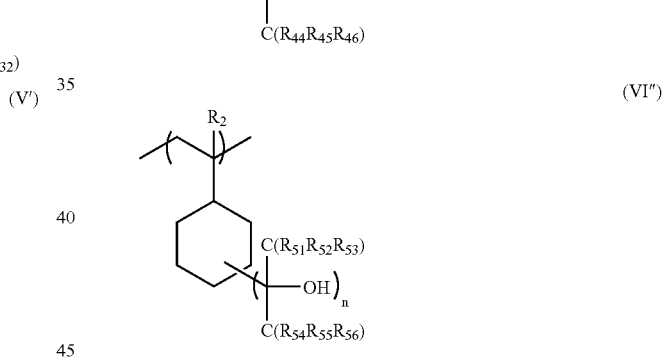
(VI″)

In the aforementioned general formulae, $R_1$ and $R_2$ each independently represents a hydrogen atom, a fluorine atom, a chlorine atom, a bromine atom, a cyano group or a trifluoromethyl group.

X, $R_3'$ and $R_4'$ each represent a group which decomposes when acted upon by an acid.

The term "group which decomposes when acted upon by an acid" has the same meaning as the acid-decomposable resin described above.

$R_3$ and $R_4$ each independently represent a hydrogen atom, an alkyl group which may have substituents, an aryl group which may have substituents or an aralkyl group which may have substituents in which the alkyl group and aralkyl group each have —O—, —S—, —CO$_2$—, —CO—, —SO$_2$— or —SO— in the middle portion thereof.

$R_{11}$ to $R_{16}$, $R_{21}$ to $R_{32}$, $R_{41}$ to $R_{46}$ and $R_{51}$ to $R_{56}$ each represents a hydrogen atom, a fluorine atom or an alkyl group which may be substituted, with the proviso that at least one of $R_{11}$ to $R_{16}$, at least one of $R_{21}$ to $R_{32}$, at least one of $R_{41}$ to $R_{46}$ or at least one $R_{51}$ to $R_{56}$ is a fluorine atom.

Examples of the alkyl group, aryl group and aralkyl group employable herein include the alkyl group (straight-chain, branched and cyclic), aryl group and aralkyl group described above.
n represents an integer of from 1 to 5.
Specific examples of the resin (A2) of the invention will be given below, but the invention is not limited thereto.
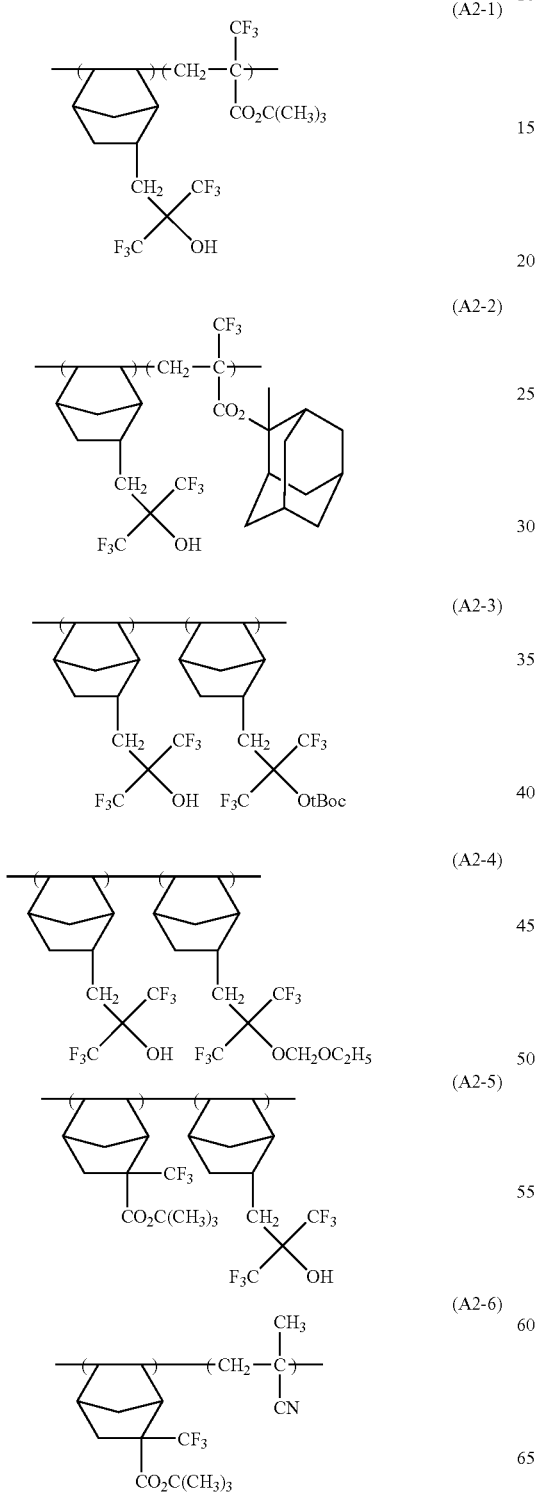
-continued
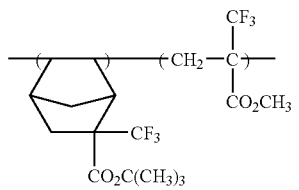
(A2-7)
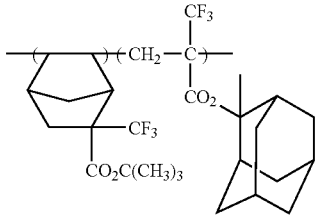
(A2-8)
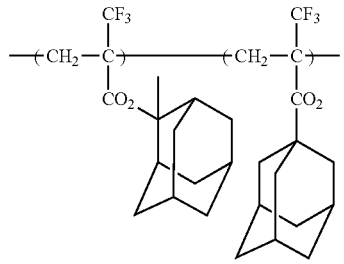
(A2-9)
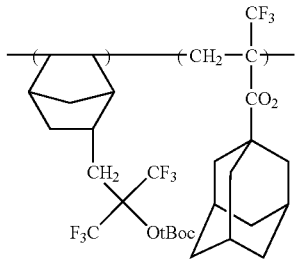
(A2-10)
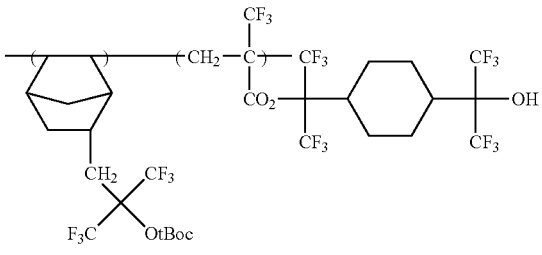
(A2-11)
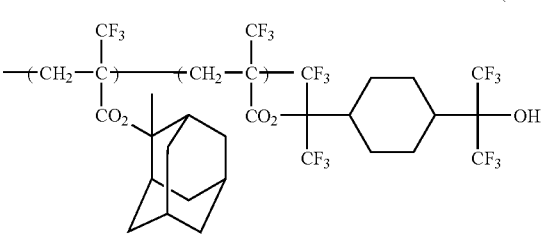
(A2-12)

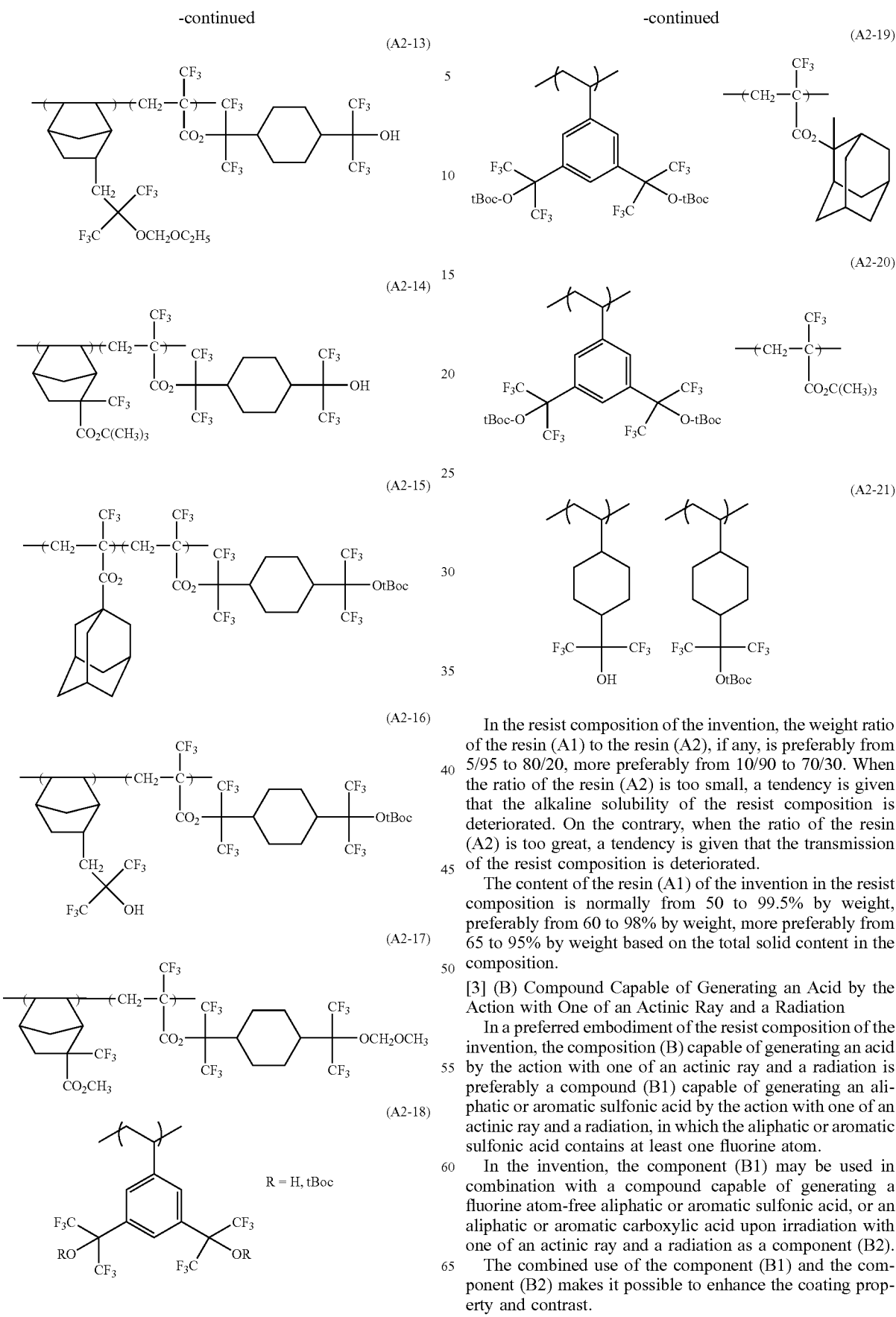

In the resist composition of the invention, the weight ratio of the resin (A1) to the resin (A2), if any, is preferably from 5/95 to 80/20, more preferably from 10/90 to 70/30. When the ratio of the resin (A2) is too small, a tendency is given that the alkaline solubility of the resist composition is deteriorated. On the contrary, when the ratio of the resin (A2) is too great, a tendency is given that the transmission of the resist composition is deteriorated.

The content of the resin (A1) of the invention in the resist composition is normally from 50 to 99.5% by weight, preferably from 60 to 98% by weight, more preferably from 65 to 95% by weight based on the total solid content in the composition.

[3] (B) Compound Capable of Generating an Acid by the Action with One of an Actinic Ray and a Radiation In a preferred embodiment of the resist composition of the invention, the composition (B) capable of generating an acid by the action with one of an actinic ray and a radiation is preferably a compound (B1) capable of generating an aliphatic or aromatic sulfonic acid by the action with one of an actinic ray and a radiation, in which the aliphatic or aromatic sulfonic acid contains at least one fluorine atom.

In the invention, the component (B1) may be used in combination with a compound capable of generating a fluorine atom-free aliphatic or aromatic sulfonic acid, or an aliphatic or aromatic carboxylic acid upon irradiation with one of an actinic ray and a radiation as a component (B2).

The combined use of the component (B1) and the component (B2) makes it possible to enhance the coating property and contrast.

The aliphatic or aromatic sulfonic acid which is the component (B1) preferably has from 1 to 20 carbon atoms, more preferably 2 to 16 carbon atoms, even more preferably from 3 to 12 carbon atoms.

The compounds (components B1 and B2) capable of generating an acid by the action with one of an actinic ray and a radiation can be normally selected from the group consisting of those which are commonly used as compounds (photo-acid generators) which decompose to generate an acid when irradiated with an active ray or radiation.

In some detail, photo-cation polymerization initiators, photo-radical polymerization initiators, optical dye decoloring agents, optical decoloring agents, compounds which generate an acid when irradiated with known light (ultraviolet rays having a wavelength of from 200 to 400 nm, far ultraviolet rays, particularly g-ray, h-ray, i-ray, KrF excimer laser beam), ArF excimer laser beam, $F_2$ excimer laser beam, electron ray, X-ray, molecular ray or ion beam, and mixture thereof may be properly selected.

Examples of these compounds include diazonium salts as disclosed in S. I. Schlesinger, "Photogr. Sci. Eng.", 18, 387, 1974, and T. S. Bal et al, "Polymer", 21, 423, 1980, ammonium salts as disclosed in U.S. Pat. Nos. 4,069,055, 4,069,056 and re 27,992, and JP-A-3-140140, phosphonium salts as disclosed in D. C. Necker et al, "Macromolecules", 17, 2468, 1984, C. S. Wen et al, "Teh, Proc. Conf. Ra. Curing ASIA", p 478, Tokyo, October 1988, and U.S. Pat. Nos. 4,069,055 and 4,069,056, iodonium salts as disclosed in J. V. Crivello et al, "Macromorecules", 10 (6), 1307, 1977, "Chem. & Eng. News", Nov. 28, p 31, 1988, European Patents 104,143, 39,049 and 410,201, JP-A-2-150848 and JP-A-2-296514, sulfonium salts as disclosed in J. V. Crivello et al, "Polymer J.", 17, 73, 1985, J. V. Crivello et al, "J. Org. Chem.", 43, 3055, 1978, W. R. Watt et al, "J. Polymer Sci.", Polymer Chem. Ed., 22, 1789, 1984, J. V. Crivello et al, "Polymer Bull.", 14, 279, 1985, J. V. Crivello et al, "Macromorecules", 14 (5), 1141, 1981, J. V. Crivello et al, "J. Polymer Sci.", Polymer Chem. Ed., 17, 2877, 1979, European Patents 370,693, 161,811, 410,201, 339,049, 233,567, 297,443 and 297,442, U.S. Pat. Nos. 4,933,377, 3,902,114, 4,760,013, 4,734,444 and 2,833,827, and German Patents 2,904,626, 3,604,580 and 3,604,581, selenium salts as disclosed in J. V. Crivello et al, "Macromorecules", 10 (6), 1307, 1977, J. V. Crivello et al, "Polymer J.", 17, 73, 1985, and J. V. Crivello et al, "J. Polymer Sci.", Polymer Chem. Ed., 17, 1047, 1979, organichalogen compounds as disclosed in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metal/organic halogen compounds as disclosed in K. Meier et al, "J. Rad. Curing", 13 (4), 26, 1986, T. P. Gill et al., "Inorg. Chem.", 19, 3007, 1980, D. Astruc, Acc. Chem. Res., 19 (12), 377, 1896 and JP-A-2-161445, photo-acid generators having O-nitrobenzyl type protective group as disclosed in S. Hayase et al, "J. Polymer Sci.", 25, 753, 1987, E. Reichmanis et al, "J. Pholymer Sci.", Polymer Chem. Ed., 23, 1, 1985, Q. Q. Zhu et al, "J. Photochem.", 36, 85, 39, 317, 1987, B. Amit et al, "Tetrahedron Lett", (24) 2205, 1973, D. H. R. Barton et al, "J. Chem. Soc.", 3571, 1965, P. M. Collins et al, "J. chem. Soc.", Perkin I. 1695, 1975, M. Rudinstein et al, "Tetrahedron Lett.", (17), 1445, 1975, J. W. Walker et al, "J. Am. Chem. Soc.", 110, 7170, 1988, S. C. Busman et al, "J. Imaging Technol", 11 (4), 191, 1985, H. M. Houlihan et al, "Macromolecules", 21, 2001, 1988, P. M. Collings et al, "J. Chem. Soc.", Chem. Commun., 532, 1972, S. Hayase et al, "Macromolecules", 18, 1799, 1985, E. Reichmanis et al, "J. Electrochem. Soc.", Solid State Sci. Technol., 130 (6), F. M. Houlihan et al, "Macromolecules", 21, 2001, 1988, European Patents 0290,750, 046,083, 156, 535, 271,851 and 0,388,343, U.S. Pat. Nos. 3,901,710 and 4,181,531, JP-A-60-198538 and JP-A-53-133022, compounds which undergo photodecomposition to generate sulfonic acid, such as iminosulfonate as disclosed in M. TUNOOKA et al, "Polymer Preprints Japan", 35 (8), G. Berner et al, "J. Rad. Curing", 13 (4), W. J. Mijs et al, "Coating Technol.", 55 (697), 45, 1983, Akzo, H. Adachi et al, "Polymer Preprints, Japan", 37 (3), European Patents 0199,672, 84,515, 044,115, 618,564 and 0,101,122, U.S. Pat. Nos. 4,371,605 and 4,431,774, JP-A-64-18143, JP-A-2-245756 and JP-A-3-140109, and disulfone compounds as disclosed in JP-A-61-155544.

Preferred examples of the combination of the component B1 and the component B2 will be given below.

Combination of a compound which generates an aliphatic or aromatic sulfonic acid substituted by at least one fluorine atom when irradiated with an active ray or radiation as component B1 and a compound which generates a fluorine-free aliphatic or aromatic sulfonic acid as an anion or an ionic compound having an aliphatic or aromatic carboxylic acid which may have fluorine atoms as component B2.

[a] The compound (and ionic compound having a fluorine-containing sulfonic acid as an anion) which capable of generating a fluorine-containing sulfonic acid by the action with one of an actinic ray and a radiation will be described hereinafter.

Examples of the compound [a] include iodonium salts represented by the following general formula (PAG3), and sulfonium salts represented by the following general formula (PAG4).

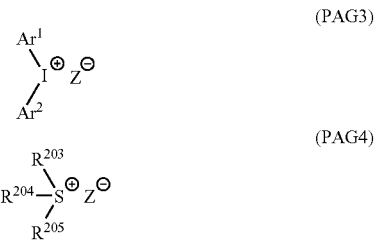

In these general formulae, $Ar^1$ and $Ar^2$ each independently represents a substituted or unsubstituted aryl group. $R^{203}$, $R^{204}$ and $R^{205}$ each independently represent a substituted or unsubstituted alkyl or aryl group.

Z– represents a sulfonic acid anion having at least one fluorine atom.

Two of $R^{203}$, $R^{204}$ and $R^{205}$ and $Ar^1$ and $Ar^2$ may be bonded to each other via its single bond or substituents.

Preferred examples of the aryl group represented by $Ar^1$, $Ar^2$, $R^{203}$, $R^{204}$ or $R^{205}$ include $C_6$–$C_{14}$ aryl groups. Preferred examples of the alkyl group $Ar^1$, $Ar^2$, $R^{203}$, $R^{204}$ or $R^{205}$ include $C_1$–$C_8$ alkyl group.

Preferred examples of the substituents on the aryl group include $C_1$–$C_8$ alkoxy group, $C_1$–$C_8$ alkyl group, $C_2$–$C_9$ alkoxycarbonyl group, $C_2$–$C_9$ alkylcarbonylamide group, nitro group, carboxyl group, hydroxyl groups halogen atom, and phenylthio group. Preferred examples of the substituents on the alkyl group include $C_1$–$C_8$ alkoxy group, $C_5$–$C_{14}$ aryl group, $C_6$–$C_{15}$ arylcarbonyl group, carboxyl group, and halogen atom.

Preferred examples of the sulfonic acid anion represented by $Z^-$ include $C_1$–$C_{20}$ aliphatic hydrocarbon and $C_5$–$C_{20}$ aromatic hydrocarbon having at least one fluorine atom. These aliphatic and aromatic hydrocarbon groups may have substituents. Examples of the substituents include $C_1$–$C_{10}$ alkoxy group which maybe substituted by fluorine, $C_1$–$C_{11}$ alkoxycarbonyl group which may be substituted by fluorine, phenylamino group, phenylcarbonyl group, halogen atom, and hydroxyl group. Examples of the aromatic hydrocarbon group include $C_1$–$C_{15}$ alkyl group.

Specific examples of the sulfonic acid anion of Z– will be given below, but the invention is not limited thereto.

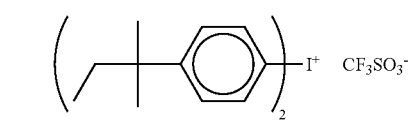
(VI-1)

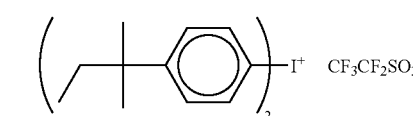
(VI-2)

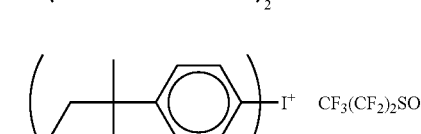
(VI-3)

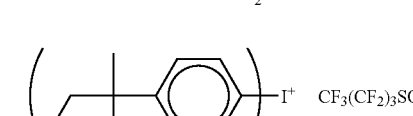
(VI-4)

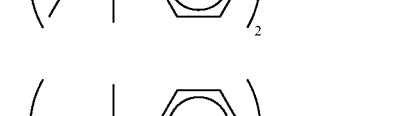
(VI-5)

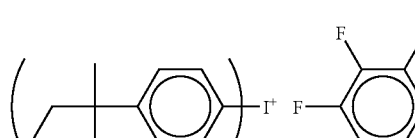
(VI-6)

(VI-7)

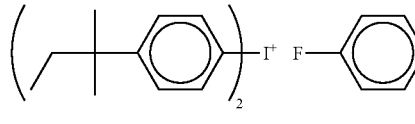
(VI-8)

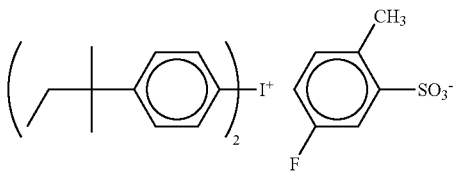
(VI-9)

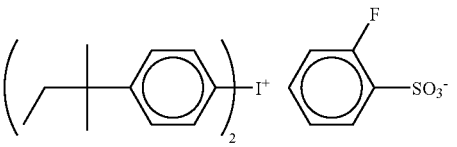
(VI-10)

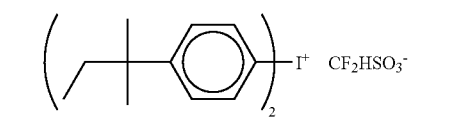
(VI-11)

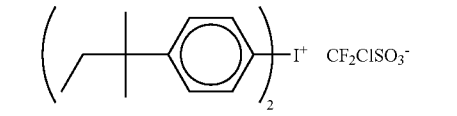
(VI-12)

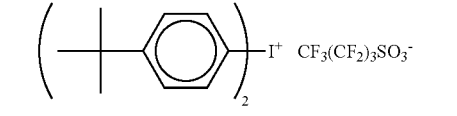
(VI-13)

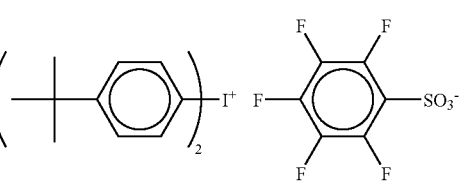
(VI-14)

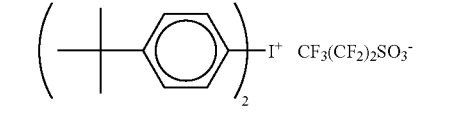
(VI-15)

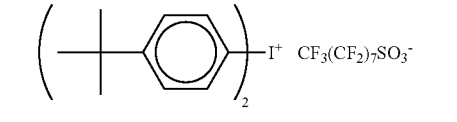
(VI-16)

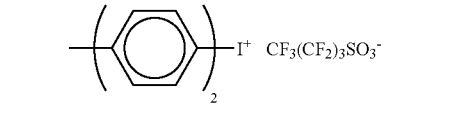
(VI-17)

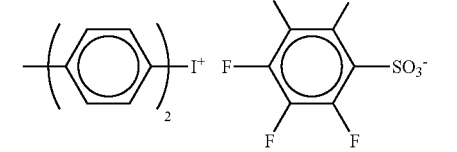
(VI-18)

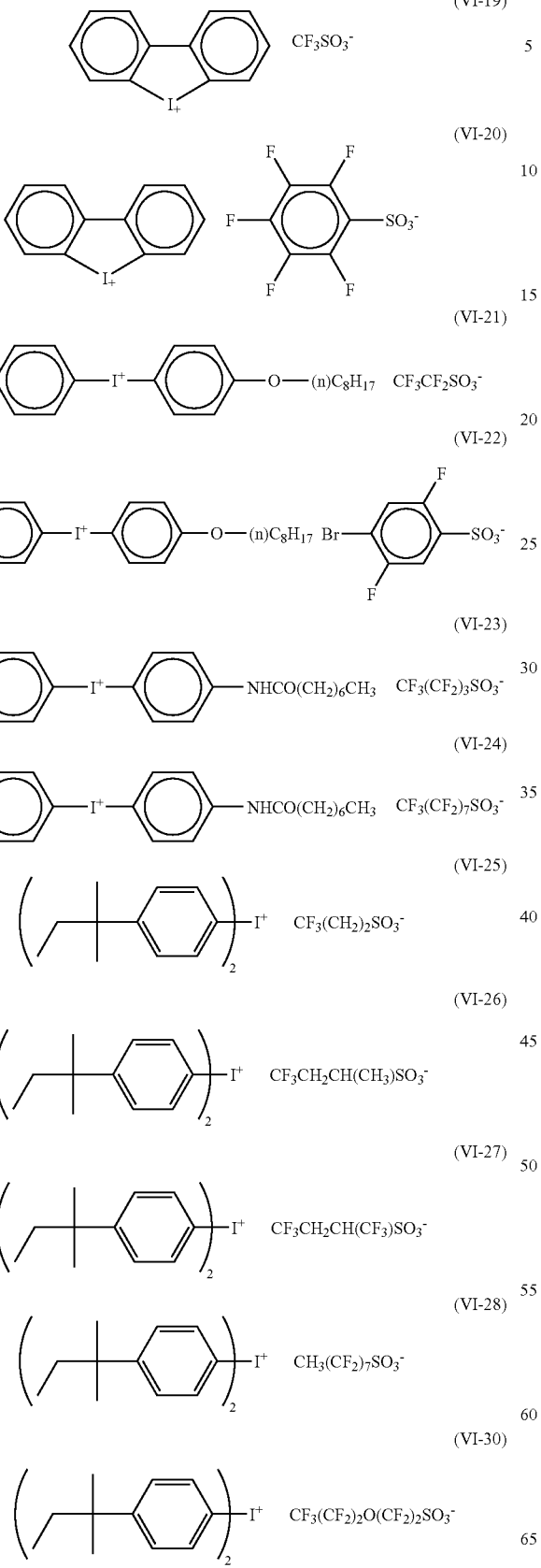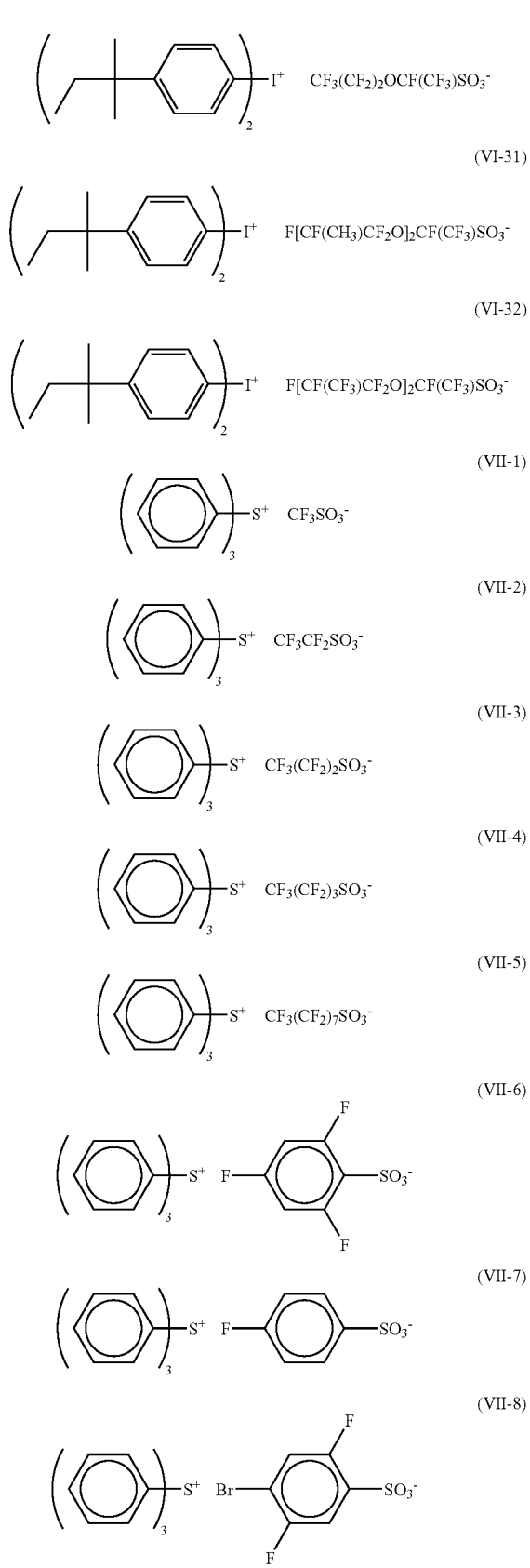

-continued
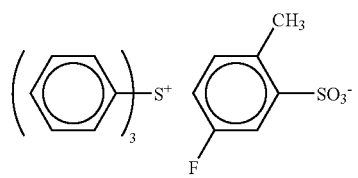 (VII-9)
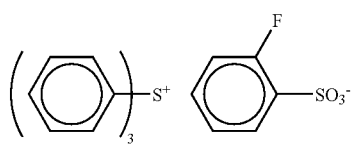 (VII-10)
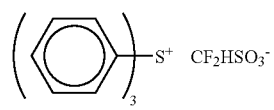 (VII-11)
(VII-12) 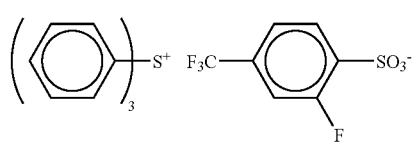
(VII-13) 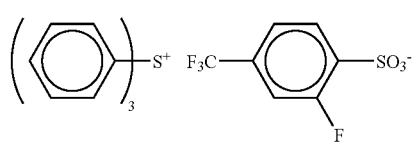
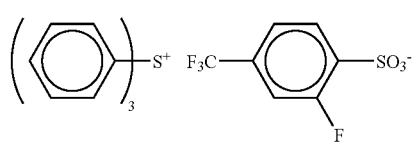 (VII-14)
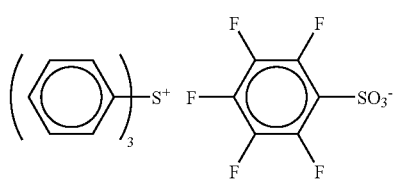 (VII-15)
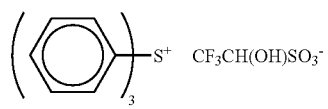 (VII-16)
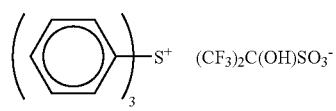 (VII-17)
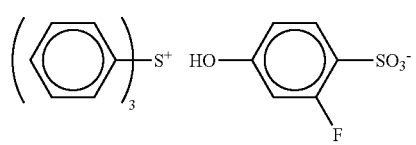 (VII-18)
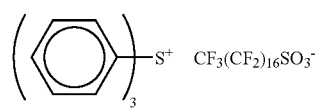
-continued
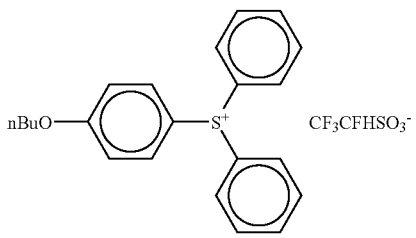 (VII-19)
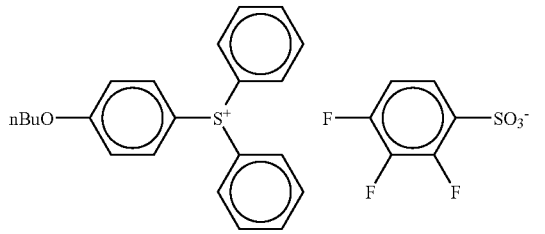 (VII-20)
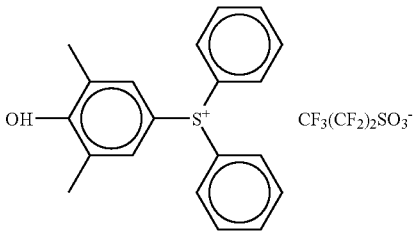 (VII-21)
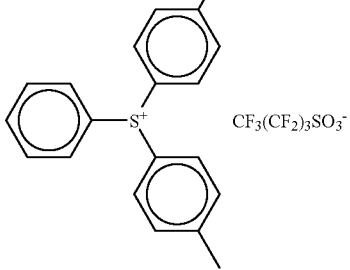 (VII-22)
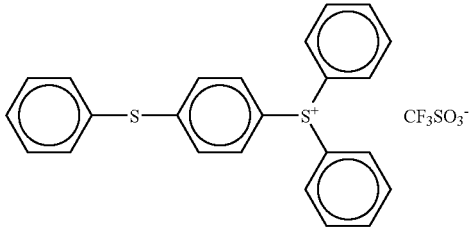 (VII-23)
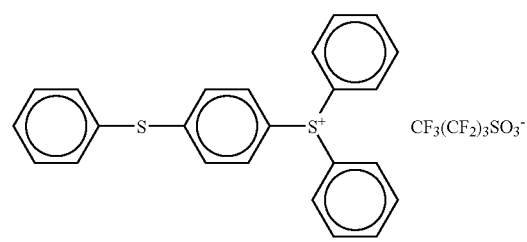 (VII-24)

-continued
(VII-25)
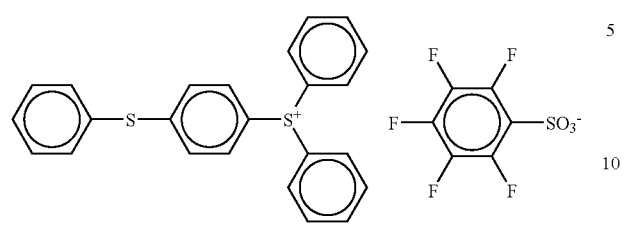
(VII-26)
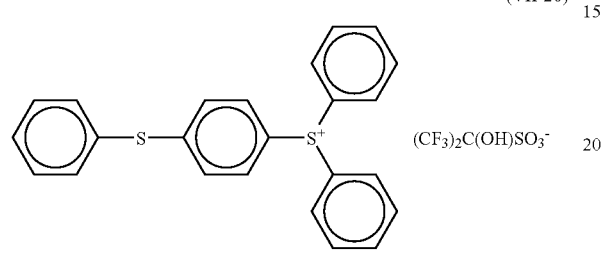
(VII-27)
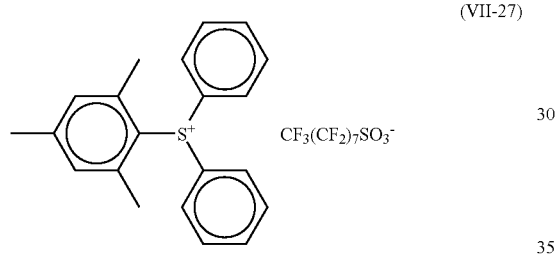
(VII-28)
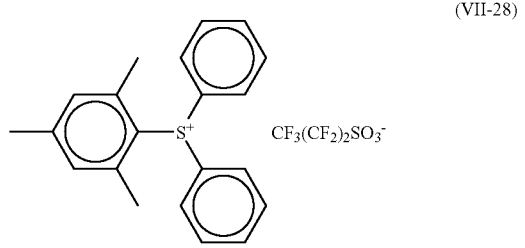
(VII-29)
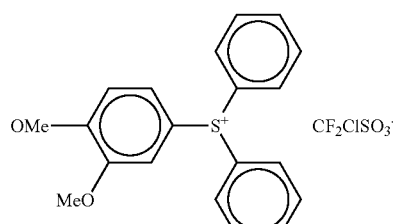
(VII-30)
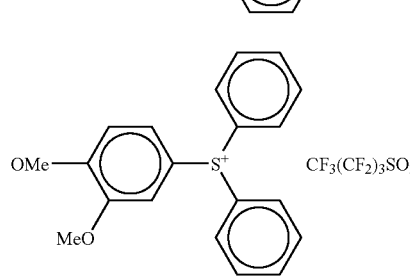
-continued
(VII-31)
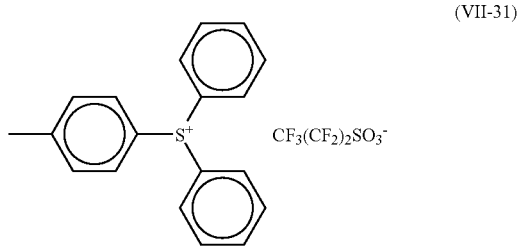
(VII-32)
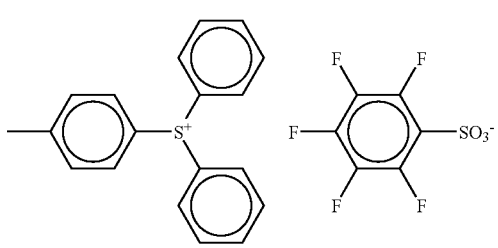
(VII-33)
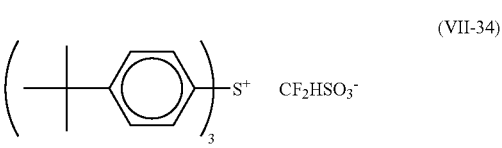
(VII-34)
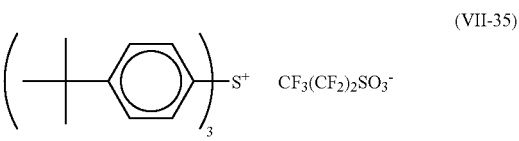
(VII-35)
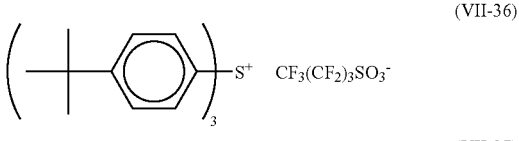
(VII-36)
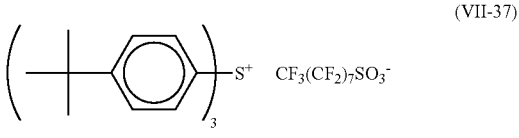
(VII-37)
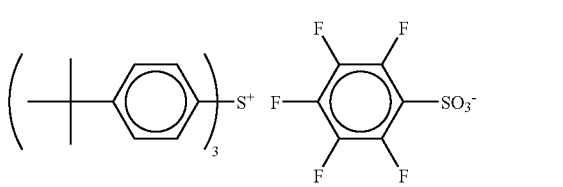
(VII-38)
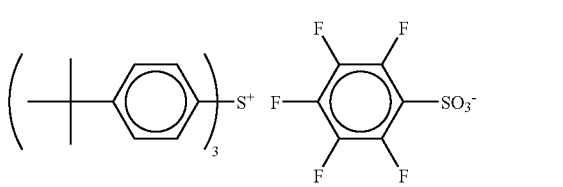
(VII-39)
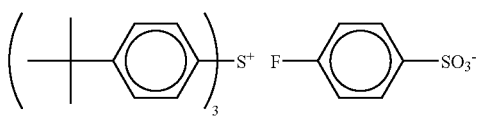

-continued
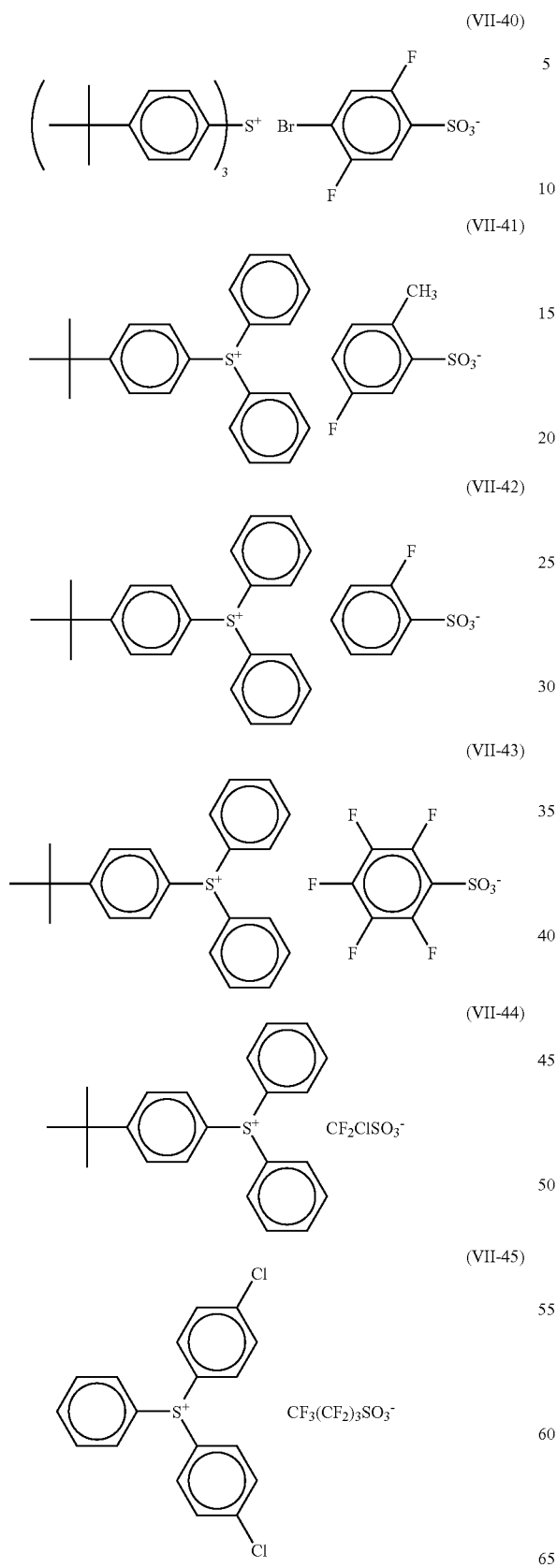
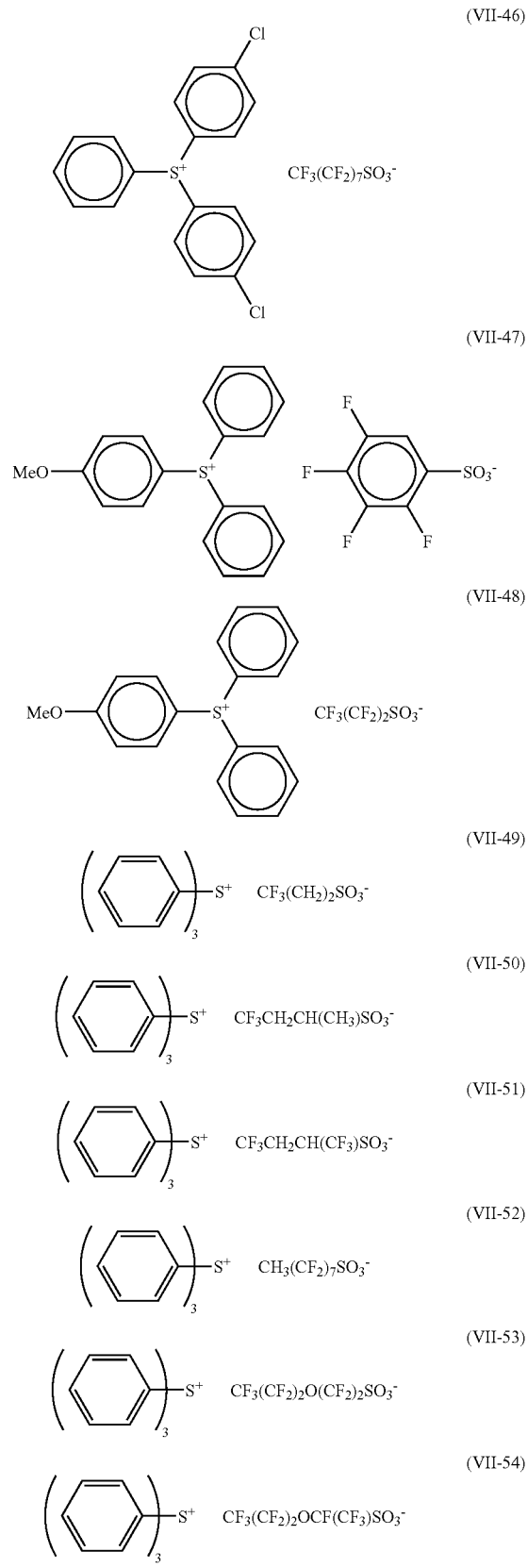

(VII-55)

(VII-56)

[b] As the compound and anion which generate a fluorine-free sulfonic acid by the action with one of an actinic ray or a radiation there may be used an ionic compound having a fluorine-free sulfonic acid. Examples of the ionic compound include iodonium salts and sulfonium salts of the general formulae (PAG3) and (PAG4) wherein Z⁻ is a sulfonic acid anion free of fluorine atom.

Specific examples of the iodonium salts and sulfonium salts will be given below, but the invention is not limited thereto.

(PAG3-1)
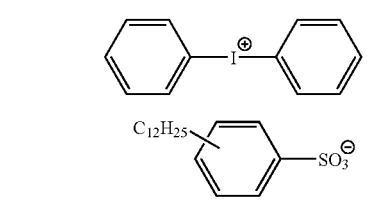

(PAG3-2)
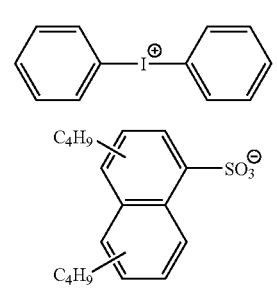

(PAG3-5)
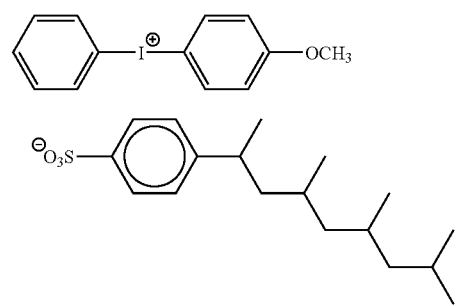

(PAG3-7)
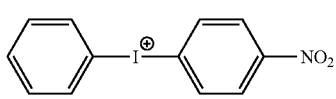

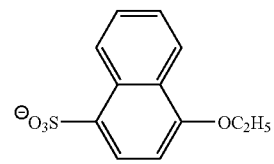

(PAG3-9)
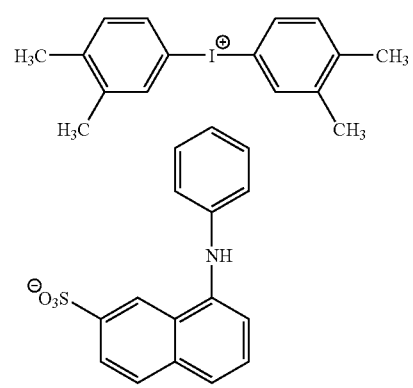

(PAG3-10)
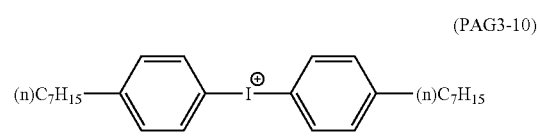

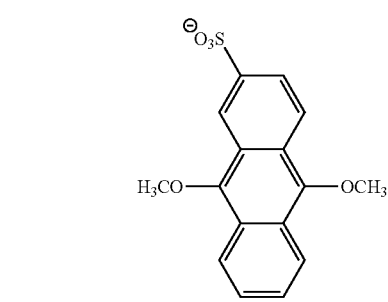

(PAG3-11)
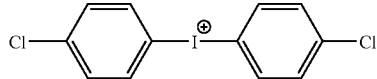

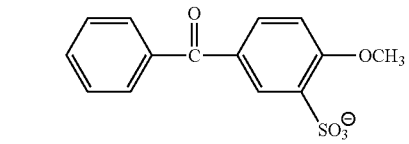

(PAG3-13)
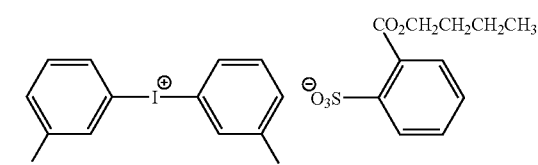

-continued
(PAG3-14)
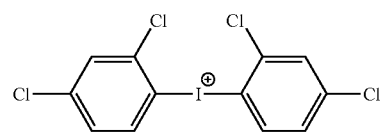
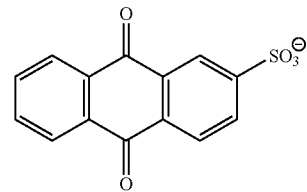
(PAG3-15)
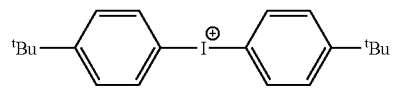
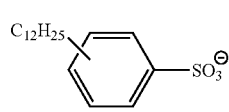
(PAG3-16)
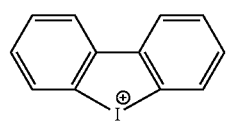
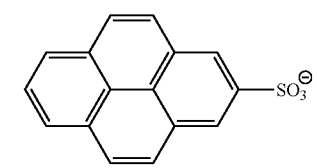
(PAG3-18)
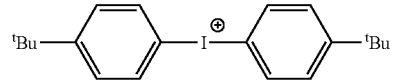
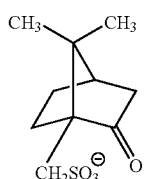
(PAG3-19)
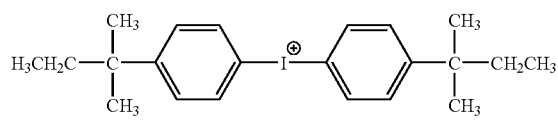
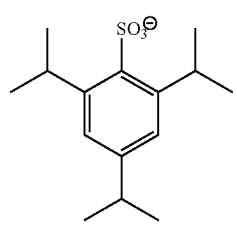
(PAG3-24)
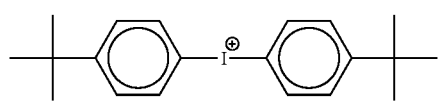
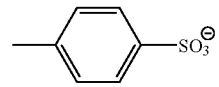
-continued
(PAG3-25)
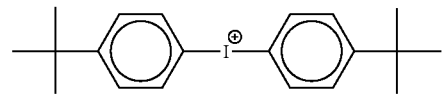
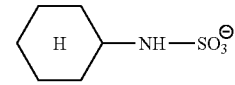
(PAG3-26)
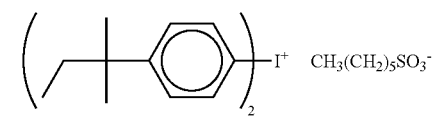
(PAG3-27)
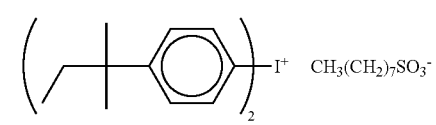
(PAG3-28)
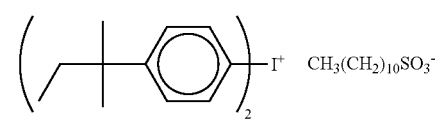
(PAG3-29)
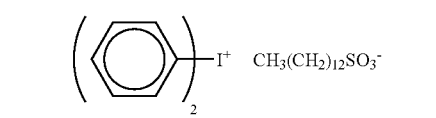
(PAG3-30)
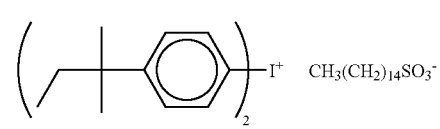
(PAG3-31)
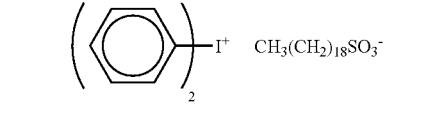
(PAG4-1)
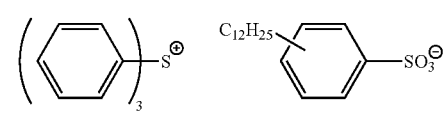
(PAG4-2)
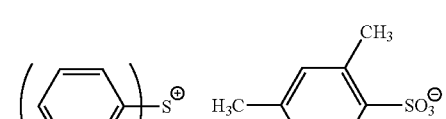
(PAG4-4)
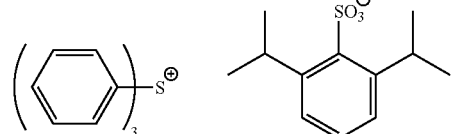

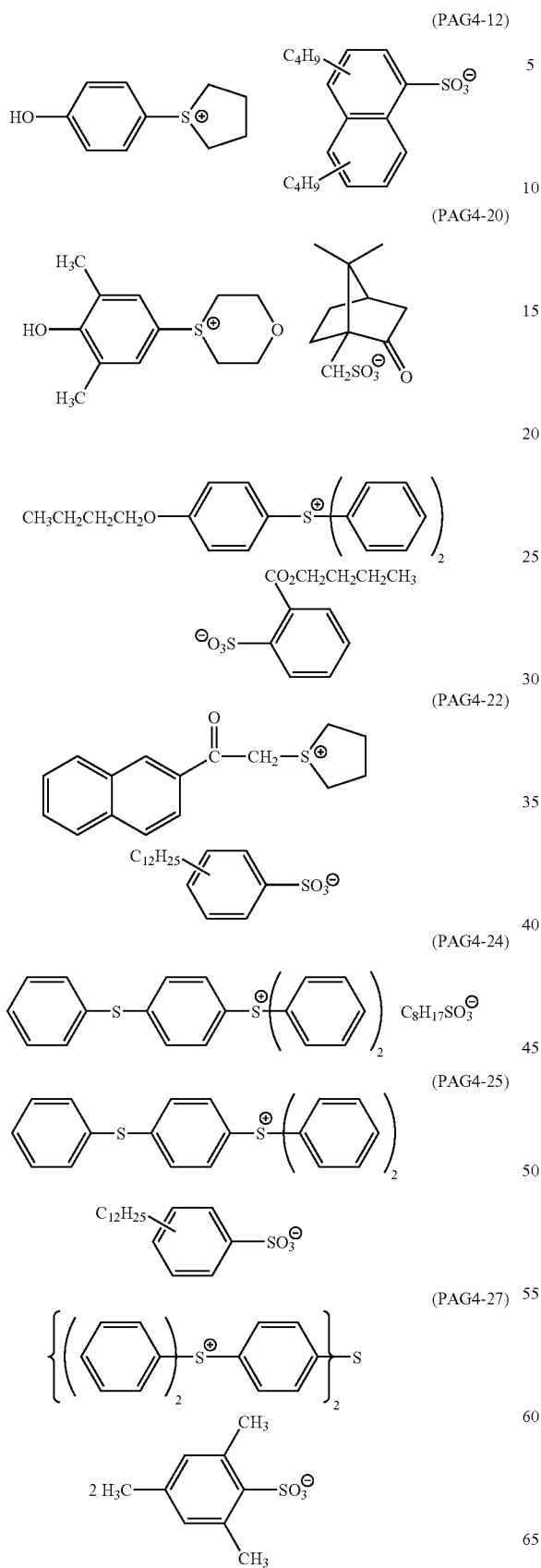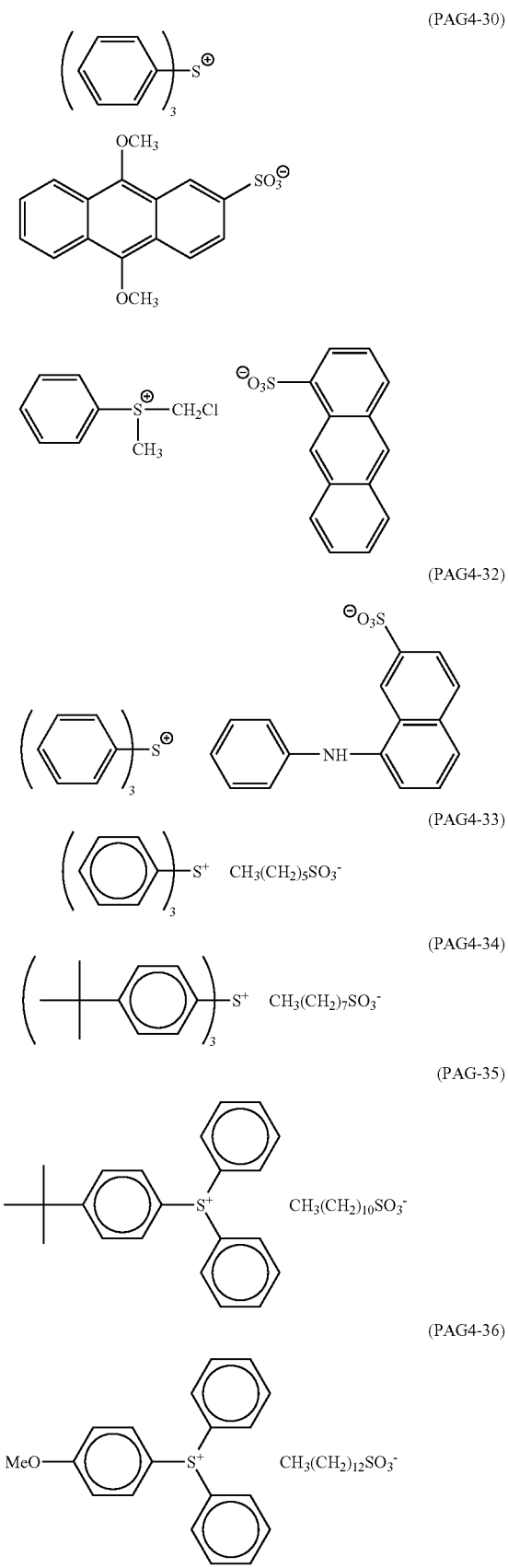

-continued (PAG4-37)
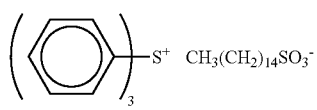

(PAG4-38)
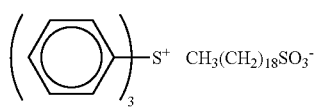

(PAG4-39)
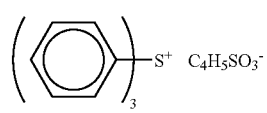

Further, disulfone derivatives represented by the following general formula (PAG5) and iminosulfonate derivatives represented by the following general formula (PAG6) may be exemplified.

(PAG5)
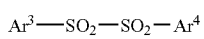

(PAG6)
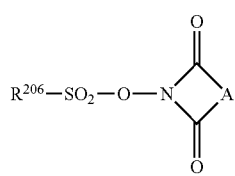

In these general formulae, $Ar^3$ and $Ar^4$ each independently represents a substituted or unsubstituted aryl group. $R^{206}$ represents a substituted or unsubstituted alkyl group or aryl group. A represents a substituted or unsubstituted alkylene group, alkenylene group or arylene group.

Specific examples of these compounds include compounds exemplified below, but the invention is not limited thereto.

(PAG5-1)
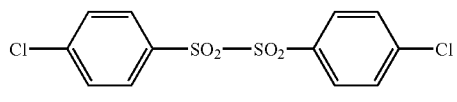

(PAG5-2)
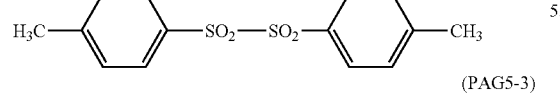

(PAG5-3)
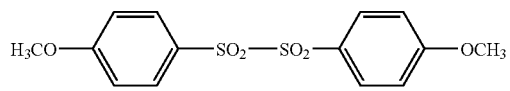

(PAG5-4)
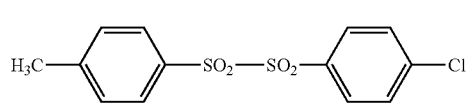

(PAG5-6)
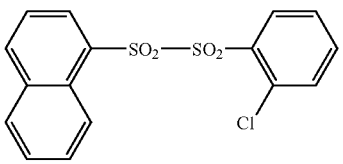

(PAG5-7)
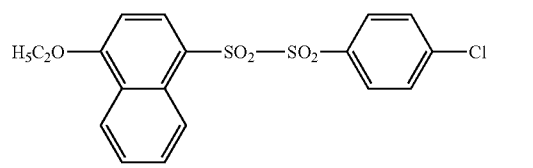

(PAG5-8)
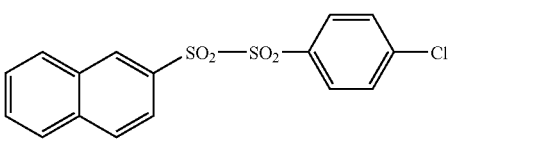

(PAG5-9)
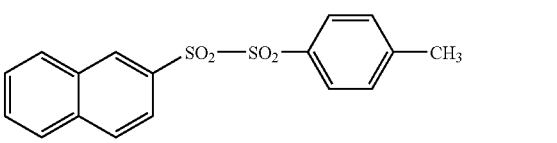

(PAG5-10)
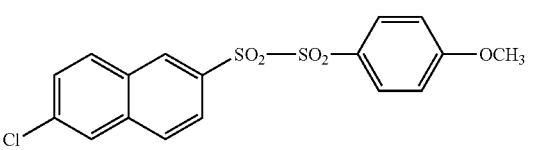

(PAG5-11)
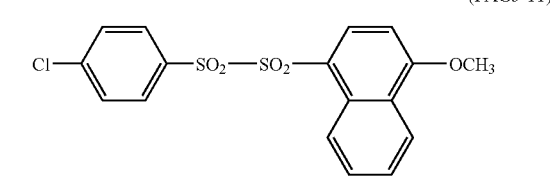

(PAG5-12)
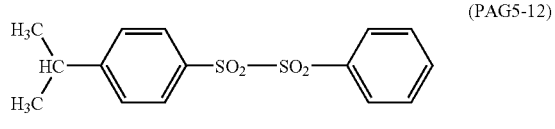

(PAG5-14)
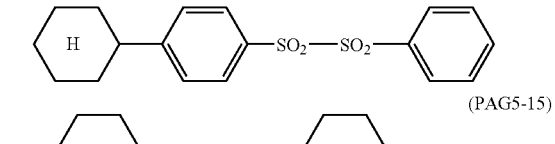

(PAG5-15)
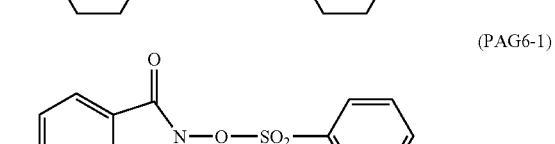

(PAG6-1)
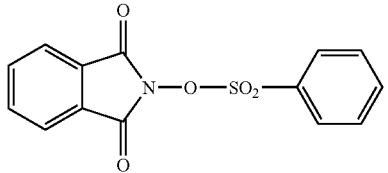

-continued (PAG6-2)
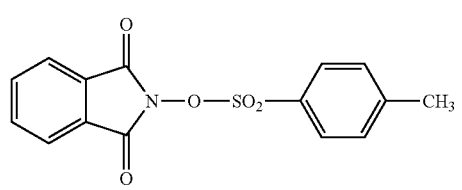

(PAG6-3)
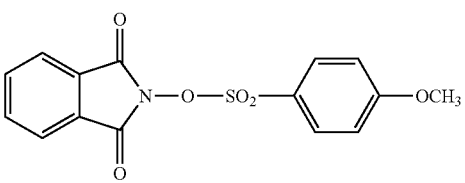

(PAG6-5)
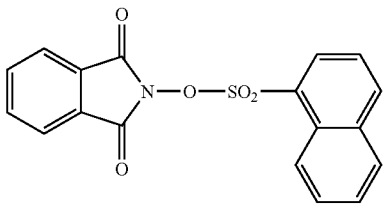

(PAG6-6)
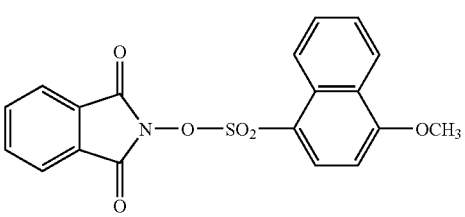

(PAG6-7)
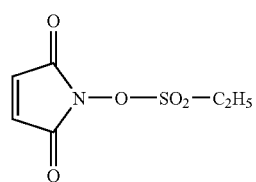

(PAG6-8)
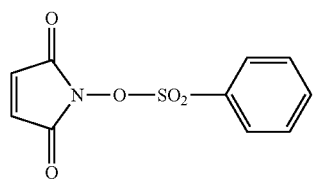

(PAG6-9)
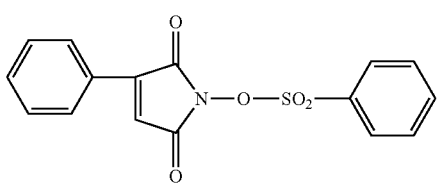

(PAG6-10)
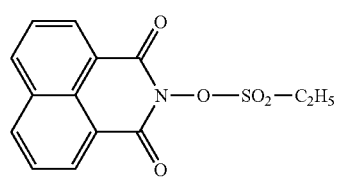

-continued (PAG6-11)
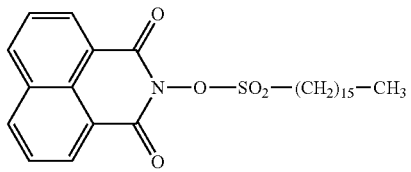

(PAG6-12)
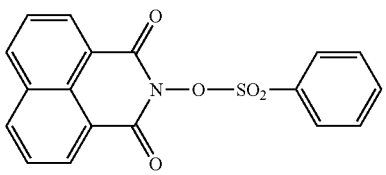

(PAG6-17)
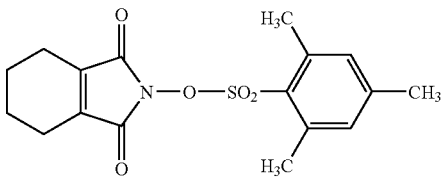

(PAG6-20)
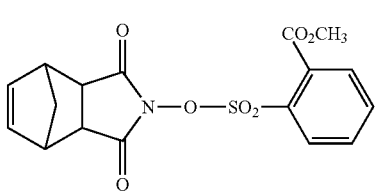

(PAG6-22)
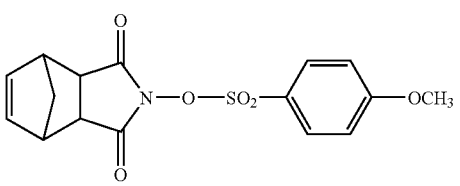

Moreover, diazodisulfone derivatives represented by the following general formula (PAG7) may be exemplified.

(PAG7)
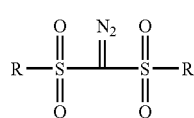

In the aforementioned general formula, R represents a straight-chain, branched or cyclic alkyl group or an aryl group, which may be substituted.

Specific examples of the diazodisulfone derivatives will be given below, but the invention is not limited thereto.

(PAG7-1)
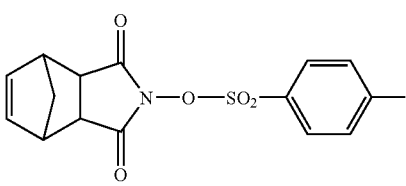

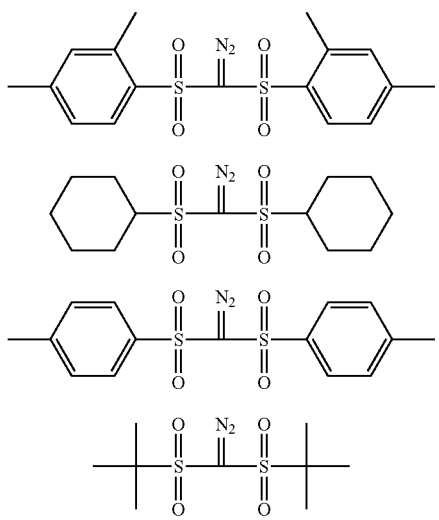

(PAG7-2)

(PAG7-3)

(PAG7-4)

(PAG7-5)

The compounds described in the aforementioned clauses [a] and [b] can be synthesized by reacting a periodate with an aromatic compound, and then subjecting the resulting iodonium salt to salt exchange to form a corresponding sulfonic acid.

These compounds may be synthesized also by reacting an aryl Grignard reagent such as aryl magnesium bromide with a substituted or unsubstituted phenyl sulfoxide, and then subjecting the resulting triaryl sulfoninum halide to salt exchange with a corresponding sulfonic acid. Alternatively, a method which comprises subjecting a substituted or unsubstituted phenyl sulfoxide and a corresponding aromatic compound thereof to condensation and salt exchange in the presence of an acid catalyst such as methanesulfonic acid/ diphosphorus pentaoxide and aluminum chloride or a method which comprises subjecting a diaryl iodonium salt and diaryl sulfide to condensation and salt exchange in the presence of a catalyst such as copper acetate may be employed.

Salt exchange can be accomplished by a method which comprises deriving the starting material to a halide which is then converted to a sulfonic acid salt in the presence of a silver reagent such as silver oxide or by the use of an ion-exchange resin. As the sulfonic acid or sulfonic acid salt to be used in salt exchange there may be used a commercially available product. Alternatively, the sulfonic acid or sulfonic acid salt can be obtained by the hydrolysis of a commercially available sulfonic acid halide.

[c] The compound which generates a fluorine-containing acid by the action with one of an actinic ray or a radiation and the ionic compound having a fluorine-containing carboxylic acid as an anion will be described hereinafter.

Examples of the fluorine-substituted aliphatic carboxylic acid include fluorine substitution products of aliphatic carboxylic acids such as acetic acid, propionic acid, n-butyric acid, isobutyric acid, valeric acid, trimethylacetic acid, caproic acid, heptoic acid, caprylic acid, pelargonic acid, capric acid, lauric acid, myristic acid, palmitic acid, stearic acid, undecanoic acid and dodecanoic acid. These fluorine-substituted aliphatic carboxylic acids may have hydroxyl group, alkoxy group and halogen atom as substituents. Preferably, these fluorine-substituted aliphatic carboxylic acids contain connecting groups such as oxygen atom, sulfur atom, carbonyl group, carboxyl group and sulfonyl group in its aliphatic chain.

Preferred examples of the fluorine-substituted aliphatic carboxylic acid include those represented by the following general formula:

$$L\text{-}(CH_2)_p(CF_2)_q(CH_2)_r\text{---COOH}$$

In the aforementioned general formula, L represents a hydrogen atom or fluorine atom. The suffixes p and r each independently represent an integer of from 0 to 15, and the suffix q represents an integer of from 1 to 15. The hydrogen atom or fluorine atom in the alkyl chain in the general formula may be substituted by an alkyl group (preferably having from 1 to 5 carbon atoms) which may be substituted by fluorine atoms, an alkoxy group (preferably having from 1 to 5 carbon atoms) or a hydroxyl group.

The aforementioned fluorine-substituted aliphatic carboxylic acid is preferably a fluorine substitution product of a saturated aliphatic carboxylic acid having from 2 to 20, more preferably from 4 to 20 carbon atoms. When the number of carbon atoms in the fluorine-substituted aliphatic carboxylic acid is not smaller than 4, the diffusibility of the decomposability of the resulting carboxylic acid is deteriorated, making it possible to inhibit the change of line width with time from exposure to post-heating. In particular, fluorine substitution products of $C_4$–$C_8$ straight-chain or branched saturated aliphatic carboxylic acid are preferred.

The fluorine-substituted aromatic carboxylic acid is preferably a fluorine substitution product of $C_7$–$C_{20}$, more preferably $C_7$–$C_{15}$, even more preferably $C_7$–$C_{11}$ aromatic carboxylic acid. Specific examples of the fluorine-substituted aromatic carboxylic acid include fluorine substitution products of aromatic carboxylic acids such as benzoic acid, substituted benzoic acid, naphthoic acid, substituted naphthoic acid, anthracenecarboxylic acid and substituted anthracenecarboxylic acid (Examples of the substituents on these aromatic groups include alkyl group, alkoxy group, hydroxyl group, halogen atom, aryl group, acyl group, acyloxygroup, nitrogroup, alkylthiogroup, andarylthio group). Preferred among these fluorine-substituted aromatic carboxylic acids are fluorine substitution products of benzoic acid and substituted benzoic acid.

These fluorine-substituted aliphatic or aromatic carboxylic acids have one or more hydrogen atoms in the skeleton other than carboxyl group substituted by fluorine atoms, particularly all hydrogen atoms in the skeleton other than carboxylic group substituted by fluorine atoms (perfluorosaturated aliphatic carboxylic or perfluoroaromatic carboxylic acid). In this arrangement, the resulting product exhibits a higher sensitivity.

Preferred examples of the fluorine-substituted aliphatic or aromatic carboxylic acids include onium salt compounds (sulfonium salt, iodonium salt) having as counter, anions the aforementioned fluorine-substituted aliphatic or aromatic carboxylic acid, and imide carboxylate compounds or nitrobenzyl ester compounds having carboxylic acid ester group.

More preferably, compounds represented by the following general formulae (I) to (III) are used. In this arrangement, the resulting product exhibits a higher sensitivity, resolution and exposure margin. When irradiated with an active ray or radiation, these compounds generate a saturated aliphatic or aromatic carboxylic acid substituted by at least one fluorine atom corresponding to $X^-$ in the following general formulae (I) to (III) to act as a photo-acid generator.

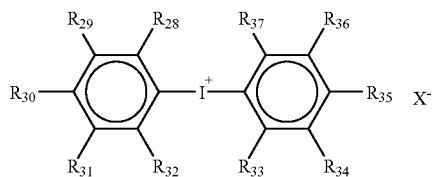

(I)

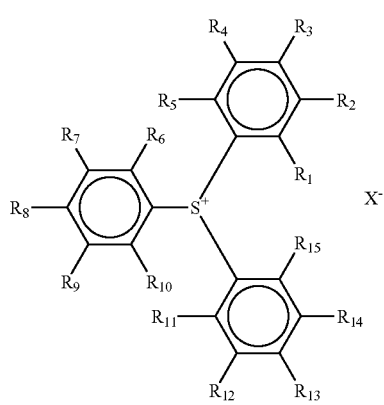

(II)

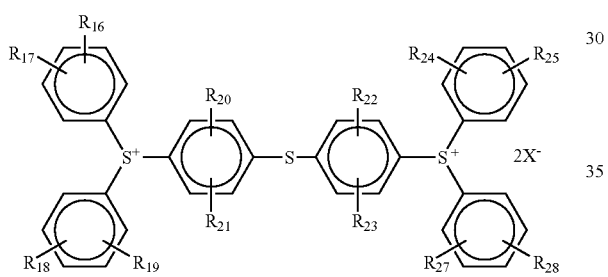

(III)

In the above formula, $R_1$ to $R_{37}$ each independently represents a hydrogen atom, a straight-chain, branched or cyclic alkyl group, a straight-chain, branched or cyclic alkoxy group, a hydroxy group, a halogen atom or —S—$R_{38}$ group (in which $R_{38}$ represents a straight-chain, branched or cyclic alkyl group or aryl group); and $X^-$ represents an aliphatic or aromatic carboxylic acid anion substituted by at least one fluorine atom.

$X^-$ is preferably a perfluoroaliphatic carboxylic acid or perfluoroaromatic carboxylic acid anion, particularly a fluorine-substituted alkylcarboxylic anion having 4 or more carbon atoms.

Examples of the straight-chain or branched alkyl groups represented by $R_1$ to $R_{38}$ in the general formulae (I) to (III) include $C_1$–$C_4$ alkyl groups such as methyl group, ethyl group, propyl group, n-butyl group, sec-butyl group and t-butyl group which may have substituents. Examples of the cyclic alkyl group include $C_3$–$C_8$ alkyl groups such as cyclopropyl group, cyclopentyl group and cyclohexyl group which may have substituents.

Examples of the alkoxy group represented by $R_1$ to $R_{37}$ include $C_1$–$C_4$ alkoxy groups such as methoxy group, ethoxy group, hydroxyethoxy group, propoxy group, n-butoxy group, isobutoxy group, sec-butoxy group and t-butoxy group.

Examples of the halogen atom represented by $R_1$ to $R_{37}$ include fluorine atom, chlorine atom, bromine atom, and iodine atom.

Examples of the aryl group represented by $R_{38}$ include $C_6$–$C_{14}$ aryl groups such as phenyl group, tolyl group, methoxyphenyl group and naphthyl group. These aryl groups may have substituents.

Preferred examples of these substituents include $C_1$–$C_4$ alkoxy groups, halogen atoms (e.g., fluorine atom, chlorine atom, bromine atom), $C_6$–$C_{10}$ aryl groups, $C_2$–$C_6$ alkenyl groups, $C_2$–$C_6$ alkenyl groups, cyano groups, hydroxy groups, carboxyl groups, alkoxycarbonyl groups, and nitro groups.

The iodonium compounds or sulfonium compounds represented by the general formulae (I) to (III) each have as a counter anion $X^-$ a saturated aliphatic or aromatic carboxylic acid anion substituted by at least one fluorine atom. These anions are anions (—COO$^-$) obtained by eliminating the hydrogen atom from the carboxylic acid (—COOH).

Specific examples of the anion will be given below, but the invention is not limited thereto.

Specific examples (I-1f) to (I-36f) of the photo-acid generator represented by the general formula (I):

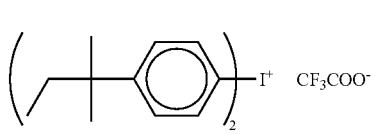
(I-1f)

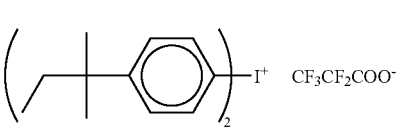
(I-2f)

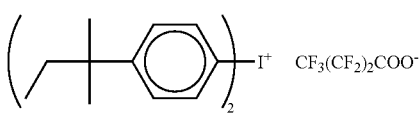
(I-3f)

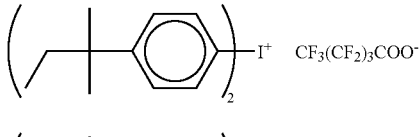
(I-4f)

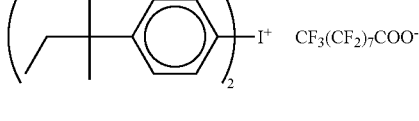
(I-5f)

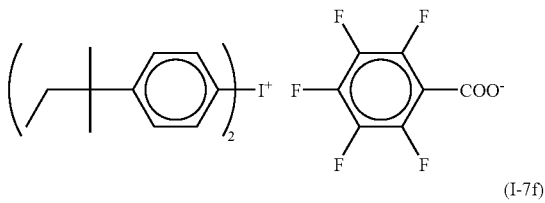
(I-6f)

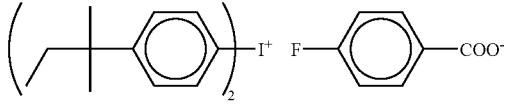
(I-7f)

-continued
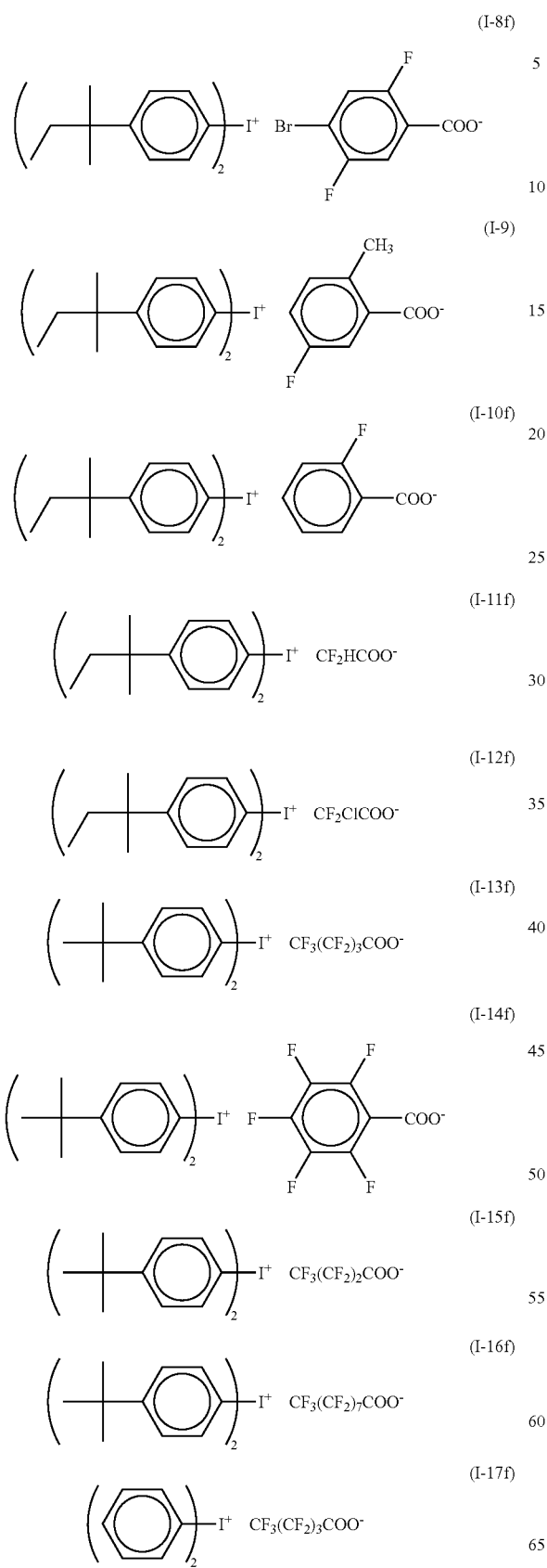
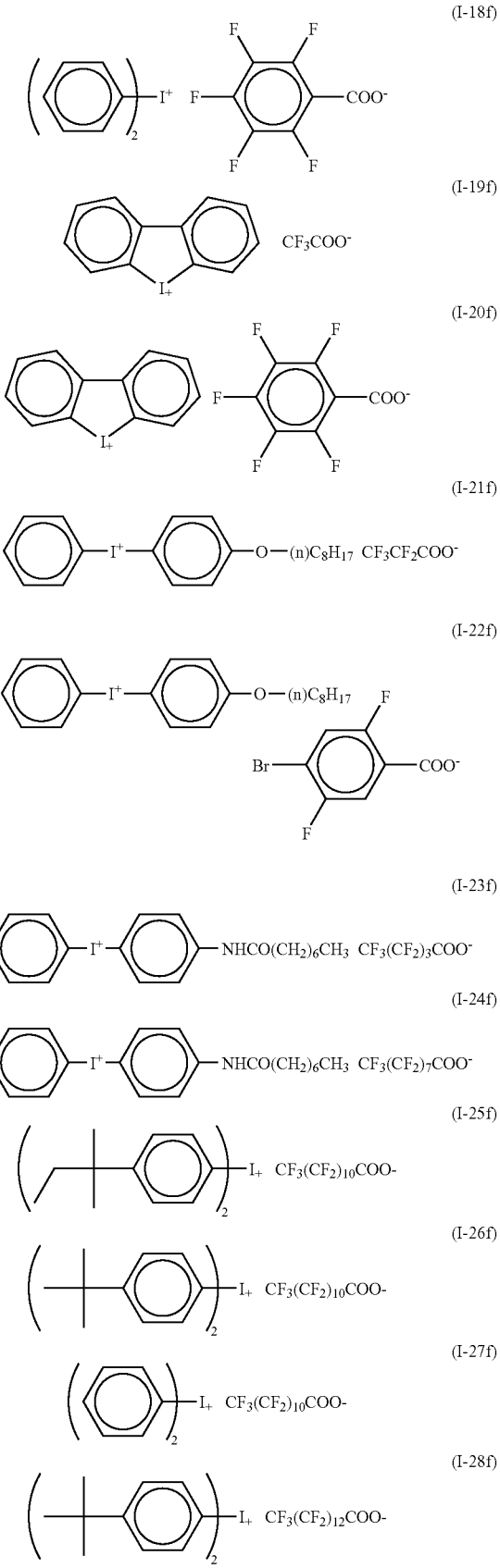

-continued
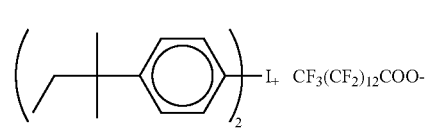 (I-29f)
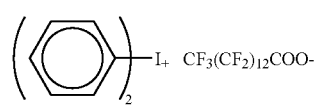 (I-30f)
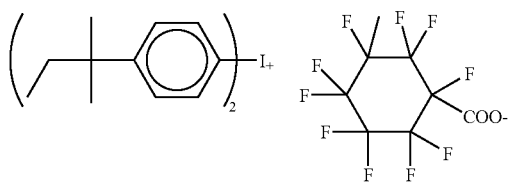 (I-31f)
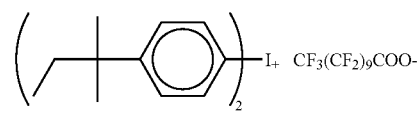 (I-33f)
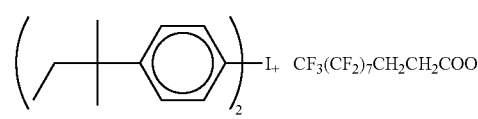 (I-34f)
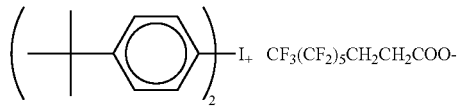 (I-35f)
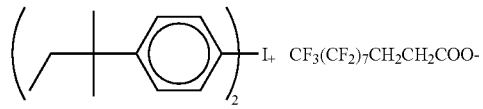 (I-36f)
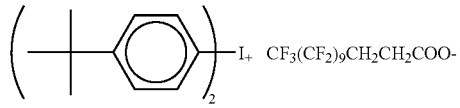
Specific examples (II-1f) to (II-67f) of the photo-acid generator represented by the general formula (II):
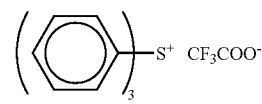 (II-1f)
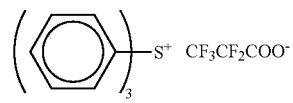 (II-2f)
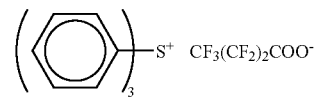 (II-3f)
-continued
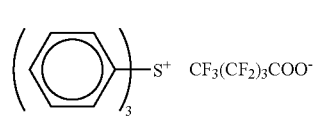 (II-4f)
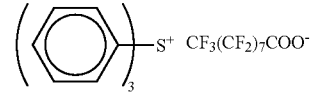 (II-5f)
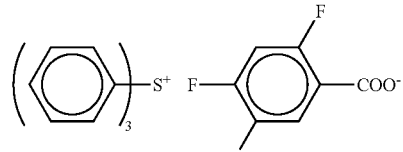 (II-6f)
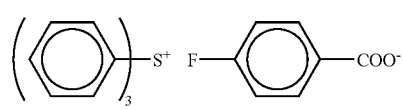 (II-7f)
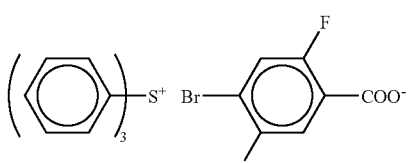 (II-8f)
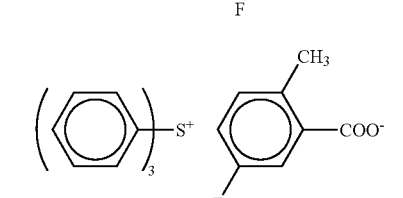 (II-9)
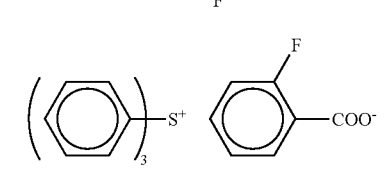 (II-10f)
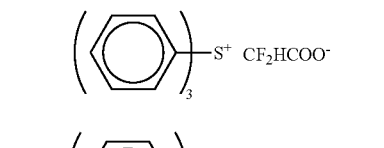 (II-11f)
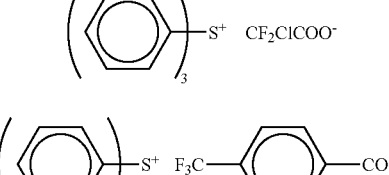 (II-12f)
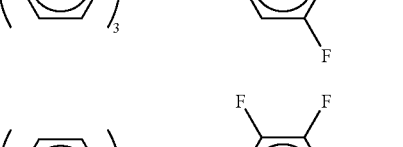 (II-13f)
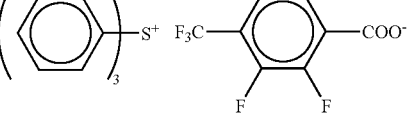 (II-14f)

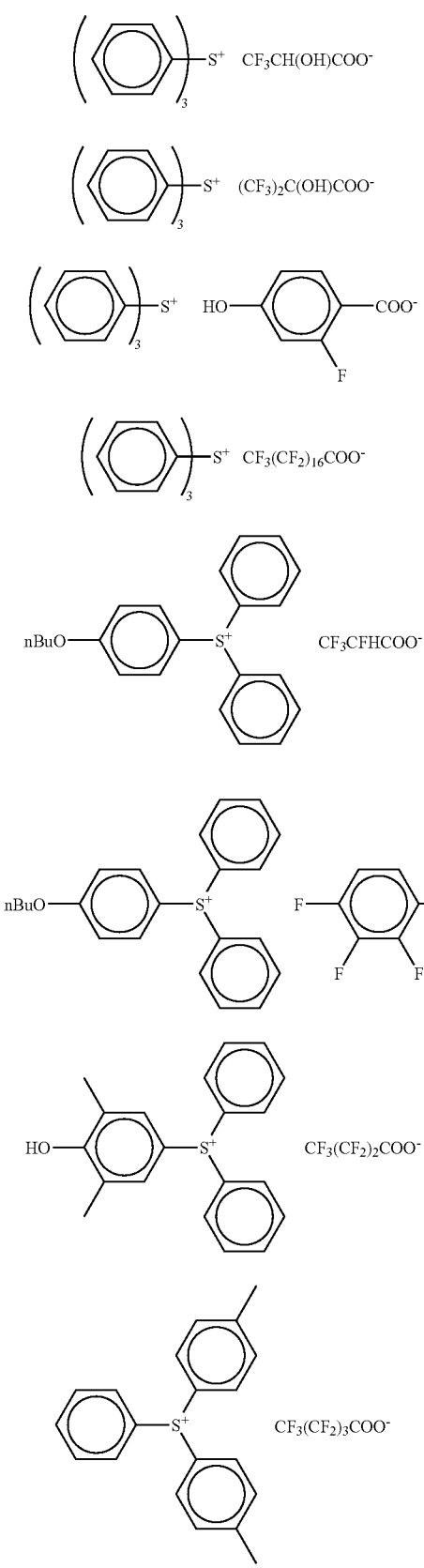
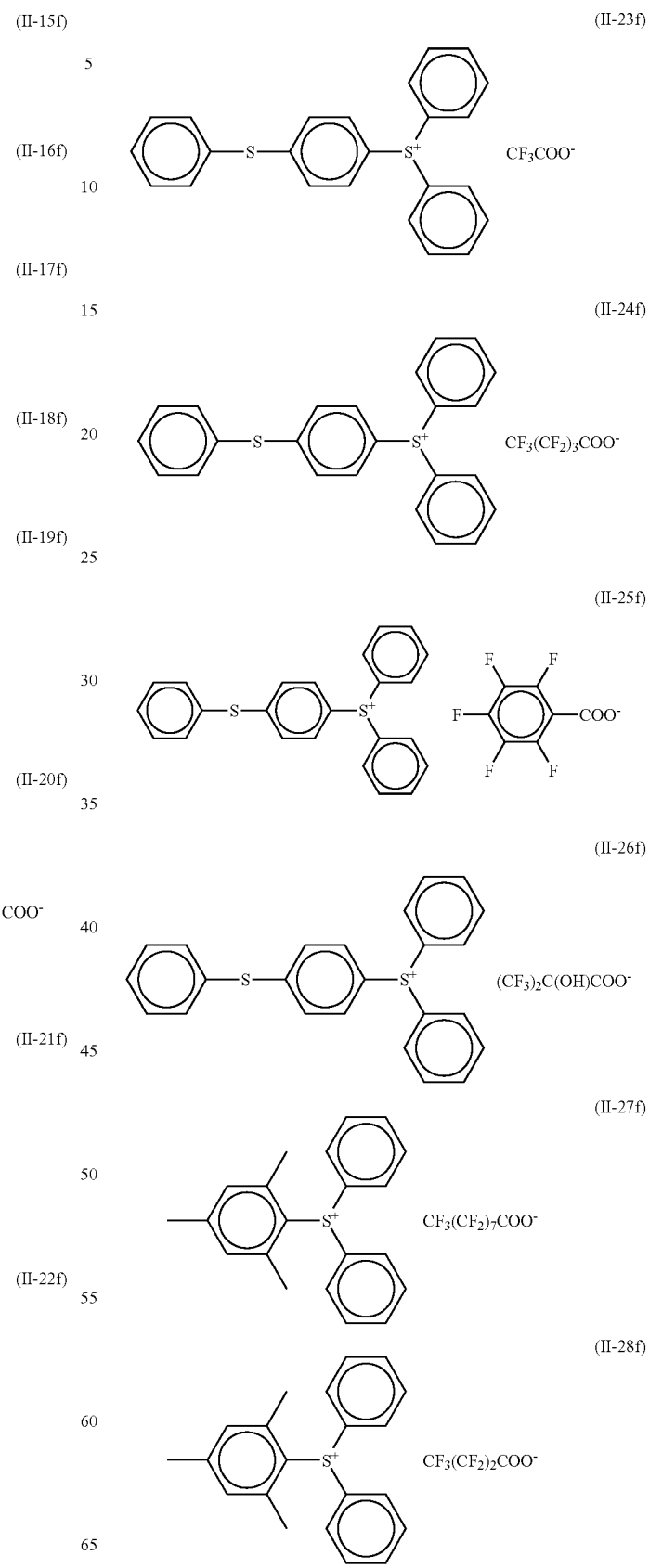

-continued
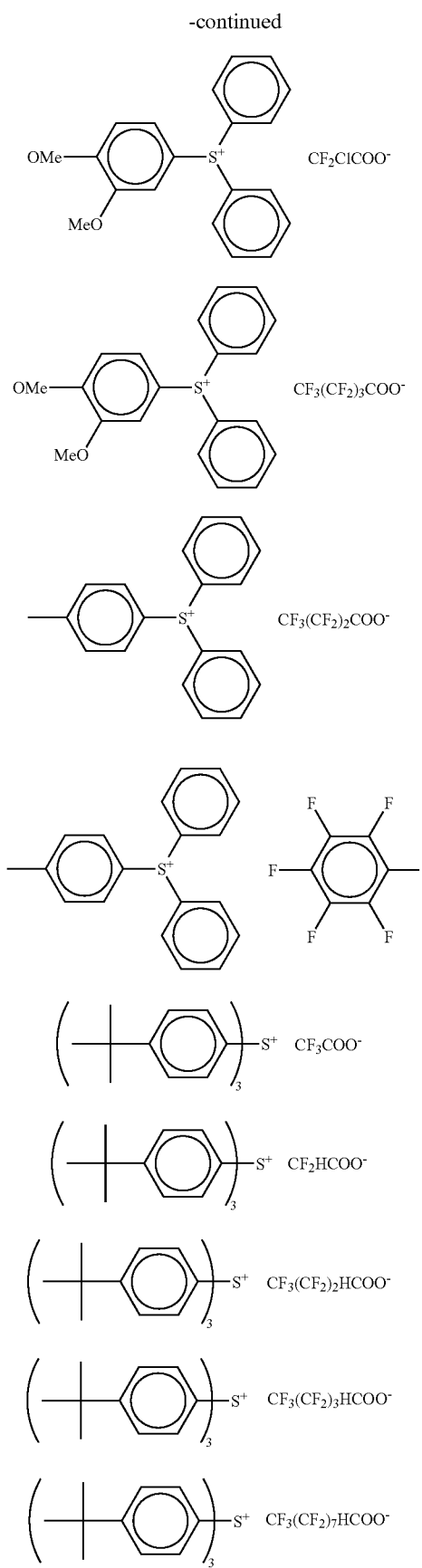
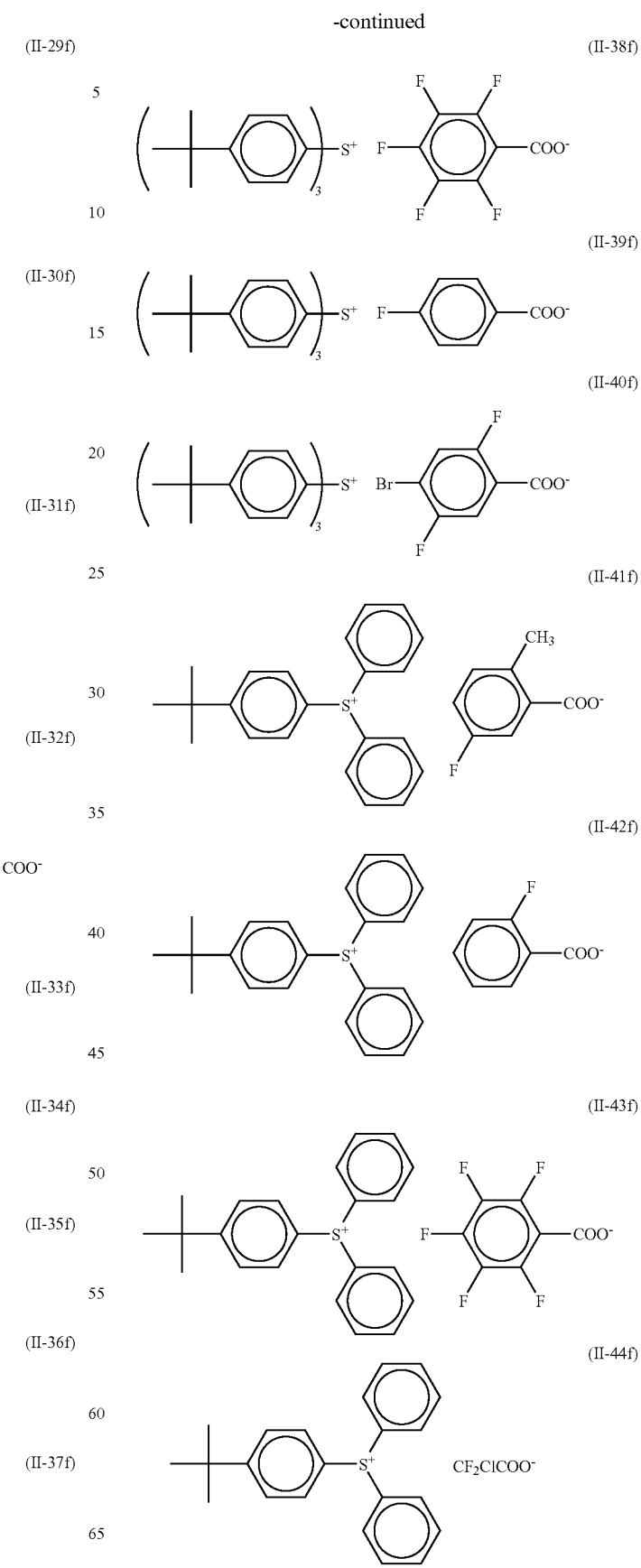

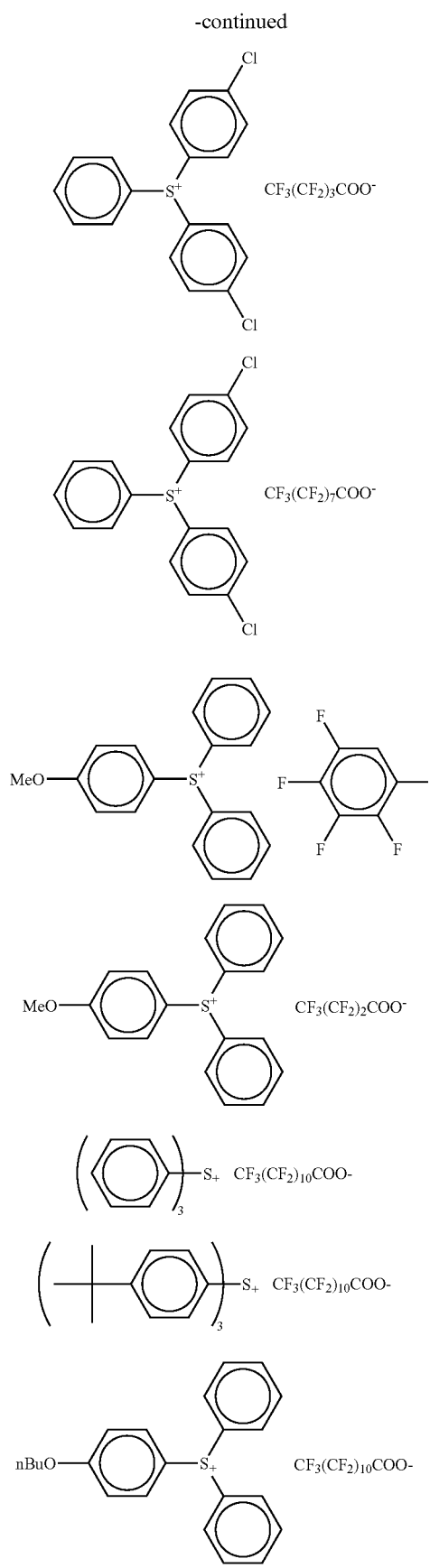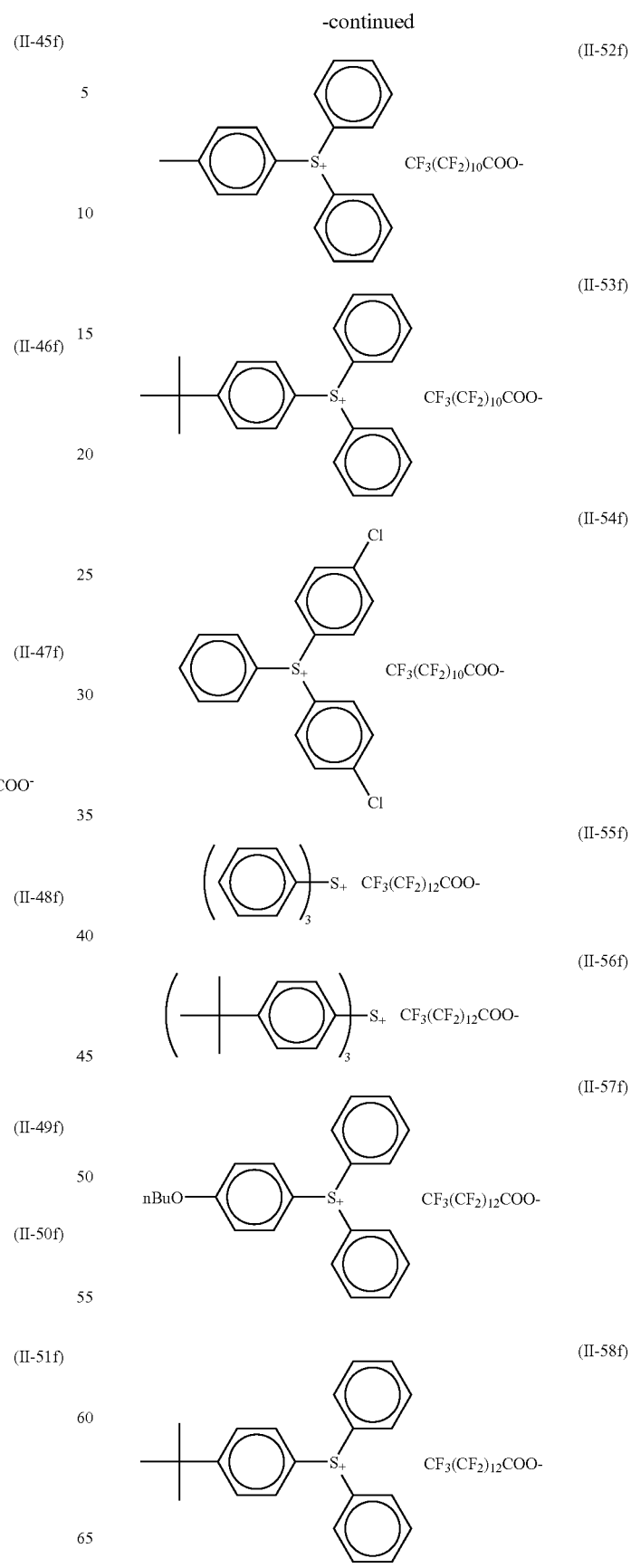

(II-59f) 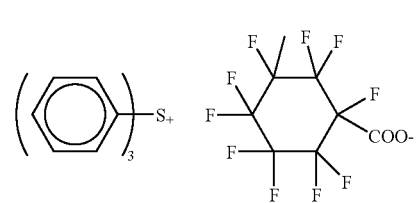
(II-60f) 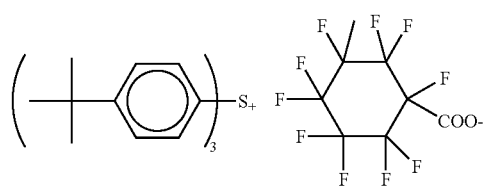
(II-61f) 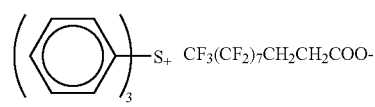
(II-62f)
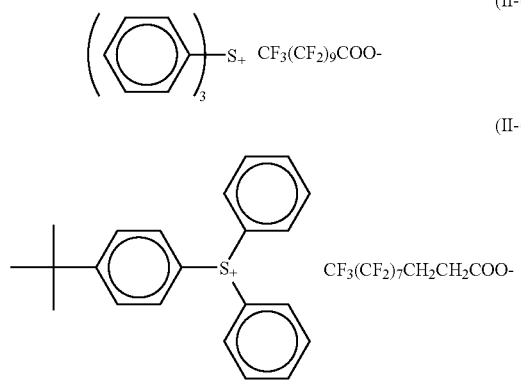
(II-63f)
(II-64f)
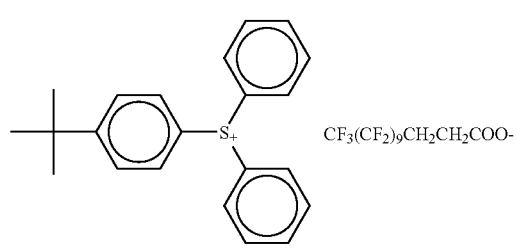
(II-65f) 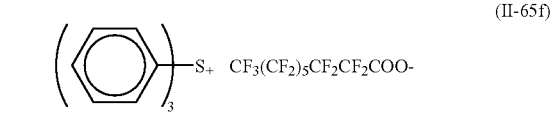
(II-66f)
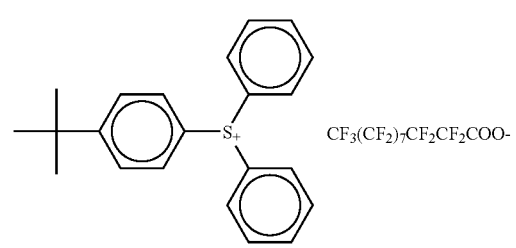
(II-67f) 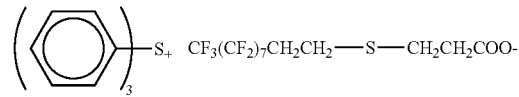
Specific examples (III-1f) to (III-4f) of the photo-acid generator represented by the general formula (III):
(III-1f) 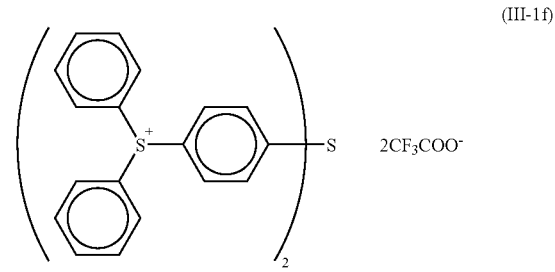
(III-2f) 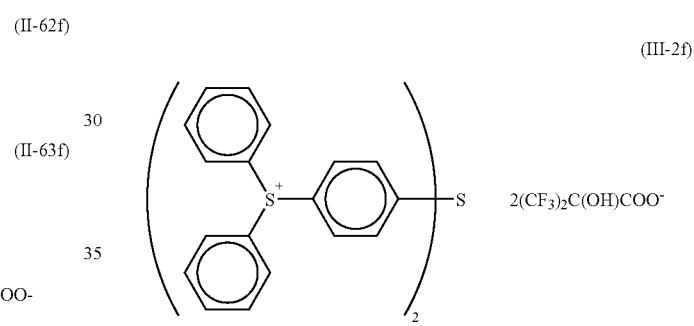
(III-3f) 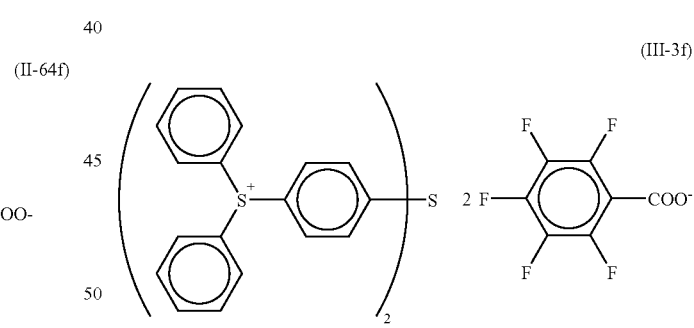
(III-4f) 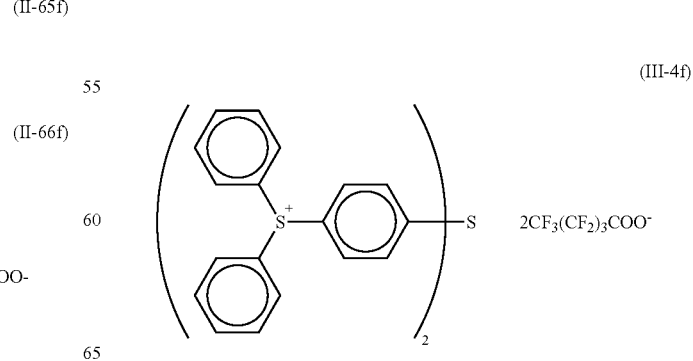

Specific examples (IV-1f) to (V-4f) of other photo-acid generators:

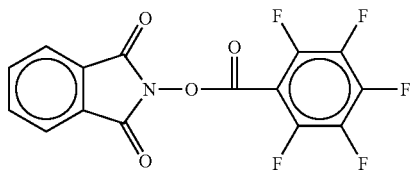
(IV-1f)

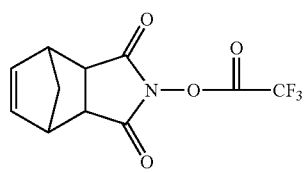
(IV-2f)

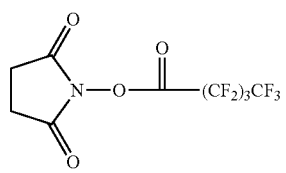
(IV-3f)

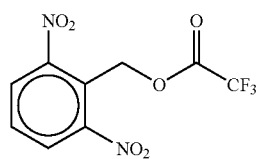
(V-1f)

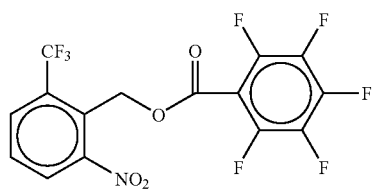
(V-2f)

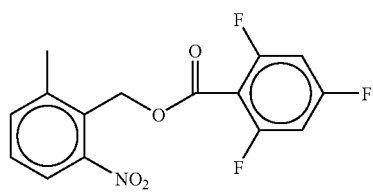
(V-3f)

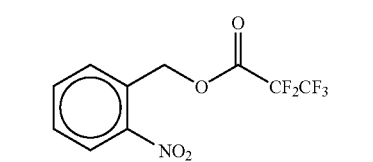
(V-4f)

The compound represented by the general formula (I) can be synthesized by reacting a periodate with an aromatic compound, and then subjecting the iodonium salt thus obtained to salt exchange to the corresponding carboxylic acid.

The compounds represented by the general formulae (II) and (III) can be each synthesized, e.g., by reacting an aryl Grignard reagent such as aryl magnesium bromide with a substituted or unsubstituted phenyl sulfoxide, and then subjecting the triaryl sulfonium halide thus obtained to salt exchange with the corresponding carboxylic acid. Alternatively, a method which comprises subjecting a substituted or unsubstituted phenyl sulfoxide and a corresponding aromatic compound thereof to condensation and salt exchange in the presence of an acid catalyst such as methanesulfonic acid/diphosphorus pentaoxide and aluminum chloride or a method which comprises subjecting a diaryliodonium salt and diaryl sulfide to condensation and salt exchange in the presence of a catalyst such as copper acetate may be employed.

Salt exchange can be accomplished by a method which comprises deriving the starting material to a halide which is then converted to a carboxylic acid salt in the presence of a silver reagent such as silver oxide or by the use of an ion-exchange resin. As the carboxylic acid or carboxylic acid salt to be used in salt exchange there may be used a commercially available product. Alternatively, the carboxylic acid or carboxylic acid salt can be obtained by the hydrolysis of a commercially available carboxylic acid halide.

As the fluorine-substituted carboxylic acid which is an anion moiety there is preferably used a material derived from a fluoroaliphatic compound produced by a telomerization method (also referred to as "telomer method") or oligomerization method (also referred to as "oligomer method"). For the details of the method for the production of these fluoroaliphatic compounds, reference can be made to Nobuo Ishikawa, "Fusso Kagobutsu no Gosei to Kino (Synthesis and Function of Fluorine Compounds)", CMC, 1987, pp. 117–118, and "Chemistry of Organic Fluorine Compounds II", Monograph 187, edited by Milos Hudlicky and Attila E. Pavlath, American Chemical Society 1995, pp. 747–752. The telomerization method involves the radical polymerization of a fluorine-containing vinyl compound such as tetrafluoroethylene with an alkyl halide having a great chain transfer constant, e.g., iodide as a telogen to synthesize a telomer (exemplified in Scheme-1). The synthesis by telomer method can provide a mixture of a plurality of compounds having different carbon chain lengths which may be then used as it is or may be purified before use.

[d] Specific examples of the compound which generate a fluorine-free carboxylic acid by the action with one of an actinic ray and a radiation and the ionic compound having a fluorine-free carboxylic acid as an anion will be given below, but the invention is not limited thereto.

Compounds represented by the following general formulae (AI) to (AV) can be exemplified.

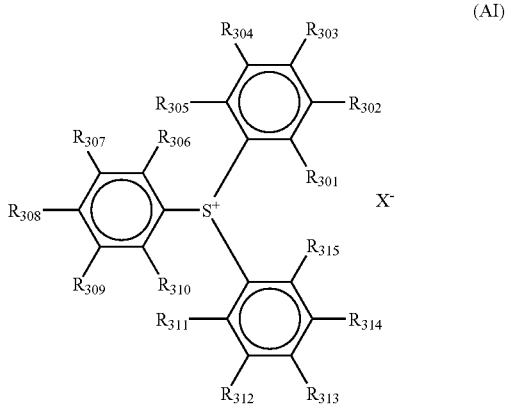
(AI)

-continued

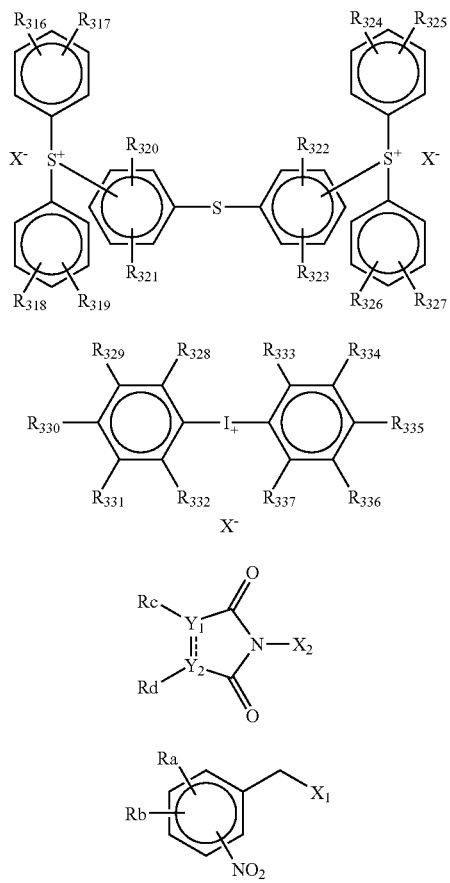

(AII)

(AIII)

(AIV)

(AV)

In these general formulae, $R_{301}$ to $R_{337}$ each independently represent a hydrogen atom, a straight-chain, branched or cyclic alkyl group, a straight-chain, branched or cyclic alkoxy group, a hydroxyl group, a halogen atom or —S—$R_0$ group. $R_0$ represents a straight-chain, branched or cyclic alkyl group or aryl group.

Ra and Rb each independently represents a hydrogen atom, a nitro group, a halogen atom or an alkyl or alkoxy group which may have substituents. Rc and Rd each independently represents a halogen atom or an alkyl or aryl group, which may have substituents. Rc and Rd may be connected to each other to form an aromatic ring, monocyclic or polycyclic hydrocarbon (which may contain oxygen and nitrogen atoms in its ring). $Y_1$ and $Y_2$ each represents a carbon atom. $Y_1$—$Y_2$ bond may be a single bond or double bond. $X^-$ represents an anion derived from the carboxylic acid compound represented by any of the following general formulae. $X_1$ and $X_2$ each independently represents a group obtained by esterifying the carboxylic acid compound represented by any of the following general formulae at its carboxyl moiety.

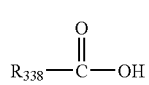

(C1)

-continued

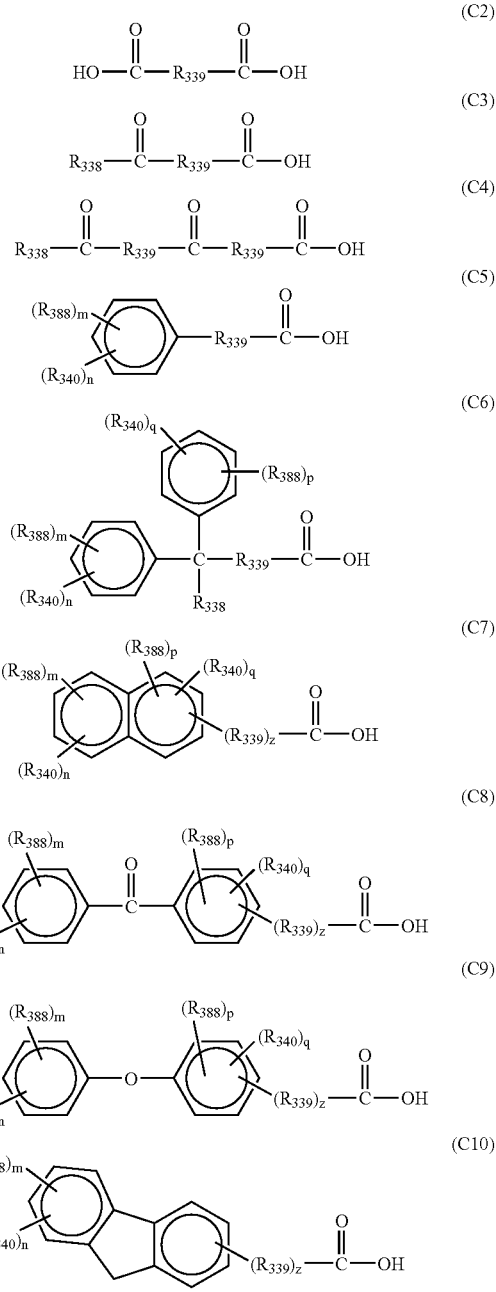

In these general formulae, $R_{338}$ represents a $C_1$–$C_{30}$ straight-chain, branched or cyclic alkyl group (which may contain oxygen and nitrogen atoms in its chain), a $C_1$–$C_{20}$ straight-chain, branched or cyclic alkenyl group, a $C_1$–$C_{20}$ straight-chain, branched or cyclic alkinyl group, a $C_1$–$C_{20}$ straight-chain, branched or cyclic alkoxyl group, a group obtained by substituting at least some of the hydrogen atoms in the alkyl group by halogen atom and/or hydroxyl group, a group obtained by substituting at least some of the hydrogen atoms in the alkenyl group by halogen atom and/or hydroxyl group or a $C_6$–$C_{20}$ substituted or unsubstituted aryl group. Examples of the substituents on the aryl group include alkyl group, nitro group, hydroxyl group, alkoxy group, acyl group, alkoxycarbonyl group, and halogen atom.

$R_{339}$ represents a single bond, a $C_1$–$C_{20}$ straight-chain, branched or cyclic alkylene group (which may contain oxygen and nitrogen atoms in its chain), a $C_1$–$C_{20}$ straight-chain, branched or cyclic alkenylene group, a group obtained by substituting at least some of the hydrogen atoms in the alkylene group by halogen atom and/or hydroxyl group, a group obtained by substituting at least some of the hydrogen atoms in the alkenylene group by halogen atom and/or hydroxyl group or a $C_2$–$C_{20}$ substituted or unsubstituted alkoxyalkylene group. The plurality of $R_{338}$'s and $R_{339}$'s may be the same or different.

$R_{340}$ represents a hydroxyl group or halogen atom. The plurality of $R_{340}$ may be the same or different. m, n, p and q each independently represents an integer of from 0 to 3, with the proviso that the relationships $m+n \leq 5$ and $p+q \leq 5$ are satisfied. z is 0 or 1.

Examples of the straight-chain or branched alkyl groups represented by $R_{301}$ to $R_{337}$, Ra, Rb, Rc, Rd and $R_0$ in the general formulae (AI) to (AV) include $C_1$–$C_4$ alkyl groups which may be substituted, such as methyl group, ethyl group, propyl group, n-butyl group, sec-butyl group and t-butyl group.

Examples of the cyclic alkyl group include $C_3$–$C_8$ cyclic alkyl groups which may be substituted, such as cyclopropyl group, cyclopentyl group and cyclohexyl group.

Examples of the alkoxy groups represented by $R_{301}$ to $R_{337}$, Ra and Rb include $C_1$–$C_4$ alkoxy groups such as methoxy group, ethoxy group, hydroxyethoxy group, propoxy group, n-butoxy group, isobutoxy group, sec-butoxy group and t-butoxy group.

Examples of the halogen atoms represented by $R_{301}$ to $R_{337}$, Ra, Rb, Rc and Rd include fluorine atom, chlorine atom, bromine atom, and iodine atom.

Examples of the aryl groups represented by $R_0$, Rc and Rd include $C_6$–$C_{14}$ aryl groups which may be substituted, such as phenyl group, tolyl group, methoxyphenyl group and naphthyl group.

Preferred examples of the substituents on these groups include $C_1$–$C_4$ alkoxy group, halogen atom (e.g., fluorine atom, chlorine atom, iodine atom), $C_6$–$C_{10}$ aryl group, $C_2$–$C_6$ alkenyl group, cyano group, hydroxyl group, carboxyl group, alkoxycarbonyl group, and nitro group.

Examples of the aromatic, monocyclic or polycyclic hydrocarbon (which may contain oxygen and nitrogen atoms in its ring) formed by the connection of Rc to Rd include benzene structure, naphthalene structure, cyclohexane structure, norbornene structure, and oxabicyclo structure.

The sulfonium compounds or iodonium compounds represented by the general formulae (AI) to (AIII) each has as a counter anion a compound obtained by converting the carboxyl group (—COOH) in at least one of the carboxylic acid compounds represented by the general formulae (C1) to (C10) to an anion (—COO⁻).

The compounds represented by the general formulae (AIV) to (AV) to be used in the invention each contain as substituents $X_1$ and $X_2$ compounds obtained by converting the carboxyl group (—COOH) in at least one of the carboxylic acid compounds represented by the general formulae (C1) to (C10) to an ester group (—COO—).

Examples of $C_1$–$C_{30}$ straight-chain, branched or cyclic alkyl group (which may contain oxygen and nitrogen atoms in its chain) represented by $R_{338}$ include methyl, ethyl, propyl, butyl, pentyl, hexyl, cyclohexyl, dodecyl, 1-ethoxyethyl, and adamantly group.

Examples of the $C_1$–$C_{20}$ straight-chain, branched or cyclic alkenyl group include ethenyl, propenyl, isopropenyl, and cyclohexene group.

Examples of the $C_1$–$C_{20}$ straight-chain, branched or cyclic alkinyl group include acetylene, and propenylene.

Examples of the $C_1$–$C_{20}$ straight-chain, branched or cyclic alkoxy group include methoxy, ethoxy, propyloxy, butoxy, cyclohexyloxy, isobutoxy, and dodecyloxy group.

Examples of the $C_6$–$C_{20}$ substituted or unsubstituted aryl group include phenyl, naphthyl, and anthranyl group.

Examples of the substituents on the aryl group include alkyl group, nitro group, hydroxyl group, alkoxy group, acyl group, alkoxycarbonyl group, and halogen atom.

Examples of $C_1$–$C_{20}$ straight-chain, branched or cyclic alkylene group (which may contain oxygen and nitrogen atoms in its chain) represented by $R_{339}$ include methylene, ethylene, propylene, butylene, isobutylene, ethoxyethylene, and cyclohexylene group.

Examples of the $C_1$–$C_{20}$ straight-chain, branched or cyclic alkylenylene group include vinylene, and arylene group.

Specific examples of these compounds will be given below, but the invention is not limited thereto.

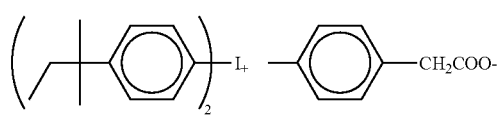

(I-2)

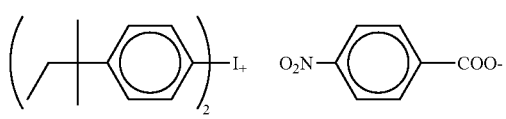

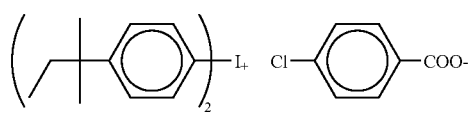

(I-4)

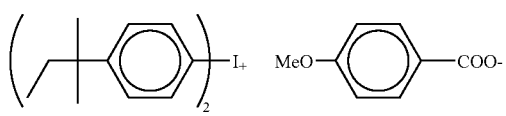

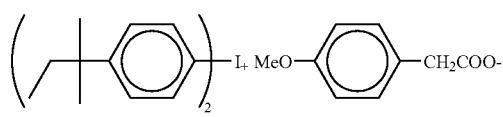

(I-6)

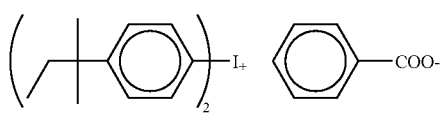

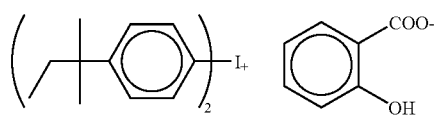

(I-8)

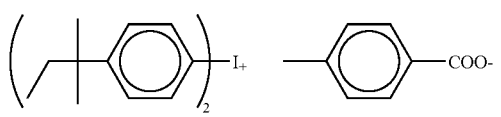

-continued
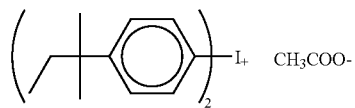 (I-10) 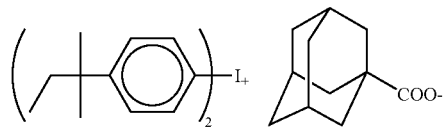
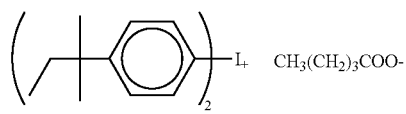 (I-12) 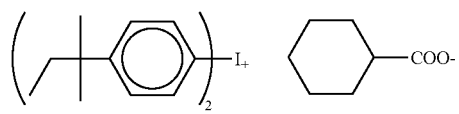
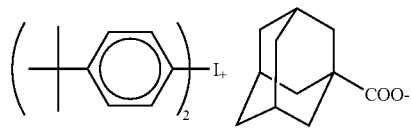 (I-14) 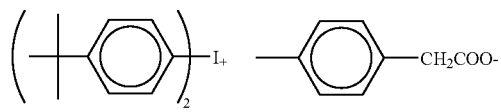
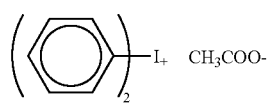 (I-16) 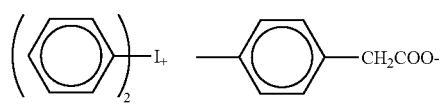
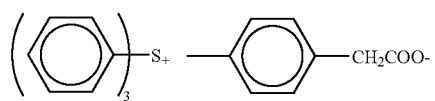 (II-2) 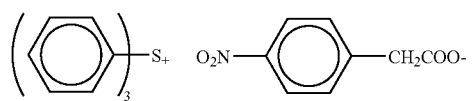
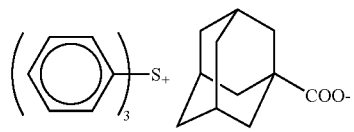 (II-4) 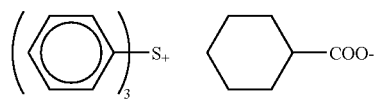
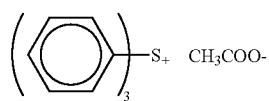 (II-6) 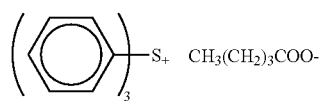
(II-7) 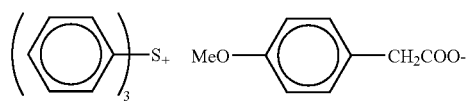 (II-8) 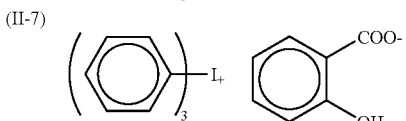
(II-9) 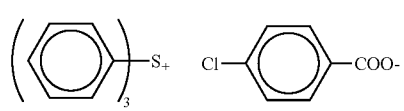 (II-10) 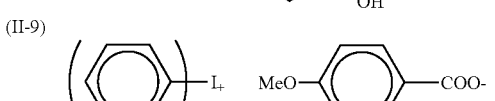
(II-11) 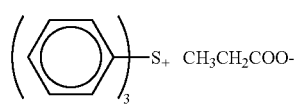 (II-12) 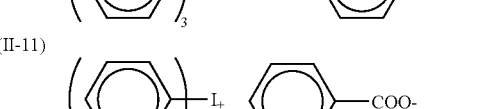
(II-13) 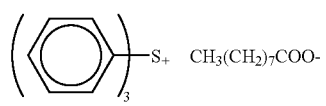 (II-14) 
(II-15) 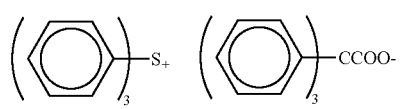 (II-16) 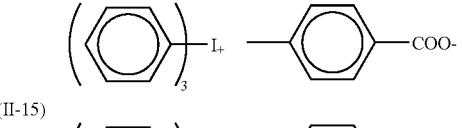
(II-17) 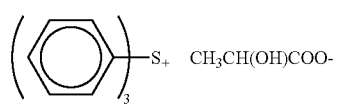 (II-18) 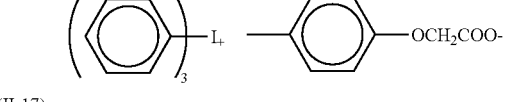
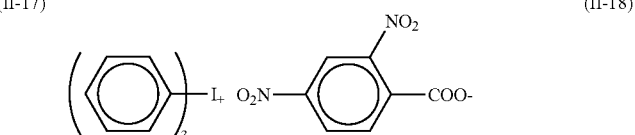

-continued
(II-19) 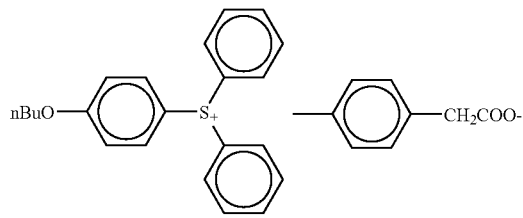
(II-20) 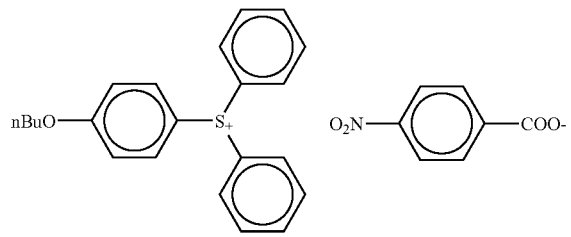
(II-21) 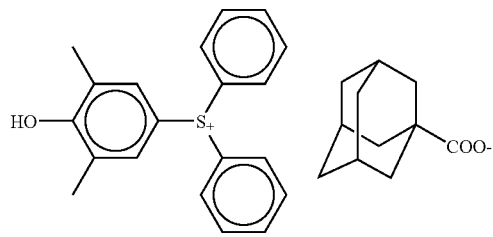
(II-22) 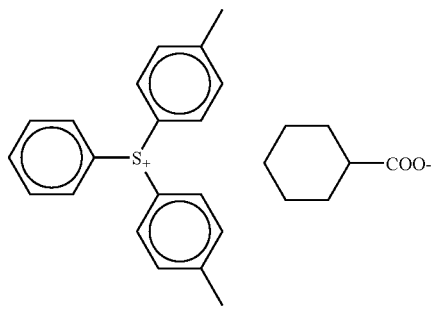
(II-23) 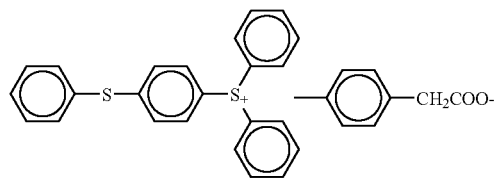
(II-24) 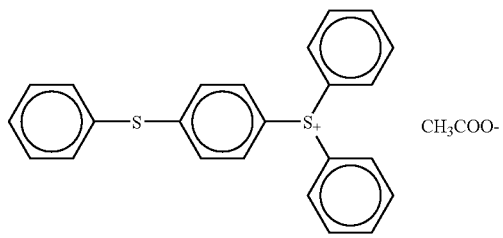
(II-25) 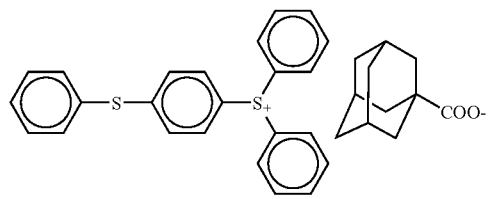
(II-26) 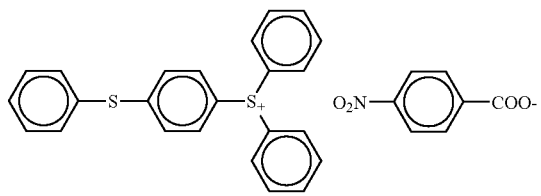
(II-27) 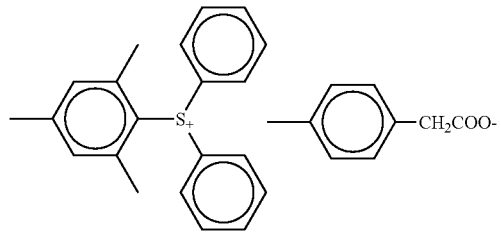
(II-28) 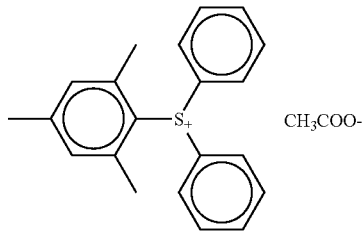
(II-29) 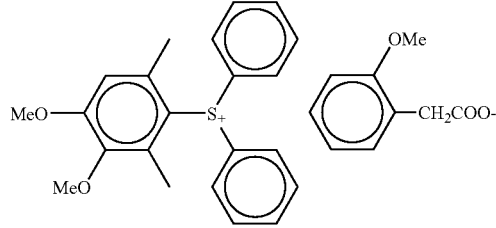
(II-30) 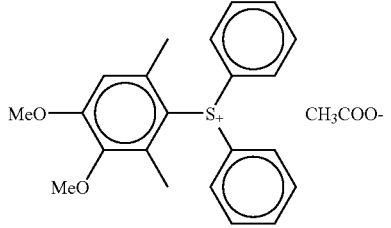

-continued
(II-31) 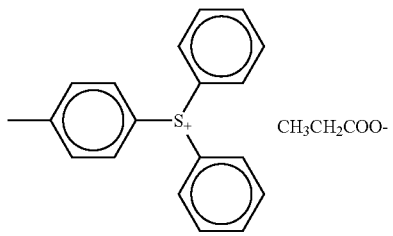
(II-32) 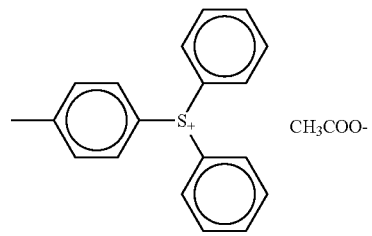
(II-33) 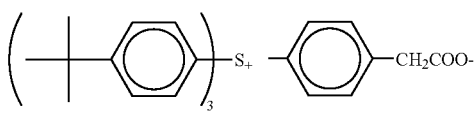
(II-34) 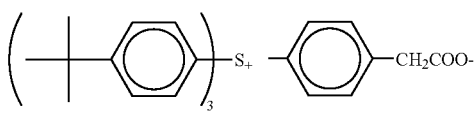
(II-35) 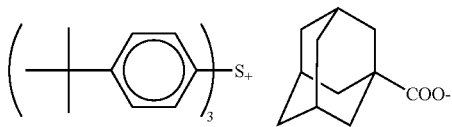
(II-36) 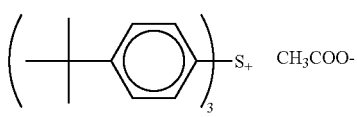
(II-37) 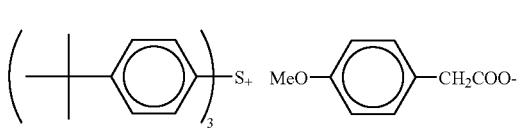
(II-38) 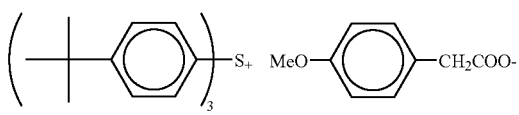
(II-39) 
(II-40) 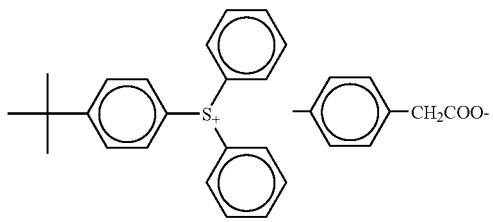
(II-41) 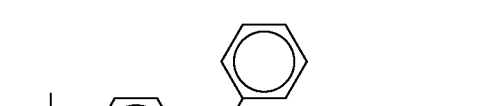
(II-42) 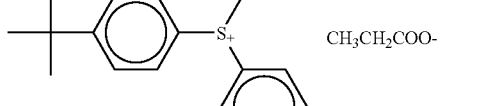
(II-43) 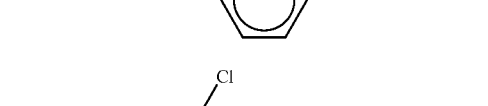
(II-44) 
(II-45) 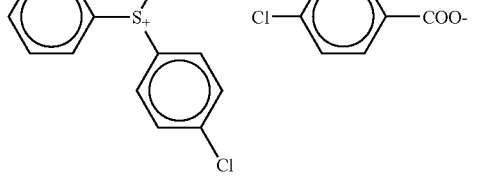
(II-46) 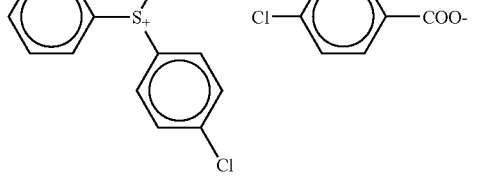

-continued
(II-47) 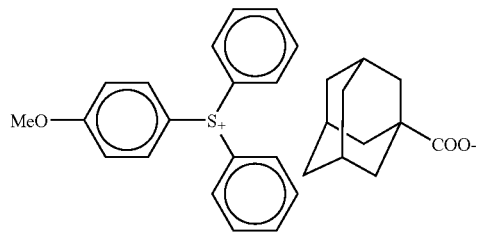
(II-48) 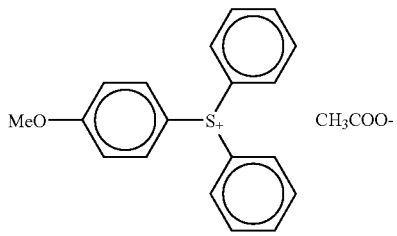
(III-1) 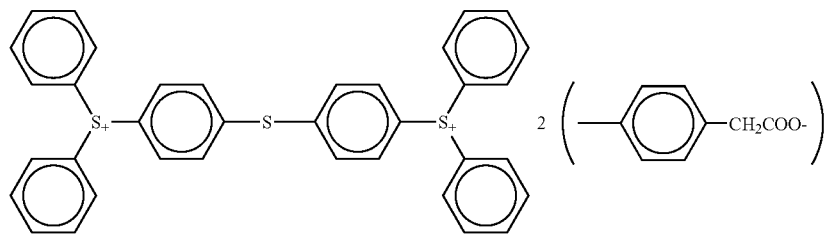
(III-2) 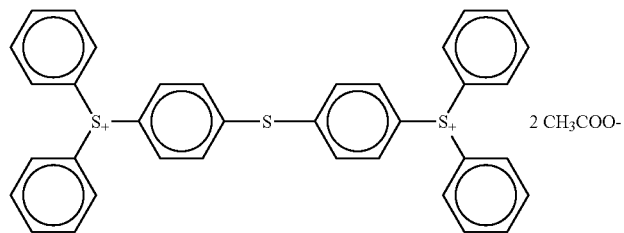
(IV-1) 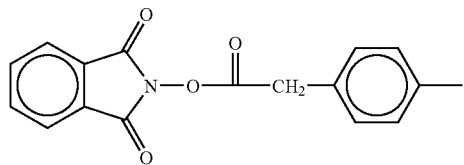
(IV-2) 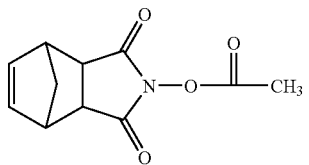
(IV-3) 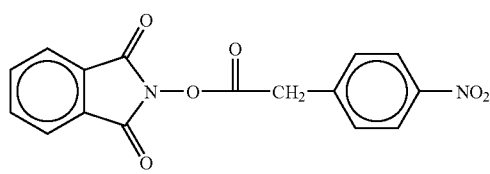
(IV-4) 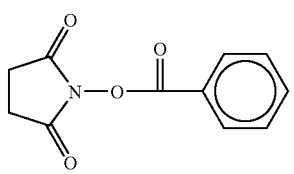
(V-1) 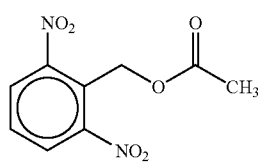
(V-2) 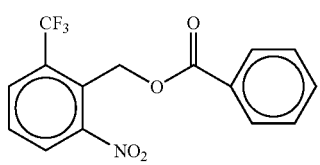
(V-3) 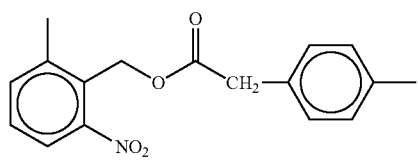
(V-4) 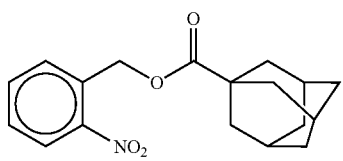

The aforementioned photo-acid generators, i.e., compounds represented by the general formulae (AI), (AII) and (AIII) can be synthesized by exchanging counter anion according to the method described in U.S. Pat. No. 3,734,928, "Macromolecules", vol. 10, 1307 (1977), "Journal of Organic Chemistry", vol. 55, 4222 (1990), "J. Radiat. Curing", vol. 5 (1), 2 (1978), etc. The compounds represented by the general formulae (AIV) and (AV) can be obtainedn by reacting an N-hydroxyimide compound with a carboxylic acid chloride under basic conditions or by reacting nitrobenzyl alcohol with a carboxylic acid chloride under basic conditions.

The weight ratio of the component B1 to the component B2 is normally 1/1 to 50/1, preferably 1/1 to 10/1, particularly 2/1 to 5/1.

The total amount of the components B1 and the component B2 is normally from 0.5 to 20% by weight, preferably from 0.75 to 15% by weight, more preferably from 1 to 10% by weight based on the total solid content of the composition.

A plurality of components B1 and components B2 may be contained in the composition of the invention.

[4] Solvent

The resist composition of the invention is dissolved in a solvent capable of dissolving the aforementioned various components therein before being applied to a support.

Preferred examples of the solvent employable herein include 1-methoxy-2-propanol acetate, 1-methoxy-2-propanol, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, ethyl acetate, methyl lactate, ethyl lactate, methyl methoxypropionate, ethyl ethoxypropionate, methylpyruvate, propyl pyruvate, N,N-dimethylformamide, dimethyl sulfoxide, N-methylpyrrolidone, and tetrahydrofurane. Particularly preferred among these solvents are 1-methoxy-2-propanol acetate, and 1-methoxy-2-propanol. These solvents may be used singly or in admixture.

[5] Surfactant

The resist composition of the invention comprises a surfactant, particularly a fluorine-based and/or silicon-based surfactant, incorporated therein. In some detail, the resist composition of the invention preferably comprises any one or two or more of a fluorine-based surfactant, a silicon-based surfactant and a surfactant containing both fluorine atom and silicon atom incorporated therein. The addition of the fluorine-based and/or silicon-based surfactant makes it possible to exert an effect of inhibiting development defects and improving coating property.

Examples of these surfactants include surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and U.S. Pat. Nos. 5,405,720, 5,360,692, 5,529,881, 5,296,330, 5,436,098, 5,576,143, 5,296,143, 5,294,511 and 5,824,451. The following commercially available surfactants may be used as they are.

Examples of these commercially available surfactants include fluorine-based and silicon-based surfactants such as EFTOP EF301, EF303, EF352 (produced by Shinakita Kasei K.K.), Florad FC430, 431 (produced by Sumitomo 3M Co., Ltd.), Megafac F171, F173, F176, F189, R08 (produced by DAINIPPON INK AND CHEMICALS, INCORPORATED), Asahi Guard AG710, Surflon S-382, SC101, 102, 103, 104, 105 and 106 (produced by ASAHI GLASS COMPANY), and Troysol S-366 (produced by Troychemical Co., Ltd.). Alternatively, a Type KP-341 polysiloxane (produced by Shin-etsu Chemical Co., Ltd.) may be used as a silicon-based surfactant.

The amount of the surfactant to be incorporated is normally from 0.01 to 2% by weight, preferably from 0.01 to 1% by weight based on the solid content in the composition of the invention. These surfactants may be used singly or in combination of some thereof.

[6] Acid Diffusion Inhibitor

The resist composition of the invention preferably comprises an acid diffusion inhibitor incorporated therein for the purpose of inhibiting the change of properties (e.g., formation of T-top shape of pattern, change of sensitivity, change of pattern line width) with time from the irradiation with an active ray or radiation to the heat treatment, the change of properties with time after coating and the excessive diffusion (deterioration of resolution) of an acid during the heat treatment after the irradiation with an active ray or radiation. As such an acid diffusion inhibitor there is preferably used an organic basic compound containing, e.g., a basic nitrogen and having a conjugated acid pKa of not smaller than 4.

Specific examples of the acid diffusion inhibitor include structures represented by the following general formulae (A) to (E).

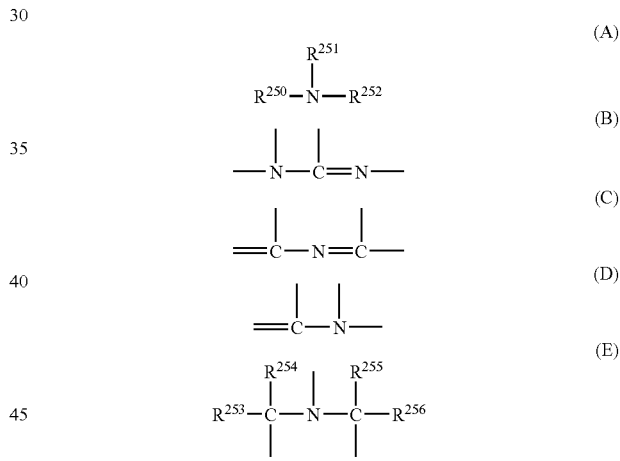

In the above formulae, $R^{250}$, $R^{251}$ and $R^{252}$ may be the same or different and each represents a hydrogen atom, a $C_1$–$C_6$ alkyl group, a $C_1$–$C_6$ aminoalkyl group, a $C_1$–$C_6$ hydroxyalkyl group or a $C_6$–$C_{20}$ substituted or unsubstituted aryl group. $R^{251}$ and $R^{252}$ may be bonded to each other to form a ring.

$R^{253}$, $R^{254}$, $R^{255}$ and $R^{256}$ may be the same or different and each represents a $C_1$–$C_6$ alkyl group.

More preferably, the acid diffusion inhibitor is a nitrogen-containing basic compound having two or more nitrogen atoms having different chemical environments per molecule, particularly a compound having both cyclic structures containing substituted or unsubstituted amino group and nitrogen atom or a compound having an alkylamino group.

Specific preferred examples of such a compound include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholine. Preferred examples of the substituents on these compounds include amino group, aminoalkyl group, alkylamino group, aminoaryl group, arylamino group, alkyl group, alkoxy group, acyl group, acyloxy group, aryl group, aryloxy group, nitro group, hydroxyl group, and cyano group.

Particularly preferred examples of these compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpryidine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetrametrhylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the invention is not limited to these compounds.

These nitrogen-containing basic compounds may be used singly or in combination of two or more thereof.

The mixing ratio of the acid generator and the organic basic compound in the composition (molar ratio) is preferably from 2.5 to 300. When the molar ratio of the acid generator and the organic basic compound falls below 2.5, the resulting composition exhibits a low sensitivity and a deteriorated resolution. On the contrary, when the molar ratio of the acid generator and the organic basic compound exceeds 300, the thickness of resist pattern grows with time from after exposure to heat treatment, occasionally deteriorating resolution.

The molar ratio of acid generator/organic basic compound is preferably from 5.0 to 200, more preferably from 7.0 to 150.

In the production of precision integrated circuit element, the formation of a pattern on the resist film can be carried out by a method which comprises applying the photosensitive resin composition to a substrate (e.g., transparent substrate such as silicon/silicon dioxide film, glass substrate and ITO substrate), irradiating the coated substrate with light beam from an active ray or radiation drawing device, and then subjecting the substrate to heating, development, rinsing and drying to form a good resist pattern.

As the developing solution for the resist composition of the invention there may be used an aqueous solution of an alkali such as inorganic alkali (e.g., sodium hydroxide, potassium hydroxide, sodium carbonate, sodium silicate, sodium metasilicate, aqueous ammonia), primary amine (e.g., ethylamine, n-propylamine), secondary amine (e.g., diethylamine, di-n-butylamine), tertiary amine (e.g., triethylamine, methyldiethylamine), alcoholamine (e.g., dimethylethanolamine, triethanolamine), quaternary ammonium salt (e.g., tetramethylammonium hydroxide, tetraethylammonium hydroxide, choline) and cyclic amine (e.g., pyrrole, piperidine). Further, the aforementioned aqueous solution of alkali may comprise a proper amount of an alcohol such as isopropyl alcohol and a surfactant such as nonionic surfactant incorporated therein.

Preferred among these developers is quaternary ammonium salt. More preferably, tetramethylammonium hydroxide and choline are used.

EXAMPLES

The invention will be further described in the following examples, but the invention is not limited thereto.

(1) Example of Synthesis of Resin (A1)

Synthesis of Exemplary Resin (A1-1)

17.42 g (0.1 mol) of t-butoxycarbonyl-protected ethylene glycol monovinyl ether [monomer corresponding to specific example (I-1) of repeating unit], 14.71 g (0.075 mol) of, α-trifluoromethyl-5-butyl acrylate [monomer corresponding to specific example (B-1') of repeating unit], 20 g of tetrahydrofuran, and 1.23 g (0.0075 mol) of azobisbutyronitrole (AIBN) as a polymerization initiator were charged into an autoclave. The air in the autoclave was then replaced by nitrogen. The autoclave was then airtightly sealed. Tetrafluoroethylene [monomer corresponding to specific example (IV-1) of repeating unit] was then introduced into the reaction vessel while being cooled with dry ice under pressure. Thereafter, the reaction mixture was heated to 60° C. where it was then reacted for 12 hours. The reaction vessel was then allowed to cool to room temperature to obtain a polymer solution having a high viscosity. The polymer solution was added dropwise to methanol. The resulting powder was withdrawn, and then dried under reduced pressure to obtain 19.02 g of a resin (A1-1). The powder thus obtained exhibited a weight-average molecular weight of 7,600 as measured by gel permeation chromatography (GPC) and a dispersion of 1.56. The molar ratio of repeating units (I-1)/(B-1')/(IV-1) was 42/33/25 as determined by $^1$H-NMR and $^{13}$C-NMR.

Exemplary resins (A1-2) to (A1-10) were obtained in the same manner as mentioned above except that the monomers used were changed. The formulation, weight-average molecular weight and degree of distribution of the various resins thus obtained are set forth in Table 1 below.

TABLE 1

| Polymer | Monomer formulation | Composition ratio (molar ratio) | Weight-average molecular weight | Degree of distribution |
|---|---|---|---|---|
| (A1-1) | (I-1)/(B-1')/(IV-1) | 42/33/25 | 7,600 | 1.56 |
| (A1-2) | (I-1)/(B-7')/(IV-6) | 40/31/29 | 7,400 | 1.54 |
| (A1-3) | (I-4)/(B-8''')/(F-7) | 30/43/27 | 8,600 | 1.53 |
| (A1-4) | (I-4)/(B-12')/(IV-2) | 38/41/29 | 8,200 | 1.6 |
| (A1-5) | (I-5)/(B-1')/(IV-1) | 41/30/29 | 7,900 | 1.58 |
| (A1-6) | (I-5)/(II-1)/(IV-2) | 52/29/20 | 7,100 | 1.57 |
| (A1-7) | (I-6)/(B-1')/(IV-6) | 51/28/21 | 6,800 | 1.54 |
| (A1-8) | (I-6)/(B-7')/(IV-1) | 47/32/21 | 7,600 | 1.55 |

TABLE 1-continued

| Polymer | Monomer formulation | Composition ratio (molar ratio) | Weight-average molecular weight | Degree of distribution |
|---|---|---|---|---|
| (A1-9) | (I-7)/(B-8")/(F-7) | 50/38/12 | 7,800 | 1.53 |
| (A1-10) | (I-7)/(B-1')/(IV-2) | 54/26/20 | 8,600 | 1.59 |

(2) Synthesis of Acid Generator (B1) Synthesis of Triphenyl Sulfonium Nonafluorobutane Sulfonate 20 g of triphenyl sulfonium iodide was dissolved in 500 ml of methanol. To the solution was then added 12.5 g of silver oxide. The mixture was then stirred at room temperature for 4 hours. The reaction solution was then filtered to remove silver compounds. To the solution was then added 14.9 g of nonafluorobutanesulfonic acid. The solution was then concentrated. To the resulting oil-like material was then added 300 ml of diisopropyl ether. The mixture was then thoroughly stirred. Diisopropyl ether was then removed by decantation. This procedure was then repeated twice. The resulting oil-like material was then dried under reduced pressure to obtain 18 g of the desired material.

(B2) Synthesis of Triphenylsulfonium 4-dodecylbezenesulfonate (PAG4-1)

10 g of triphenyl sulfonium iodide was dissolved in 500 ml of methanol. To the solution was then added 4.4 g of silver oxide. The mixture was then stirred at room temperature for 4 hours. The reaction solution was then filtered to remove silver compounds. To the solution was then added 4.67 g of 4-dodecylbenzenesulfonic acid. The solution was then concentrated. To the resulting oil-like material was then added 300 ml of diisopropyl ether. The mixture was then thoroughly stirred. Diisopropyl ether was then removed by decantation. This procedure was then repeated twice. The resulting oil-like material was then dried under reduced pressure to obtain 6 g of the desired material.

(3) Measurement of Transmission of Resin (A1)

The resins (A1-1) to (A1-10) thus obtained and a comparative resin (1) having the following structure were measured for transmission in the following manner.

1.36 g of each of the various resins was dissolved in 8.5 g of propylene glycol monomethyl ether acetate. The solution was then filtered through a teflon filter having a pore diameter of 0.1 μm. The solution was applied to a calcium fluoride disc by means of a spin coater, and then heated and dried at 120° C. for 5 minutes to obtain a film having a thickness of 0.1 μm. The coat layer was then measured for absorption by means of a Type CAMS-507 spectrometer (produced by Acton). The transmission at 157 nm was then calculated.

The results are as follows.

TABLE 2

| Example No. | Resin (A1) | Transmission of film having a thickness of 0.1 μm at 157 nm (%) |
|---|---|---|
| (T-1) | (A1-1) | 75 |
| (T-2) | (A1-2) | 74 |
| (T-3) | (A1-3) | 69 |
| (T-4) | (A1-4) | 73 |
| (T-5) | (A1-5) | 68 |
| (T-7) | (A1-7) | 71 |
| (T-8) | (A1-8) | 76 |
| (T-9) | (A1-9) | 75 |
| (T-10) | (A1-10) | 78 |
| (Th-1) | Comparative resin (1) | 25 |

Comparative Resin (1)

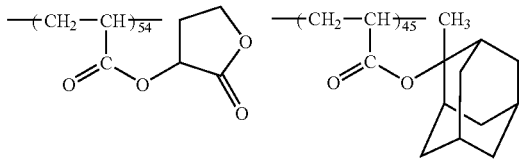

The results of transmission show that the coat layer formed by the resin of the invention has a sufficient transparency at 157 nm.

(4) Measurement of Contact Angle of Developer 1.2 g of each of the resins (A1-1) to (A1-10) thus obtained and a comparative resin (2) having the following structure and 0.024 g of nonafluorobutanesulfonate of triphenylsulfonium were dissolved in 19.6 g of propylene glycol monomethyl ether acetate (PGMEA). The solution was then filtered through a teflon filter having a pore diameter of 0.1 μm to prepare a resist solution. The various resist compositions were each applied to a hexamethyl disilazalane-treated silicon wafer by means of a spin coater. The wafer was then heated and dried at 120° C. for 60 seconds to form a resist layer having a thickness of 0.1 μm. These resist layers were each then measured for contact angle with a 2.38 wt % aqueous solution of tetramethylammonium hydroxide.

The results are as follows.

TABLE 3

| Example No. | Resin | Contact angle (degree) |
|---|---|---|
| (S-1) | A1-1 | 41 |
| (S-2) | A1-2 | 46 |
| (S-3) | A1-3 | 44 |
| (S-4) | A1-4 | 47 |
| (S-5) | A1-5 | 42 |
| (S-6) | A1-6 | 50 |
| (S-7) | A1-7 | 46 |
| (S-8) | A1-8 | 44 |
| (S-9) | A1-9 | 42 |
| (S-10) | A1-10 | 49 |
| (Sh-1) | Comparative resin (2) | 63 |

Comparative Resin (2)

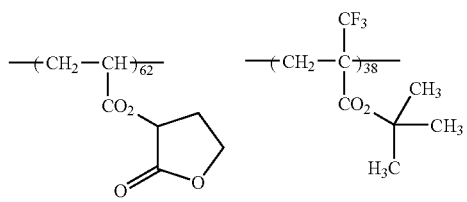

From the aforementioned results, it can be expected that the resist composition comprising the resin of the invention can exhibit an improved developability. These results are presumably attributed to the association of the polar group in the resin with the affinity of the developer.

(5) Evaluation of Image-Forming Properties 1.2 g of the resins (A1-1) to (A1-10) thus obtained and the aforementioned comparative resin (1), singly or optionally in combination of a mixture of the resins (A1) and (A2) (amount of the resin (A2) based on the resin (A1) was 15% by weight), 0.024 g of nonafluorobutanesulfonate of triphenylsulfonium (B1), and optionally 0.006 g of the component (B2) were dissolved in 19.6 g of propylene glycol monomethyl ether acetate. The solution was then filtered through a teflon filter having a pore diameter of 0.1 μm. The various compositions were each applied to a hexamethyl disilazalane-treated silicon wafer by means of a spin coater. The wafer was then heated and dried at 120° C. for 60 seconds to form a resist layer having a thickness of 0.1 μm.

The resist layer thus obtained was then evaluated for sensitivity and dissolution contrast on the exposed area/unexposed area upon exposure at 157 nm using a Type VUVES-4500 157 nm laser exposure/dissolution behavior analyzer (produced by Litho Tech Japan Corporation).

The term "sensitivity" as used herein is meant to indicate the minimum exposure at which the thickness of a layer obtained by heating and drying the wafer exposed at 130° C. for 90 seconds, developing the wafer with a 2.38 wt % aqueous solution of tetramethyl ammonium hydroxide at 23° C. for 60 seconds, rinsing the wafer with purified water for 30 seconds, and then drying the wafer reaches zero when immediately measured.

The term "contrast" as used herein is meant to indicate the gradient (tan θ) of the exposure-dissolution rate curve.

The results are as follows. The structure of the resin (A2) used will be given below.

TABLE 4

| Example No. | Resin (A1) | Resin (A2)* | (B2) component | Sensitivity (mJ/cm$^2$) | Contrast |
|---|---|---|---|---|---|
| (J-1) | (A1-1) | None | None | 2.4 | 6.3 |
| (J-1-2) | (A1-1) | (A2-a) | None | 2 | 6.7 |
| (J-1-3) | None | (A2-a) | None | 2.5 | 6.4 |
| (J-1-4) | (A1-1) | None | (PAG4-1) | 2.3 | 6.5 |
| (J-2) | (A1-2) | None | None | 1.8 | 6.8 |
| (J-3) | (A1-3) | None | None | 2.7 | 6.4 |
| (J-4) | (A1-4) | None | None | 2.1 | 6.6 |
| (J-5) | (A1-5) | None | None | 2.2 | 6.7 |
| (J-6) | (A1-6) | None | None | 2.4 | 6.6 |
| (J-7) | (A1-7) | None | None | 2.5 | 6.4 |
| (J-8) | (A1-8) | None | None | 2.2 | 6.7 |
| (J-9) | (A1-9) | None | None | 2.3 | 6.6 |
| (J-10) | (A1-10) | None | None | 2.7 | 6.2 |
| (J-10-1) | (A1-10) | (A2-b) | None | 2.2 | 6.8 |
| (Jh-1) | Comparative resin (1) | None | None | 8.5 | 5.2 |

*When resins are mixed, the resin (A2) is added in an amount of 15% by weight based on the resin (A1).

Resin (A2-a)

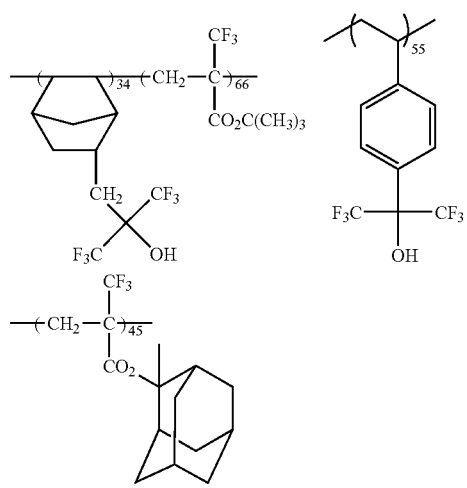

Resin (A2-b)

The comparison of the various examples with Jh-1 shows that the resist composition comprising an acid-decomposable resin according to the invention exhibits an excellent sensitivity and contrast.

It can be also seen that the addition of the resins (A2) and (B2) makes it possible to enhance either or both of sensitivity and contrast.

In accordance with the invention, a positive-working resist composition which exhibits a sufficient transparency and an excellent sensitivity and contrast can be provided.

What is claimed is:

1. A positive-working resist composition comprising (A1) a resin containing a repeating unit represented by the following general formula (I) and at least one repeating unit selected from the group consisting of repeating units represented by the following general formulae (III) and (IV), wherein the resin increases the solubility in an alkali developing solution by the action of an acid:

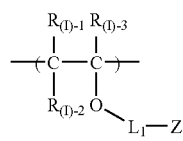

wherein $R_{(I)-1}$ to $R_{(I)-3}$ each independently represents a hydrogen atom, a fluorine atom, a chlorine atom, a bromine atom, a cyano group or an alkyl group which may be substituted; $L_1$ represents a divalent connecting group; and Z represents an acid-decomposable group;

(III)

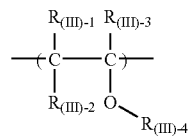

wherein $R_{(III)\text{-}1}$ to $R_{(III)\text{-}3}$ each independently represents a hydrogen atom, a fluorine atom, a chlorine atom, a bromine atom, a cyano group or an alkyl group which may be substituted, with the proviso that at least two of $R_{(III)\text{-}1}$ to $R_{(III)\text{-}3}$ are a fluorine atom; and $R_{(III)\text{-}4}$ represents an alkyl group which may be substituted; and (IV)

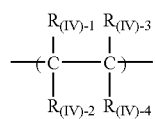

wherein $R_{(IV)\text{-}1}$ to $R_{(IV)\text{-}4}$ each independently represents a hydrogen atom, a fluorine atom, a chlorine atom, a bromine atom or an alkyl group which may be substituted, with the proviso that at least two of $R_{(IV)\text{-}1}$ to $R_{(IV)\text{-}4}$ are a fluorine atom.

2. The positive-working resist composition according to claim 1, wherein the acid-decomposable group Z is selected from the group consisting of —CO($R_{11a}$)($R_{12a}$)($R_{13a}$), —CO($R_{14a}$)($R_{15a}$)(O$R_{16a}$), —O—CO—O($R_{11a}$)($R_{12a}$)($R_{13a}$), —CO—OC($R_{11a}$)($R_{12a}$)($R_{13a}$) and —CO—OC($R_{14a}$)($R_{15a}$)(O$R_{16a}$), wherein $R_{11a}$ to $R_{13a}$ each independently represents an alkyl group which may be substituted, a cycloalkyl group which may be substituted, an alkenyl group which may be substituted, an aralkyl group which may be substituted or an aryl group which may be substituted; $R_{14a}$ and $R_{15a}$ each independently represents a hydrogen atom or an alkyl group which may be substituted; $R_{16a}$ represents an alkyl group which may be substituted, a cycloalkyl group which may be substituted, an alkenyl group which may be substituted, an aralkyl group which may be substituted or an aryl group which may be substituted; and two of $R_{11a}$, $R_{12a}$ and $R_{13a}$ or two of $R_{14a}$, $R_{15a}$ and $R_{16a}$ may be bonded to each other to form a ring.

3. The positive-working resist composition according to claim 1, wherein the resin (A1) further comprises at least one of repeating units represented by the following general formulae (IIa) and (IIb):

(IIa)

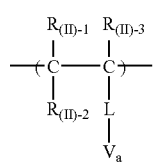

(IIb)

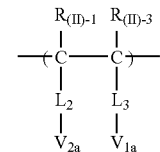

wherein $R_{(II)\text{-}1}$ to $R_{(II)\text{-}3}$ each independently represents a hydrogen atom, a fluorine atom, a chlorine atom, a bromine atom, a cyano group or an alkyl group which may be substituted; L, $L_2$ and $L_3$ each independently represents a single bond or divalent connecting group; and $V_a$, $V_{1a}$ and $V_{2a}$ each independently represents an acid-decomposable group or an acid-nondecomposable organic group.

4. The positive-working resist composition according to claims 3, wherein $V_a$ in the general formula (IIa) or at least one of $V_{1a}$ and $V_{2a}$ in the general formula (IIb) is an acid-decomposable group.

5. The positive-working resist composition according to claim 4, wherein the acid-decomposable group is selected from the group consisting of —CO($R_{11a}$)($R_{12a}$)($R_{13a}$), —CO($R_{14a}$)($R_{15a}$)(O$R_{16a}$), —O—CO—O($R_{11a}$)($R_{12a}$)($R_{13a}$), —CO—OC($R_{11a}$)($R_{12a}$)($R_{13a}$) and —CO—OC($R_{14a}$)($R_{15a}$)(O$R_{16a}$), wherein $R_{11a}$ to $R_{13a}$ each independently represents an alkyl group which may be substituted, a cycloalkyl group which may be substituted, an alkenyl group which may be substituted, an aralkyl group which may be substituted or an aryl group which may be substituted; $R_{14a}$ and $R_{15a}$ each independently represents a hydrogen atom or an alkyl group which may be substituted; $R_{16a}$ represents an alkyl group which may be substituted, a cycloalkyl group which may be substituted, an alkenyl group which may be substituted, an aralkyl group which may be substituted or an aryl group which maybe substituted; and two of $R_{11a}$, $R_{12a}$ and $R_{13a}$ or two of $R_{14}$a, $R_{15a}$ and $R_{16a}$ maybe bonded to each other to form a ring.

6. The positive-working resist composition according to claim 3, wherein the repeating units represented by the general formulae (IIa) and (IIb) are represented by the following general formulae (IIa1) and (IIb1), respectively:

(IIa1)

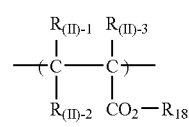

(IIb1)

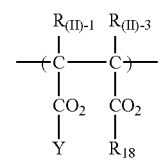

wherein $R_{(II)\text{-}1}$ to $R_{(II)\text{-}3}$ each independently represents a hydrogen atom, a fluorine atom, a chlorine atom, a bromine atom, a cyano group or an alkyl group which may be substituted; $R_{18}$ represents —OC($R_{11a}$)($R_{12a}$)($R_{13a}$) or —OC($R_{14a}$)($R_{15a}$)(O$R_{16a}$), wherein $R_{11a}$ to $R_{13a}$ each independently represents an alkyl group which may be substituted, a cycloalkyl group which may be substituted, an alkenyl group which may be substituted, an aralkyl group which may be substituted or an aryl group which may be substituted; $R_{14a}$ and $R_{15a}$ each independently represents a hydrogen atom or an alkyl group which may be substituted; $R_{16a}$ represents an alkyl group which may be substituted, a cycloalkyl group which may be substituted, an alkenyl group which may be substituted, an aralkyl group which may be substituted or an aryl group which may be substituted; and two of $R_{11a}$, $R_{12a}$ and $R_{13a}$ or two of $R_{14a}$, $R_{15a}$ and $R_{16a}$ may be bonded to each other to form a ring, and Y represents a hydrogen atom, an alkyl group which may be substituted or $R_{18}$.

7. The positive-working resist composition according to claim 3 or 6, wherein at least one of $R_{(I)-1}$ to $R_{(I)-3}$ in the repeating unit represented by the general formula (IIa) or (IIa1) and at least one of $R_{(I)-1}$ and $R_{(I)-3}$ in the repeating unit represented by the general formula (IIb) or (IIb1) contain a fluorine atom.

8. A positive-working resist composition comprising:

(A1) a resin containing a repeating unit represented by the following general formula (I) and at least one repeating unit selected from the group consisting of repeating units represented by the following general formulae (III) and (IV), wherein the resin increases the solubility in an alkali developing solution by the action of an acid, and (B) a compound capable of generating an acid by the action with one of an actinic ray and a radiation:

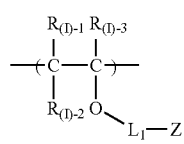

(I)

wherein $R_{(I)-1}$ to $R_{(I)-3}$ each independently represents a hydrogen atom, a fluorine atom, a chlorine atom, a bromine atom, a cyano group or an alkyl group which may be substituted; $L_1$ represents a divalent connecting group; and Z represents an acid-decomposable group;

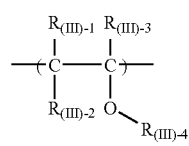

(III)

wherein $R_{(III)-1}$ to $R_{(III)-3}$ each independently represents a hydrogen atom, a fluorine atom, a chlorine atom, a bromine atom, a cyano group or an alkyl group which may be substituted, with the proviso that at least two of $R_{(III)-1}$ to $R_{(III)-3}$ are a fluorine atom; and $R_{(III)-4}$ represents an alkyl group which may be substituted; and

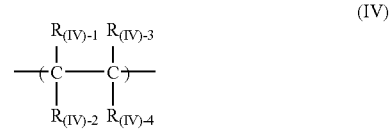

(IV)

wherein $R_{(IV)-1}$ to $R_{(IV)-4}$ each independently represents a hydrogen atom, a fluorine atom, a chlorine atom, a bromine atom or an alkyl group which may be substituted, with the proviso that at least two of $R_{(IV)-1}$ to $R_{(IV)-4}$ are a fluorine atom.

9. The positive-working resist composition according to claim 8, further comprising (A2) a resin increasing the solubility in an alkali developing solution by the action of an acid other than the resin (A1).

10. The positive-working resist composition according to claim 9, wherein the resin (A2) contains at least one repeating unit selected from the group consisting of those represented by the following general formulae (I') to (VI'):

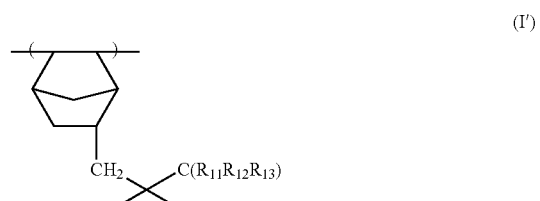

(I')

(II')

(III')

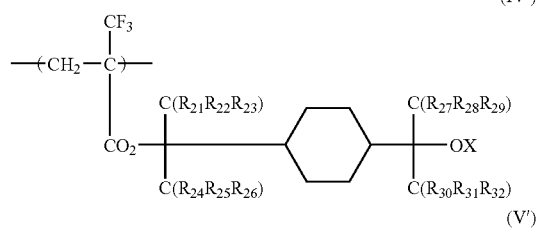

(IV')

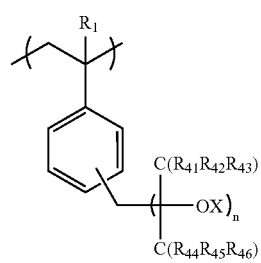

(V')

-continued (VI')

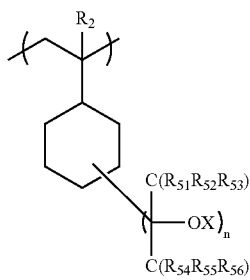

wherein $R_1$ and $R_2$ each independently represents a hydrogen atom, a fluorine atom, a chlorine atom, a bromine atom, a cyano group or a trifluoromethyl group; X represents a group capable of decomposing by the action of an acid; $R_3'$ and $R_4'$ each represents a group capable of decomposing by the action of an acid; $R_{11}$ to $R_{16}$, $R_{21}$ to $R_{32}$, $R_{41}$ to $R_{46}$ and $R_{51}$ to $R_{56}$ each represents a hydrogen atom, a fluorine atom or an alkyl group which may be substituted, with the proviso that at least one of $R_{11}$ to $R_{16}$, at least one of $R_{21}$ to $R_{32}$, at least one of $R_{41}$ to $R_{46}$ or at least one of $R_{51}$ to $R_{56}$ is a fluorine atom; and n represents an integer of from 1 to 5.

11. The positive-working resist composition according to claim 9, wherein the resin (A2) contains at least one repeating unit selected from the group consisting of those represented by the following general formulae (I") to (VI"):

(I")

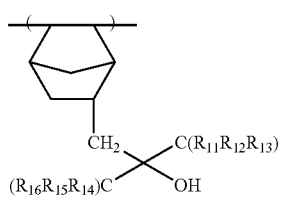

(II")

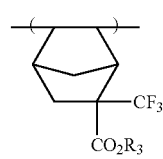

(III")

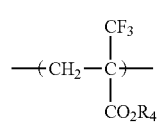

-continued (IV")

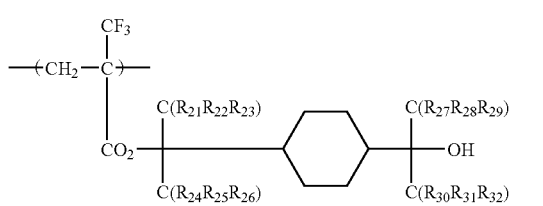

(V")

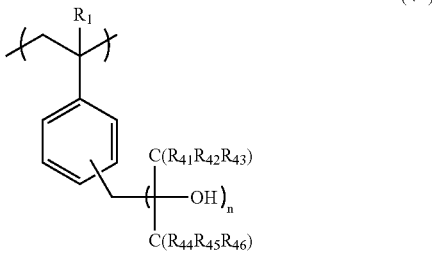

(VI")

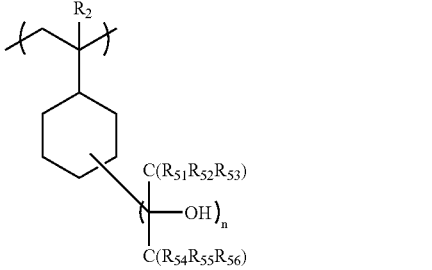

wherein $R_1$ and $R_2$ each independently represents a hydrogen atom, a fluorine atom, a chlorine atom, a bromine atom, a cyano group or a trifluoromethyl group; $R_3$ and $R_4$ each independently represents a hydrogen atom, an alkyl group which may be substituted, an aryl group which may be substituted or an aralkyl group which may be substituted in which the alkyl group and the aralkyl group each may have —O—, —S—, —CO₂—, —CO—, —SO₂—or —SO—in the middle portion thereof; $R_{11}$ to $R_{16}$, $R_{21}$ to $R_{32}$, $R_{41}$ to $R_{46}$ and $R_{51}$ to $R_{56}$ each represents a hydrogen atom, a fluorine atom or an alkyl group which may be substituted, with the proviso that at least one of $R_{11}$ to $R_{16}$, at least one of $R_{21}$ to $R_{32}$, at least one of $R_{41}$ to $R_{46}$ or at least one $R_{51}$ to $R_{56}$ is a fluorine atom; and n represents an integer of from 1 to 5.

12. The positive-working resist composition according to claim 8, wherein the component (B) is (B1) a compound capable of generating an aliphatic or aromatic sulfonic acid by the action with one of an actinic ray and a radiation, in which the aliphatic or aromatic sulfonic acid contains at least one fluorine atom.

13. The positive-working resist composition according to claim 12, further comprising (B2) a compound capable of generating a fluorine atom-free aliphatic or aromatic sulfonic acid, or an aliphatic or aromatic carboxylic acid upon irradiation with one of an actinic ray and a radiation.

* * * * *